United States Patent [19]

Blackburn et al.

[11] Patent Number: 4,700,315

[45] Date of Patent: Oct. 13, 1987

[54] METHOD AND APPARATUS FOR CONTROLLING THE GLOW DISCHARGE PROCESS

[75] Inventors: Dennis R. Blackburn, Indianapolis; August J. Pelsor, Sunman, both of Ind.

[73] Assignee: Wellman Thermal Systems Corporation, Shelbyville, Ind.

[21] Appl. No.: 896,566

[22] Filed: Aug. 14, 1986

Related U.S. Application Data

[63] Continuation of Ser. No. 527,290, Aug. 29, 1983, abandoned.

[51] Int. Cl.$^4$ .......................... H05B 1/00; B23K 9/00
[52] U.S. Cl. .................................. 364/477; 219/121 P; 219/121 PW; 204/192.33; 204/192.32; 204/192.12; 315/111.21
[58] Field of Search .................. 364/474, 477, 557; 219/121 P, 121 PF, 121 PT, 121 PY, 490, 494, 497, 383, 121 PW, 121 PR; 315/291, 308, 108, 111.01, 111.21, 111.11; 313/2, 5, 6; 204/164, 192 E

[56] References Cited

U.S. PATENT DOCUMENTS

| | | | |
|---|---|---|---|
| 3,909,664 | 9/1975 | Waskiewicz et al. | 315/308 X |
| 4,331,856 | 5/1982 | D'Antonio II | 313/231.31 |
| 4,389,691 | 6/1983 | Hancock | 361/6 |
| 4,396,478 | 8/1983 | Aizenshtein et al. | 219/494 X |
| 4,421,976 | 12/1983 | Jurek | 219/483 X |
| 4,446,560 | 5/1984 | Gabor | 219/121 PT |
| 4,464,610 | 8/1984 | Pitel | 315/308 X |
| 4,476,373 | 10/1984 | D'Antonio | 219/121 PW |
| 4,478,783 | 10/1984 | Broadwater | 364/494 X |
| 4,490,190 | 12/1984 | Speri | 219/497 X |
| 4,528,437 | 7/1985 | Burnett et al. | 361/2 |

*Primary Examiner*—Jerry Smith
*Assistant Examiner*—Allen MacDonald
*Attorney, Agent, or Firm*—Fitch, Even, Tabin & Flannery

[57] ABSTRACT

A control system to control a glow discharge apparatus, as for ion nitriding, utilizing operator selected parameters. Normally, the control system in an automatic state sequences through a glow discharge process by progressively changing modes. The sequence includes an idle mode, a pumpdown mode, a warming mode, a processing mode, a cooldown mode, and a cycle complete mode. The sequence can be interrupted by the control system to provide a plurality of special states, other than the automatic state, including a manual state, a hold state, a manual reentrant state, a power supply shutdown state, or a furnace shutdown state. While in the processing mode the control system regulates the pressure of an ionized gas in a chamber and the temperature of a workpiece within the chamber. The pressure is regulated as a function of the temperature whereby the pressure in the chamber is held to a first level until the workpiece temperature exceeds a threshold and thereafter is varied in accordance with a pressure-temperature profile responsive to the measured temperature.

2 Claims, 47 Drawing Figures

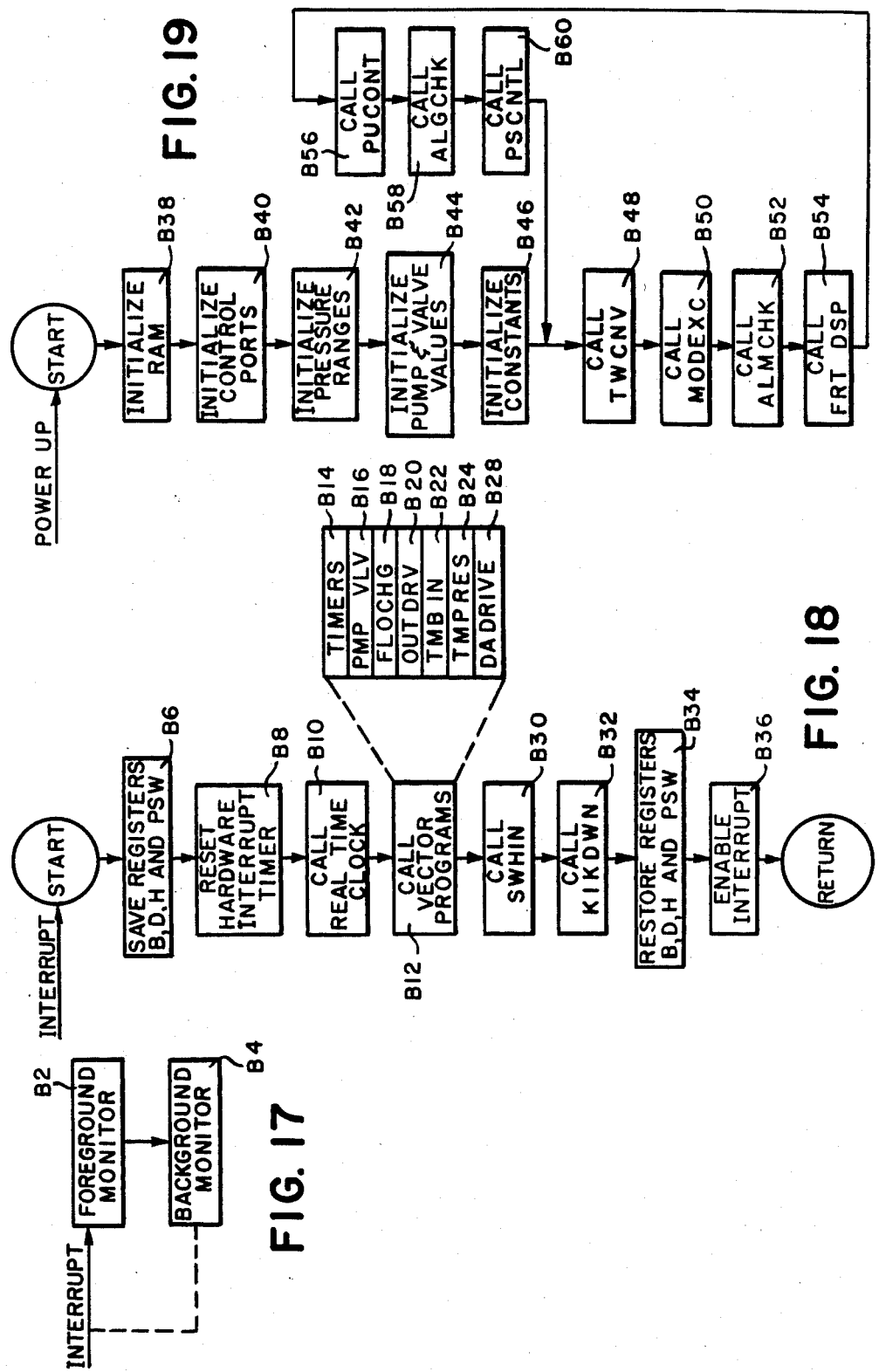

SYSTEM CONDITION TABLE

| MODES | STATES |
|---|---|
| IDLE = 0 | AUTOMATIC = 0 |
| PUMPDOWN = 1 | MANUAL = 1 |
| WARMUP = 2 | MANUAL/REENTRAUT = 2 |
| PROCESS = 3 | HOLD = 3 |
| COOL DOWN = 4 | POWER SUPPLY SD = 4 |
| CYCLE COMPLETE = 5 | SYSTEM SD = 5 |

METHOD AND APPARATUS FOR CONTROLLING THE GLOW DISCHARGE PROCESS

This application is a continuation of application Ser. No. 527,290 filed Aug. 29, 1983 and now abandoned.

The invention pertains generally to a method and apparatus for controlling the glow discharge process and is more particularly directed to such method and apparatus used in the glow discharge treatment of a workpiece by an ion nitriding process.

The glow discharge process is a well known phenomenon in the art. Generally the process contemplates a positive electrode (anode) and a negative electrode (cathode) spaced apart in an evacuated chamber containing an ionizable gas at a low pressure. When a DC potential of sufficient magnitude is applied across the electrodes, the gas will ionize causing current to flow. As the current increases, a self-sustaining process is established which gives off energy in the form of light giving rise to the term glow discharge.

Negatively charged electrons and positively charged ions are accelerated by the applied field toward the anode and cathode respectively to establish the current. On one hand the electrons collide with neutral atoms giving them enough energy for excitation (with the subsequent release of that energy as visible light) or ionization (with the release of an ion and a second electron). On the other hand, the gas ions acquire enough energy from the field to heat the cathode as they impinge on it and/or to eject one or more electrons from the cathode surface which in turn are accelerated toward the anode. When these processes are established, a self-sustaining glow discharge has been formed.

Chemically inert or active gases or a combination of both can be utilized in the glow discharge process. Inert gases produce only surface heating of the cathode while chemically active gases will result in both heating and a chemical change in the cathode surface. If the process gas includes chemically active nitrogen, then the cathode will be bombarded by nitrogen ions to provide a chemical change. When nitrogen is used, the process is termed ion nitriding and is but one form of the glow discharge process. Other similar processes such as carbonizing, carbonitriding, or siliciding are other forms of the glow discharge process and are performed by the appropriate selection of the gas mixture.

The most common use of ion nitriding has been the case hardening of metal parts that are subject to heavy wear. The metal part or workpiece to be processed is connected as the cathode in a glow discharge apparatus having an ionizable nitrogen based atmosphere. The workpiece is bombarded by the nitrogen ions during the glow discharge process. The momentum of the ions striking the workpiece produce the necessary heat and cleaning action on the surface and eventually some of the ions diffuse into the surface. This diffusion forms a chemical reaction with the metal, resulting in a nitride compound in the surface which is very hard and durable. The case depth or the penetration of the surface is a function of the amount of time the ions are permitted to bombard the surface under the influence of the nitrogen and the regulation of other process parameters such as gas mixture, current flow, temperature, pressure, and the metal used in the workpiece.

In a typical glow discharge process an adjustable D.C. power supply is used to control the current to a workpiece positioned as the cathode in the circuit. A discussion of the current density versus voltage characteristic of the apparatus provides the best understanding of the process. Initially as the voltage of the power supply is increased the current illustrates very little increase as the gas is not yet ionized. This region is termed a Townsend discharge and continues until the voltage is increased to where the gas begins to ionize. In the ionization stage or breakdown, the voltage remains substantially constant as the current density increases rapidly. The breakdown phase ends in a transition phase where the voltage actually decreases as the ions begin to avalanche and set up the glow discharge.

The process then enters a normal glow phase where a glow discharge has been established and is self-sustaining but does not cover the entire cathode or workpiece. This phase is characterized by a substantial change in current density for a small increase in voltage as the glow discharge expands to cover more of the surface of the workpiece. The normal glow phase is followed by another phase termed the abnormal glow stage where a substantial increase in voltage is required to increase current density. The actual ion nitriding treatment occurs in this phase and is where the current and voltage must be controlled to produce a useful result. If the voltage is increased above a certain point in the abnormal glow region, the current will increase rapidly while the voltage decreases rapidly as the glow discharge breaks over into an arc.

Arc suppression or control in the glow discharge process is important because as the glow discharge collapses into an arc much of the current used to establish the glow is now concentrated into a much smaller area. The current density through that portion of the workpiece increases dramatically and can cause damage to the workpiece if the arc is not quenched. Additionally the suppression of arcs is necessary to ensure that the workpiece is being heated normally because arcing robs power from the process as it causes a collapse of the discharge. A glow discharge in the normal region may be difficult to establish or ignite in the face of significant arcing activity. However, some arcing activity is inevitable in the process and occurs mainly during the warm up phase of the process where trapped gases on the surface evolve to provide low resistance paths. The initial arcing is useful in cleaning the workpiece surface such that at the processing temperature and pressure the workpiece will take the nitride surface evenly and without defects. Thus, it is important to control the arcing process to eliminate damage to the workpiece and reduce power loss without entirely suppressing the cleaning activity.

An example of an advantageous ion nitriding control system is disclosed in U.S. Pat. No. 4,331,856 issued to N. D'Antonio on May 25, 1982 which is commonly assigned with the present application. The disclosure of D'Antonio is hereby expressly incorporated herein by reference.

In D'Antonio a pressure control based upon an increase in pressure per unit of time (ramp rate) is disclosed. The pressure ramp rate is related to a desired temperature ramp rate set by the operator. This control although advantageous in normal operation illustrates some deficiencies when high arcing activity exists in the furnace chamber. The actual temperature of the workpiece during these periods of time does not follow the desired temperature ramp rate and the pressure tends to increase faster than it should until it exceeds the best pressure available for the workpiece. Since pressure control is important to control the arcing activity and ignition stability it is mandatory that the mismatch does not become too excessive. Therefore, in D'Antonio if a warmup period exceeds a predetermined period, a substantial mismatch has occured and the process must be restarted.

However, rather than the overall time the warmup process takes it is more important to match the pressure to the actual temperature of the workpiece. By setting a correct temperature-pressure environment in the furnace chamber, incorrect pressures which make ignition difficult or which encourage greater arcing activity can be avoided.

Prior art systems including D'Antonio lack a means for controlling pressure as a function of the actual temperature to generate the most advantageous pressure-temperature environment over the entire warmup mode. Moreover, these systems utilize only different linear slopes for the pressure ramp rate to change the pressure-temperature relationships for different workpieces. However, it is now recognized that certain workpieces have dimensional characteristics which are incompatible with a linearly increasing slope of pressure versus time. These workpieces must be handled manually to avoid "hollow cathode" effects and prior automatic ion nitriding controllers are ineffective to control the glow discharge process in these special cases. Further, because of differences in surfaces, weights, materials, and geometries of the workpieces, a linear pressure ramp is not always the most advantageous schedule regardless of its slope. Heretofore, the prior art ion nitriding controllers have not illustrated means to generate a non linear pressure schedule in the warm up mode.

D'Antonio controls arcing activity by an arc suppression technique whereby when an arc is detected the power supply is clamped to a zero output to quench the arc. The detection of an arc depends upon the sensing of a decrease in the voltage being supplied to workpiece. This arc detection method although advantageous in the abnormal discharge phase where arcing is accompanied by a substantial voltage decrease can be deceived in the normal discharge phase when an arc may be started by a substantial increase in current without a marked decrease in voltage. Only when the arc is well along to becoming established does the voltage drop significantly enough for detection by this method. By that time the arc may be doing damage to the workpiece and is robbing significant power from the glow discharge. Arcs are more detrimental to the workpiece if allowed to build to substantial intensity before being quenched.

In accordance with the invention, a controller is provided for automatically regulating the glow discharge process of an ion nitriding process used in the treatment of workpieces.

The controller includes means for automatically sequencing through an ion nitriding process by progressively changing modes. The sequencing means initiates the process from an idle mode and transfers it to a pumpdown mode in response to a start signal from an operator. The sequencing means terminates the pumpdown mode when the chamber pressure reaches a predetermined value associated with a next mode termed warmup. The warmup mode is maintained by the sequencing means until the workpiece has reached its processing temperature at which time the processing mode is entered. The processing mode continues for a predetermined time, during which the glow discharge treats the workpiece at the processing temperature and pressure. After the processing time has elapsed a cooldown mode is entered where the furnace and workpiece are cooled in a controlled process nearer to ambient. Once the cooldown mode has been accomplished, the sequencing means transfers the system to a cycle complete mode.

The controller further includes means for modifying the mode sequence to provide the system with different states. Normally, the controller will automatically sequence through the process modes without interruption in an automatic state. To vary this sequence, a manual state is entered by activating a manual selector to provide a state where the pump and valves of the system can be operated at the discretion of the operator. Additionally, automatic processing can be suspended at any time by placing the system in a hold state. While in the hold state, another special state, manual reentrant can be entered to change the pump and valve status before reentering the automatic state. Another two states, a shutdown of the power supply or a shutdown of the furnace and the power supply are provided in response to alarm or abnormal conditions.

While in the warmup mode, the temperature of workpiece is raised from ambient to the processing temperature by a power supply controlling means which controls the current supplied to the workpiece based upon arcing activity, the maximum temperature increase per unit of time that can be sustained by the workpiece, a current limit, and the processing temperature.

While in the processing mode, the temperature of the workpiece is maintained at the processing temperature by the power supply controlling means which controls the current supplied to the workpiece based upon arcing activity, a current limit, and the processing temperature.

The power supply controlling means includes an integral control which generates a current drive signal to the power supply for regulating its output current to that value. The current drive signal is increased per unit time when the actual power output from the control is less than a set power level which is calculated from the operating parameters of the systems, and the current drive signal is decreased per unit time when the actual power level is greater than the set level.

This integral action is changed during periods where there is substantial arcing activity as determined by a predetermined number of arcs occuring within a time period. During these periods of increased arcing activity, the incremental increases in the current drive signal are suspended until the arcing subsides.

The set power level of the control is determined by the difference between a calculated set power level and a health bias factor. The health bias factor is generated periodically as a constant percentage of the total drive level available if there is an arc during the measurement period and a zero percentage if there is no arc. Therefore, a proportional control of the set power level based upon the quantity of arcs occuring is provided. If the arcing activity is increasing the set power level is decreased an increment for each arc while if during periods where there are no arcs it is allowed to increase. In the warm-up mode where arcing activity is more pronounced because of the increasing current level and cleaning action, the gain of the health bias factor is set to a first predetermined level. In the processing mode where arcing activity is usually less, but still can be troublesome, the gain of the health bias factor is set to a second level which is lower than the first.

In this manner, arc suppression activity is used as the basis of a glow discharge stability control in the process. While in the warm-up mode, the arc suppression activity is used to proportionately reduce the power drive level to stabilize the glow discharge until surface cleaning is completed. Then, as the arc suppression activity decreases, the power level drive is allowed to increase to the value requested by the calculated power level. Thereafter, the stability of the glow is maintained in the processing mode by this control but with a reduced authority.

The power supply controlling means includes a means for calculating a set power from an error signal indicating the distance that the control is operating from a calculated temperature ramp in the warm-up mode and the distance the control is operating from the processing temperature in the processing mode.

In the warm-up mode, the error signal provides a temperature ramp rate control where the instantaneous ramp rate is compared to a requested temperature ramp rate set by the operator. The power level is increased only if the actual ramp rate is below the requested ramp rate. This is advantageous because the control does not drive the actual rate beyond the desired rate at any time because once the desired or set rate is achieved, then the error is zero and the power level maintained.

This type of control is especially beneficial for a glow discharge process because, unlike conventional heating processes, the glow discharge process does not always produce more effective heating with more applied power. Excessive voltage or current increases during the warm-up mode can drive the glow discharge into arcing as the workpiece surface evolves trapped gasses. Arc suppression control activity can then result in a net decrease in the applied power and, therefore, less heating. Thus, it is more effective for the control to limit the instantaneous ramp rate of the temperature rather than to try to maintain an overall ramp rate based on total elapsed time.

The error signal generating means further includes a means for starting the glow discharge process. The starting means soft starts the process by limiting the rate of the power drive level during the first few minutes of the warm-up mode. This is accomplished by proportionately underestimating the actual temperature ramp rate error until the soft start time period is complete and then using the full actual ramp rate error thereafter. The starting means therefore gradually brings the power drive up to the level corresponding to the actual ramp rate error to avoid thermal shock to the workpiece. The error signal generating means additionally includes a means to gradually decrease the ramp rate of the temperature as the actual temperature approaches the processing set point. This action improves the accuracy of the temperature control as the power drive is brought to a level which facilitates the transition from the ramp rate control of the warm-up mode to the set point control of the processing mode.

The means for calculating the set power level operates to determine a power level such that the error signal is minimized. In a preferred implementation, the set power level calculating means is a proportional-integral-derivitive control operating to null the error signal. The PID control includes means to deactivate the derivitive action of the control during the warm up mode, since only an integral control to null the ramp rate error is desirable. In the processing mode, a faster reaction time is desired to respond to transients and the derivative portion of the control used to advantage.

While in the pump-down mode, a pump-valve sequence (PVS) controller reduces pressure in the furnace chamber to below ambient such that the reactive oxygen atoms of the atmosphere are removed from the processing atmosphere. While in the warm-up mode, the PVS controller regulates pressure according to a temperature dependent pressure profile or pre-programmed function. While in the processing mode, the PVS controller regulates the pressure in the furnace chamber such that the processing pressure entered by the operator is maintained when the workpiece is at the processing temperature. While in the cool down mode, the PVS controller raises the furnace pressure back to ambient as the work piece cools below an oxidizing temperature.

In the warm-up mode, the pressure profile used by the PVS controller is a pressure scheduled as a function of actual temperature. Pressure control as a function of temperature in this mode is important because the actual temperature of the work piece may not follow a set time function. A non-linear temperature versus time profile is particularly evident in the present power supply control means where the temperature ramp rate is modified by arc suppression, health bias activity, soft start capability and ramp rate control. Regulating pressure by a pressure temperature profile therefore maintains proper pressure for the actual operating conditions throughout the warm-up mode regardless of the length of time required to reach the process temperature.

Secondly, the pressure versus temperature profile can be made highly nonlinear which is useful in overcoming defects caused by the glow discharge process on work pieces with dimensional characteristics which can cause a "hollow cathode" effect. This detrimental effect is alleviated entirely by scheduling the pressure versus temperature profile around those conditions which cause the defect. Areas in which the "hollow cathode" effect can take place for a certain sized work piece are therefore programmed around and avoided entirely.

The controller also includes a means for arc detection based upon impedance measurement. The means for arc detection comprises means for generating a base or historic parameter of impedance for the power supply load over a predetermined time. Periodically, the arc suppression means tests this variable standard against an immediate value of impedance for the power supply load to determine if there is a marked decrease. Upon a decrease of the immediate impedance beyond a set percentage of the standard, the arc suppression means will produce an arc suppression or a kickdown signal that indicates an incipient arc.

In response to an arc detection, the controller includes means for suppressing the incipient arcs. The arc suppression means is activated by the arc detection means and clamps the power supply current to zero upon receiving the kickdown signal. The arc suppression means additionally includes a means for holding the power supply in an inactive state for a short duration of time after a kickdown. When the holding or delay period has expired the arc suppression means allows the current to float to a pedestal value. The pedestal value is calculated as a fractional percentage of the current drive prior to the arc detection. Once the pedestal value is established, the arc suppression means will increment the current drive back to its previous level.

This operation of the arc detection and arc suppression means is advantageous for several reasons. By basing arc detection on the impedance or the change in impedance of the power supply load, incipient arcs are detected and quenched before they have a chance to become established and rob power from the system. The system will lose much less power and heating capability if an arc is quenched prior to its establishment rather then subsequent thereto. Additionally, arcs which would not have been detected by prior art systems (rapidly increasing current conditions without a substantial voltage decrease) are easily detected with this technique.

Other objects, features and aspects of the invention will be more clearly understood and better described if a reading of the detailed description is undertaken in conjunction with the appended drawings wherein:

BRIEF DESCRIPTION OF THE DRAWINGS

FIG. 17 is a system flow chart illustrating the major architectural configuration for the control program stored in the microprocessor controller illustrated in FIG. 4;

FIG. 18 is a detailed system flow chart of the foreground monitor illustrated in FIG. 17;

FIG. 19 is a detailed system flow chart of the background monitor illustrated in FIG. 17;

FIGS. 38, 39, 40 and 41 are detailed system flow charts of the subroutine PIDCONTROL called in the subroutine DRIVECONT illustrated in FIGS. 33, 34, and 35;

DETAILED DESCRIPTION OF THE PREFERRED EMBODIMENT

Figure 1:
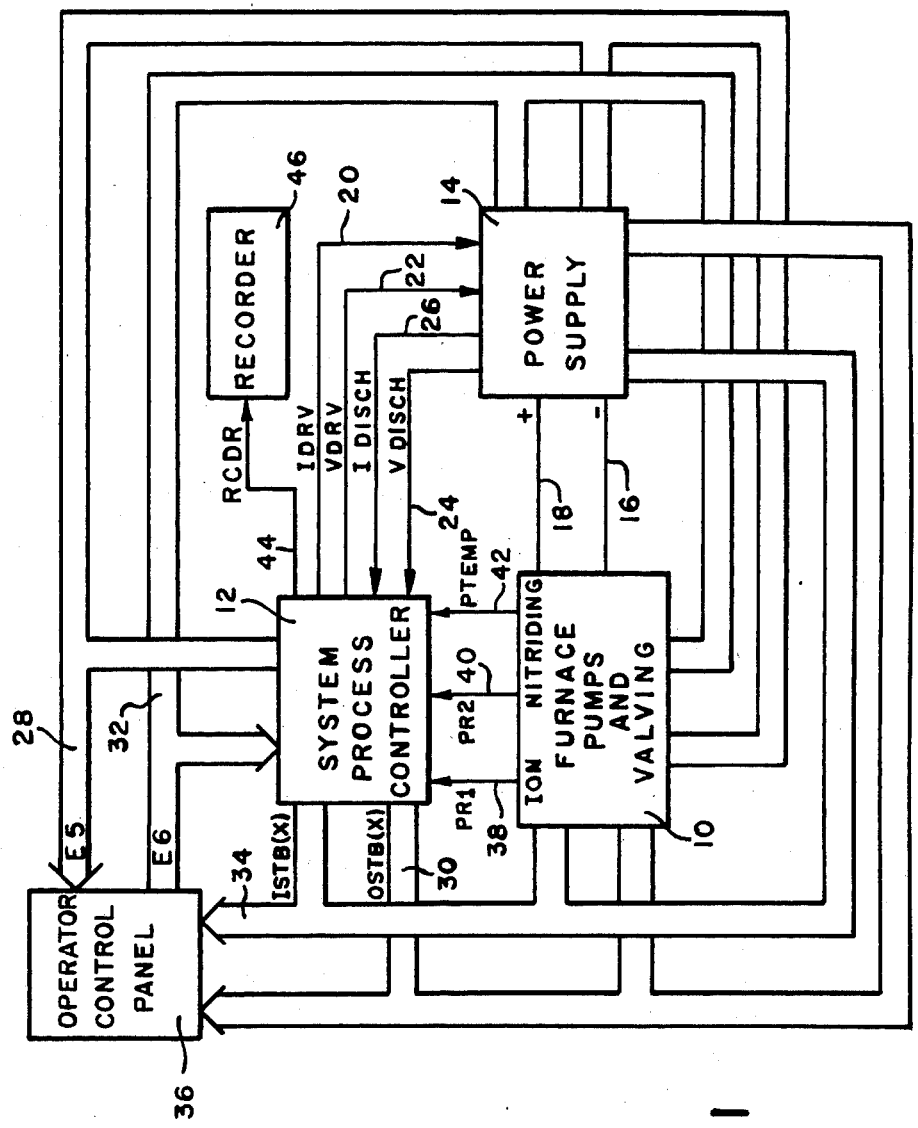
FIG. 1 is a system blocked diagram of an ion nitriding system constructed in accordance with the invention.

In FIG. 1 there is illustrated in block diagram form an ion nitriding system for the case hardening of metal workpieces. The system includes an ion nitriding furnace 10, in which the workpieces are connected as the cathode in a glow discharge process and such associated pumps, valving, and sensors as are needed to control the process. Generally, for systematic operation a microprocessor based system process controller 12 regulates the output energy from a unfiltered DC power supply 14 to the furnace 10 via power conductors 16, 18. By regulating the output energy of the power supply 14, the process controller 12 determines the various regions (normal, abnormal) in which the glow discharge process will operate, the current density provided to the workpiece in the process, and the time and temperature profile of the process. The energy output of the power supply 14 is controlled by two analog control signals, IDRV, VDRV transmitted to the supply 14 via conductors 20 and 22 from controller 12.

The signal IDRV is a parameter indicating the amount of current to be supplied to the glow discharge process by the power supply 14 and the signal VDRV is a parameter indicating the voltage to be maintained by the power supply 14 across power conductors 16 and 18. To determine the actual current and voltage supplied to the furnace 10, the process controller 12 recieves from the power supply 14 feedback signals IDISCH, VDISCH via conductors 24,26. The signals IDISCH, VDISCH are generated internally to the power supply 14 and indicate the amount of current supplied to the workpiece and the voltage across the power supply load respectively.

The process controller 12 further provides discrete control signals for clamping and disconnecting the power supply 14 from the furnace via a digital output data bus 28 under the supervision of an output control bus 30 having individual strobe lines OSTB(x). Additional input status signals in discrete form are received by the process controller 12 from the power supply 14 via a digital input data bus 32 under the supervision of an input control bus 34 having individual strobe lines ISTB(x).

The input and output data buses 28, 32 repectively and the input and output control buses 34, 30 respectively further communicate with an operator control panel 36. Discrete input data from the control panel includes process control inputs, operator control inputs, and other optional inputs. Discrete output data from the process controller 12 to the operator control panel 36 includes signals to control mode indicators, process alarms, operator control indicators, process parameter readouts, and system flow indicators.

Additionally, the input and output data buses 28,32 respectively and the input and output control buses 34,30 respectively communicate with the furnace 10. Discrete control signals from controller 12 are utilized to activate the pumps and valves in a sequence to regulate the pressure within the furnace. Inputs from the furnace 10 to the controller 12 includes status inputs to allow the controller to respond to fault conditions and other abnormalities which may beset the process.

The furnace develops feedback signals PR1, PR2, PTEMP from sensors appropriately located in the furnace to communicate to the controller 12 the actual pressure of the furnace chamber and the actual temperature of the workpiece respectively.

In general operation, the system process controller 12 contains a stored program which provides system data input and output control via the analog signals and discrete signals. Operator commands and other status information are input to the controller 12 from the operator panel 36. These commands are translated and then processed to form parameters which when used by the controller 12 to sequence the pumps and valves of the furnace 10 through an ion nitriding process. During the sequence, the stored program modulates pressure in the furnace chamber by means of a feedback control utilizing the pumps and valving and modulates temperature of the workpiece by means of a feedback control utilizing the power supply 14.

The process controller 12 generates an analog signal RCDR via conductor 44 to the input of a recorder 46. The variable RCDR is generated as an analog voltage, indicative of the temperature profile as a function of time for the workpiece. In this manner, a permanent record of this important process parameter for each part may be obtained and cataloged for further refinement of the process sequence.

Figure 2:
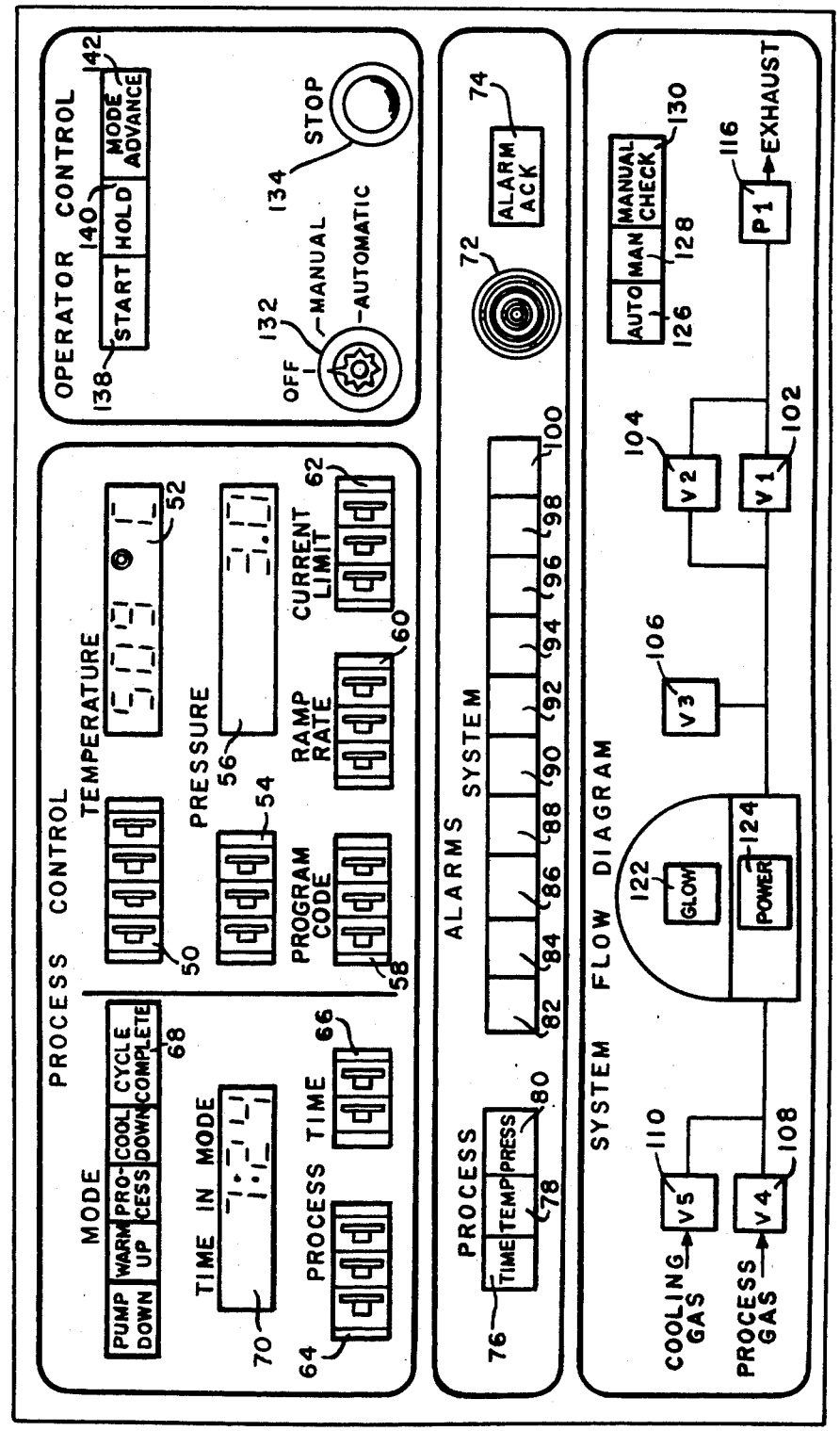
FIG. 2 is a pictorial view of the operator control panel illustrating the control switches and indicators of the operator panel illustrated in FIG. 1.

The inputs from and the outputs to the operator control panel 36 will now be further explained with reference to FIG. 2. In the figure, there is shown pictorially the face of the control panel which is segmented into a process control section, an operator control section, an alarm section and a system flow section. Each of these sections will now be more fully explained with respect to their interaction with the other system components.

The process control section includes a number of thumbwheel switches with which to input the basic process parameters of the glow discharge process, a mode display for indicating in which mode the process is presently in operation, and several seven segment displays for displaying the instantaneous actual values of several process parameters. With thumbwheel 50, the operator can set up to four digits of a temperature parameter. This input is representative of the process temperature at which the ion nitriding process should take place. The seven segment display 52 will track the process to provide a four digit display of the actual temperature of the workpiece. The least significant segment in the display is used to indicate whether the process temperature input and the actual temperature displayed are in degrees Farenheit or Centigrade.

The process pressure at which the ion nitriding process is to take place is input to the system by setting a three digit thumbwheel 54 while the actual process pressure is displayed in the six digit display 56. Thumbwheel 58 provides a three digit program code used to recall special temperature profiles as will be more fully explained hereafter and thumbwheel 60 is used to input a three digit number indicating the ramp rate (°/hr) at which the temperature of the workpiece should increase during the warmup period. The maximum current limit to be supplied to the workpiece is set by the three digit thumbwheel 62. The process time for the workpiece in hours and minutes is input to the controller via the five digits of thumbwheels 64 and 66. This is the amount of time the workpiece should be subjected to the process temperature and pressure to produce a nitride surface.

The five visual indicators of a mode display 68 light to provide the operator with information about which mode the system is presently operating in. An indicator is provided for the pumping mode, the warm-up mode, the processing mode, the cooling mode, and cycle complete mode. A five digit display 70 is used to provide the operator an indication of the amount of time the system has spent in any of the modes.

The alarm section of the operator panel includes a series of visual alarm indicators for process alarms and systems alarms. The section further includes an audible alarm device 72 and a push button 74 which the operator can use to acknowledge the visual indications to the process controller 12.

The process alarms includes a visual indicator 76 for alarming a condition where the process temperature is above a limit, a visual indicator 78 for alarming a condition where the process pressure is above a limit, and a visual indicator 80 for alarming a condition where the total process time is in excess of a limit. Generally, these alarm limits are activated in response to the respective process parameter settings being exceeded by a predetermined increment.

In a similar manner, visual indicators 82-100 alarm special conditions occurring in the system. Alarm 82 indicates that the chamber interlocks of the furnace are open, alarm 84 indicates the power supply temperature has exceeded a limit, alarm 86 indicates there has been a power supply failure, alarm 88 indicates the glow discharge is unstable, alarm 90 indicates the cooling water flow to the furnace is low, alarm 92 indicates the cooling water temperature has exceeded a limit, alarm 94 indicates the process gas pressure is below a limit, alarm 96 indicates that the valve air is low, and alarms 98, 100 are provided as special alarm indicators that can be assigned to conditions depending upon system configuration.

The system flow section of the operator panel 36 is a diagramatic display of the system hardware including the furnace, valves and pump arranged by visual indicators which show the operational condition of a particular component. Further, many of the indicators incorporate push button switches to manually set the particular device in a certain operating modes. Indicators 102, 104, 106, 108, and 110 light to provide the operator with an indication of whether valves V1-V5 respectively are open or closed. These indicators further include a push button switch such that valves V1-V5 are manually operable in certain operational states of the system. Indicator 116 is similar to those described for the valves and contains both a push button switch and a visual indicator for controlling and displaying whether the pump P1 is on or off.

The system flow section of the operator panel 36 additionally provides indicators 122, 124, 126, and 128. Indicator 122 produces a visual indication of whether a stable glow discharge has been initiated in the furnace, indicator 124 visually indicates whether the power supply is providing a DC voltage to the furnace, and indicators 126 and 128 visually differentiate whether the system is in a manual or automatic state. Indicator 130 is a combination of a visual indicator and a push button switch for displaying and controlling a manual check operation for the system as will be more fully described hereinafter.

The operator control section of the operator control panel 36 includes a control selection knob 132, a stop button 134, and an operator control pad 136. The control selection knob 132 allows the operator to place the process controller in one of four different major configurations which are either off, manual, automatic, or diagnostic. The stop button 134 is provided such that the operator can terminate the glow discharge process at any time without regard to which state and mode the process controller is operating in.

The operator control pad 136 is composed of several combination switch indicator buttons 138-162 with which the operator communicates commands to the process controller by the switches and receives acknowledgements of the switch commands by the indicators. The starting of an automatically controlled glow discharge process, automatically controlled, is initiated by the operator activating button 138. The process controller will acknowledge this command by lighting the indicator container in that button. Similarly, button 140 is used to place the process controller into a holding state, and button 142 is used to change the process mode.

Figure 3:
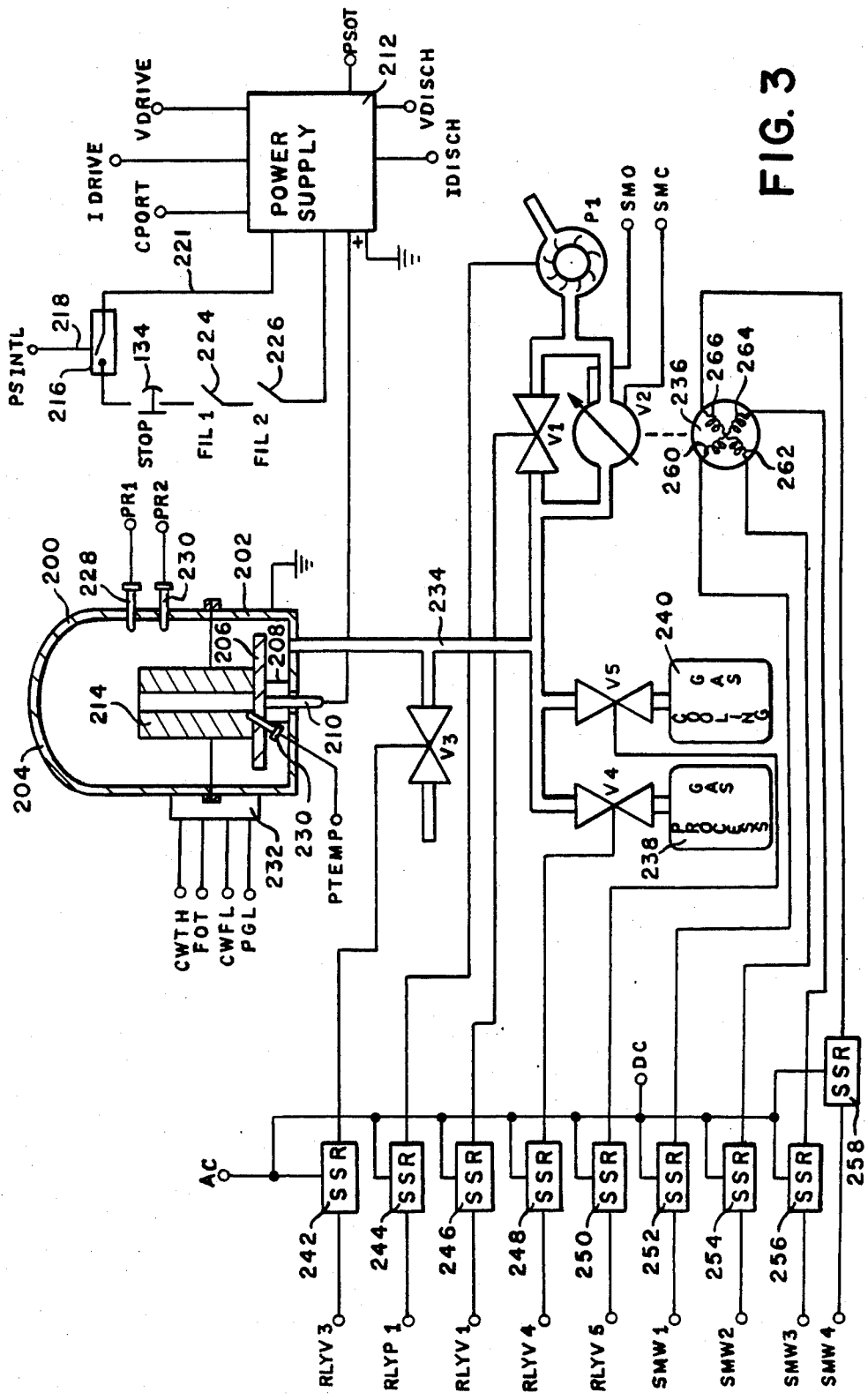
FIG. 3 is a schematic and partial cross-sectioned view of the pump and valves configuration and their connection to the ion nitriding furnace and power supply illustrated in FIG. 1.

The pump and valve configuration in addition to the ion nitriding furnace and the power supply will be now more fully discussed with reference to FIG. 3. The shell of the ion nitriding furnace is shown as a bell shaped upper piece 200 and a cup shaped lower piece 202 that forms a vacuum chamber 204. Mounted inside the furnace chamber is a conductive work table 206 which is insulated from the upper bell and bottom piece by a insulator 208. A high-tension electrode 210 extends outwardly from the table 206 through the insulator to be conductively connected to the negative terminal of power supply 212. The positive terminal of the power supply 212 is commonly grounded with the outside of the furnace shell 200, 202.

Inside the furnace chamber 204 and set on the table 206 is a workpiece 214 to be ion nitrided with the glow discharge process. Because of its relative contact with the table 206, the workpiece 214 obtains the same polarity as the negative terminal of the power supply. The workpiece 214 therefore is used as the cathode in the glow discharge process.

The power supply includes a conductive path 211 forming a closed circuit for the solenoid of a power relay providing high voltage AC power to the supply. The electrical continuity of this path 211 can be broken by a number of switches in series with the conductor. A switching device 216 responsive to a power supply interlock signal PSINTL can open the conductive path to disengage the power supply from the workpiece 214. The PSINTL signal is generated by the system process controller 12 from various conditions of the system. Further, a push button 220 is connected to the stop button to disengage the power supply when the stop button 134 (FIG. 2) is activated. In addition, the switches to 224, 226 are broken by the panel doors on the furnace being opened and become furnace interlock signals FIL1, FIL2.

Pressure sensors, 228 and 230 sense the actual pressure in the furnace chamber 204 to generate the pressure signals PR1, PR2 to the analog to digital converter of the system process controller 12. Another analog signal input to the system process controller is the PTEMP signal indicative of a actual temperature of the workpiece 214. The actual temperature of the workpiece is developed by a temperature sensor 230 in intimate contact with the workpiece 214. The furnace also contains a cooling water system which conducts heat away from the furnace while the glow discharge process is in progress. In connection with this cooling water system, the block of indicators 232, generate system signals CWTH indicating that the cooling water temperature is too high and CWFL indicating that the cooling water flow is too low. Additionally the indicator block 232 has means for generating the signal FOT indicating that the furnace temperature is too high and signal PGL indicating that the process gas pressure is low.

Gas pressure in the furnace system is controlled by system conduit 234 which is connected to a configuration of valving and a pump. This configuration provides process gas, cooling gas and a vacuum for the chamber 204. Initially, the system conduit 234 which communicates between the chamber 204 and the outside atmosphere via a valve V1 and pump P1 also includes a proportional valve V2 in parallel with the valve V1. The pump in conjunction with the valve V1 provides a roughing function to bring the chamber pressure down to a substantial vacuum. The pump P1 then is used in combination with various openings of the valve V2 to control the pressure in the furnace chamber 204 in a precise manner under control of the system process controller 12. Stepping motor 236 provides the muscle to open and close the proportional valve V2 and thus vary the area of the restriction between the conduit 234 and the pump P1. The proportional valve V2 has a limit switch on its fully opened and its fully closed positions which generate the stepping motor open and stepping motor closed signals SMO, SMC respectively. In this manner the existing process controller 12 is able to determine the position of the valve V2.

Valves V4 and V5 are operably openable to provide inlets to the conduit 234 for a reservoir of process gas 238 and a reservoir of cooling gas 240. Generally, the process gas for the ion nitriding process is a mixture of nitrogen and hydrogen to provide heating on the one hand and a work hardening bombardment of nitrogen ions on the other. The cooling gas generally in reservoir 240 is nitrogen to allow a nonoxidizing atmosphere in which workpiece 214 can cool.

The conduit 234 also communicates to atmospheric pressure via a valve V3 which allows a vent to the atmosphere after the processing is complete. The valves V1, V3, V4 and V5 along with the pump P1 are generally in a inactive or nonoperating condition. To activate the valves or the pump P1, the system process controller activates a number of solid state relays having connections to an alternating current power supply AC, a direct current power supply DC, and other connections to the solenoid of the particular valve or the windings of the pump motor. In the embodiment shown, the solid state relay 242 is activated by a signal RLYV3 to connect the power supply Ac to the solenoid of valve V3. Similarly, the solid state relay 244 is energized by the signal RLYP1 to activate and deactivate the pump P1. Relay 246 is responsive to the system process controller signal RLYV1 to activate valve V1. Relay 248 is responsive to system processor signal RLYV4 to actuate valve V4 and relay 250 is responsive to system process controller signal RLYV5 to activate valve V5. Additionally, relays 252, 254, 256 and 258 are responsive to the system process controller signals SMW1-4 to connect the stepper motor windings 260, 262, 264 and 266 respectively to the power supply DC.

Basic overall operation of the system is as follows. Initially for the pump down mode, the system process controller 12 activates the pump P1 and valve V1 to bring the furnace chamber 204 pressure to a substantial vacuum. When the system is substantially evacuated, the system process controller 12 will deactivate valve V1 and activate valve V4 for a small period of time to allow process gas to enter the chamber 204 raising the pressure slightly to a starting pressure. The valves V4 and V2 are then operated by the controller 12 to control pressure as a function of temperature while the power supply 212 applies heating current to the workpiece 214. During the warm up mode the furnace pressure is eventually brought up to the processing pressure and the workpiece temperature increased to the processing temperature. The other various control operations during the warm up mode will be more fully explained hereinafter.

After the workpiece is at the processing temperature and pressure, the processing mode is entered and controller 12 operates the power supply 212 to maintain the process temperature and operates valves V2 and V4 to maintain the process pressure for a predetermined amount of time. After the processing mode is complete, the power supply is shut down and the workpiece 214 allowed to cool. The controller 12 operates the valve V5 to allow cooling gas into the chamber to avoid an oxidizing atmosphere. Further after the workpiece is cooled to a safe temperature the valve V3 is operated to vent the system to atmospheric pressure.

Figure 4:
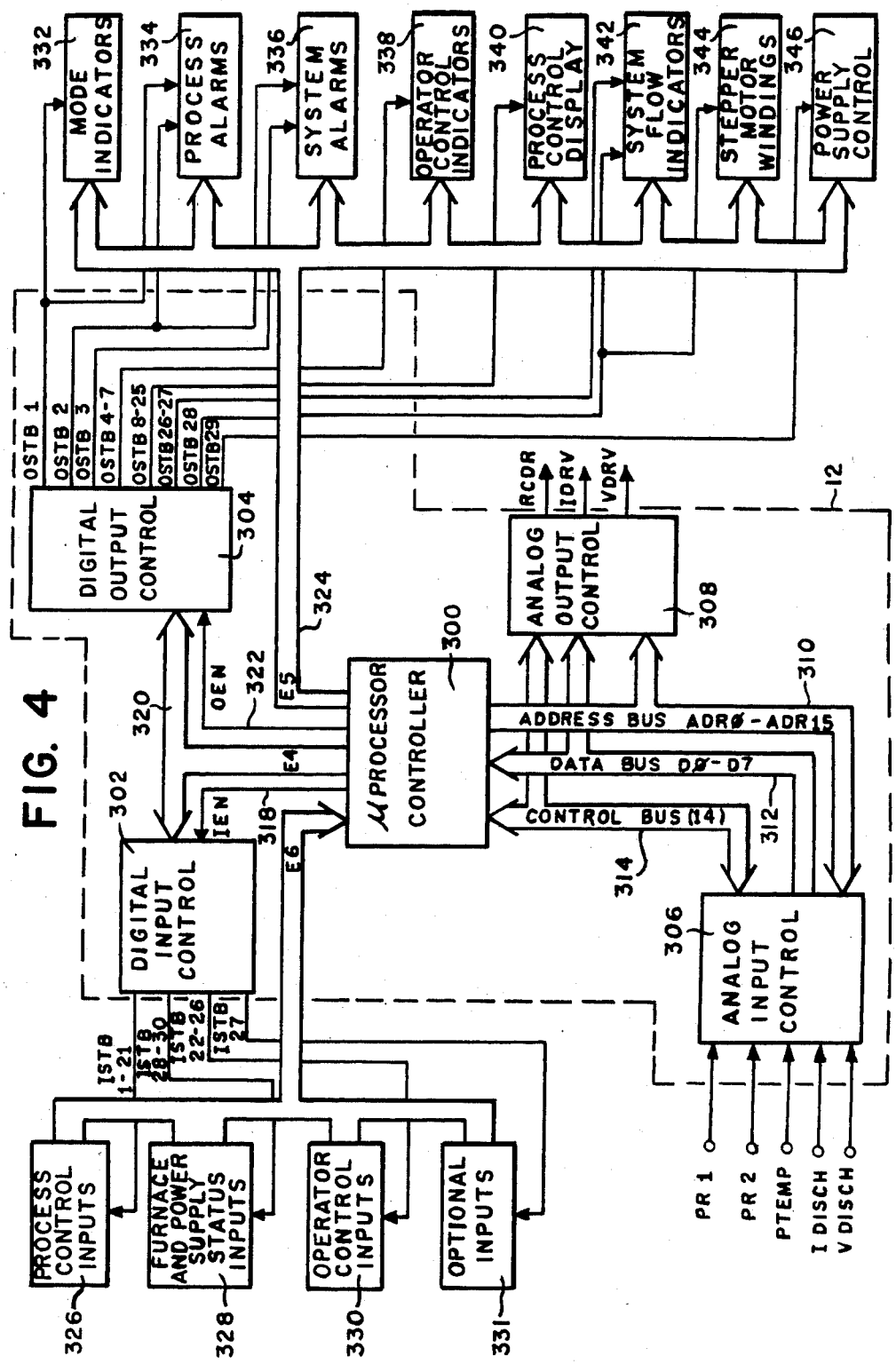
FIG. 4 is a system block diagram of the process controller illustrated in FIG. 1.

With respect now to FIG. 4, there shown a detailed electrical diagram for the system process controller 12. The system process controller 12 comprises a digital microprocessor controller 300, a digital input control 302, a digital output control 304, an analog input control 306 and an analog output control 308. The microprocessor controller 300 is preferably ISBC 80/16 single board computer that is designed around an eight bit 8080A-1 microprocessor clocked at a rate of 2.048 MHz. This single board computer is commercially available from the Intel Corporation of Santa Clara, Calif. and is more fully described in their reference manual ISBC 8016 single board computer hardware reference manual, the disclosure which is incorporated by reference herein. The single board computer comprising the microprocessor controller 300 therefore contains a central processing unit (CPU) that recieves and manipulates data and controls data flow throughout the system. The controller 300 would further include random access memory, programable read only memory, I-O capability for communicating with outside peripherals and complete system timing.

The controller 300 communicates with the outside peripheral devices through a 16 bit address bus 310 having address lines ADR0–ADR15, an 8 bit data bus 312 having data lines D0–D7, and a 14 bit control bus 314 having various control lines. Further, the microprocessor control 300 communicates with the outside peripherals over a number of input ports and output ports E(1)–E(n). These input and output ports are 8 bit wide data paths which have an internally controlled data protocol from the software contained in the controller 300.

The analog input control 306 under control of the microprocessor controller 300 performs the basic functions of analog data acquisition and analog/digital conversion for the five variable inputs PR1, PR2, PTEMP, IDISCH, and VDISCH. The analog input control 306 comprises basically a multiplexed A/D converter under control of the microprocessor controller 300. The control 306 includes also gain select logic for programably varying the gain of the different analog input channels. Additionally, a command register can be loaded via the data bus 312 with a command word to control the sequence of operations of the analog input control 306. Additionally included in the device is a multiplexer address register whose contents indicates to the multiplexor of the analog digital convertor which channel is to be selected for conversion and further is programable to include the gain to be used with that channel selection.

The microprocessor controller 300 communicates with the analog input control 306 by issuing memory read and memory write commands. For a conversion process to initiate the controller issues a write command to the multiplexer address register. The data that is entered into the multiplexer address register is from the data bus 312 and includes the input channel selected and the analog gain to be applied to the analog signal before A to D conversion. Once the channel and gain have been set, the controller then performs another write operation to the command register. The data input to the command register via the data bus 312 indicates that the analog convertor should be enabled for conversion and such occurs on the next operation of an internal pacer clock. The microprocessor controller 300 then performs read operations on the status register or the input control 306 until the device indicates that the conversion has been completed. Thereafter, the converted data may be accessed by performing a read command from the output data register of the device.

Preferably, an analog input control operating as has been described is commercially available as a Analog Input Board SBC 711 from the Intel Corporation of Santa Clara, Calif. The operation and connections of the SBC 711 are more fully disclosed in the reference manual entitled "SBC 711 Analog Input Board Hardware Reference Manual" provided by Intel which disclosure is included herein by reference.

The analog output control 308 is used to accept digital data from the microprocessor controller 300 and transformed that data into the analog output control variables RCDR, IDRV and VDRV. The analog output control 308 comprises basically a plurality of digital to analog convertors and appropriate registers control and bus interface logic. The microprocessor controller 300 communicates with the analog output control 308 by issuing memory write commands. An analog output signal is developed by the analog output control 308 by first having the microprocessor controller write a digital number to a internal hold register of the output control 308. This data is output from the microprocessor controller on the data bus and includes the most significant bits of the particular digital number that is to be converted. After the analog output control 308 acknowledges the receipt of the first number, the microprocessor controller transmits a second digital word via the data bus and issues a memory write command to the particular digital to analog convertor in the device that is to be selected. This transfers the full lower order and higher order digital words into the digital analog converter chosen and converts them to an analog voltage. The digital word converted is latched into a register of the chosen digital to analog convertor device and holds the analog parameter at that value until the microprocessor controller 300 commands its change.

An analog output control module as described is perferably an Analog Output Board SBC 724 available commercially from the Intel Corporation of Santa Clara, Calif. The operation and physical connections of the SBC 724 are more fully described in the Intel reference manual entitled "SBC 24 Analog Output Board Hardware Reference Manual" which disclosure is incorporated herein by reference.

The analog input control 306 and the analog output control 308 thereby provide analog input and output data control via the control, data, and address busses of the __ processor controller 300. The analog data is input under program control and processed in the microprocessor controller 300 to provide the control outputs which are regulated by the analog output control 308.

The provision for digital input to the microprocessor controller 300 is provided by the digital input controL 302 and the digital output control 304. The digital input control 302 produces a number of input strobe signals ISTB (X) which are used to discrete input signals in four bit clocks over digital data path 316. In the preferred embodiment the input data path 316 is the first four bits D0-D3 of the input port E6 of the previous described microprocessor controller board. The input data strobes ISTB (X) are generated by the digital input control 302 in response to an address selection word received from the microprocessor 300 via digital output data path 320 which is preferably microprocessor output port E4. The timing of the input data strobes ISTB (X) is coincident with an input enable signal IEN transmitted to the digital input control 302 from the microprocessor controller 300 via control line 318. The input enable signal IEN is preferably one bit of the output port E5 of the microprocessor controller 300.

Information input under the control of the digital input control 302 includes the process control inputs 326 and the operator control inputs 330 as previously described with respect to the operator control panel. Further inputs in this manner are the furnace status inputs 328 previously described in the context of the furnace and the optional inputs 331 which will be more fully described hereinafter.

The digital output control 304 operates similarly to the digital input control to provide discrete output control signals from the microprocessor 300 to the output devices. The digital output control 304 communicates with the output devices via a plurality of output strobes OSTB (X) which enable the devices to receive discrete output data via a 6 bit digital path 324. Preferably, the output data path comprised is the data lines D0-D5 of the output port E5 of the microprocessor controller 300. The digital output control generates the strobes OSTB (X) from an address selection word provided by the digital address bus 320 and an output signal OEN via signal line 322. The output enable signal line 322 is preferably one bit of port E6 of the microprocessor controller 300.

The digital output control under control of the address selection and output enable signals steers the digital data on the output data path 324 to the correct output device by means of the strobe signals OSTB (X). In this manner, the mode indicators 322, the process alarms 334, the system alarms 336, the operator control indicators 338, and the process control displays 340 on the operator control panel are operated under commands from the microprocessor controller 300. Further outputs are provided via data path 324 for controlling the system flow indicators and relay modules 342. The system flow indicators are located on the operator panel and the relay modules as described previously control the actual pumps and valving for the furnace system. Further the stepper motor windings 344 for the proportional valve V2 are provided with control signals in this manner. The power supply control 346 additionally receives digital control data from the digital output control via the data path 324.

Figure 5:
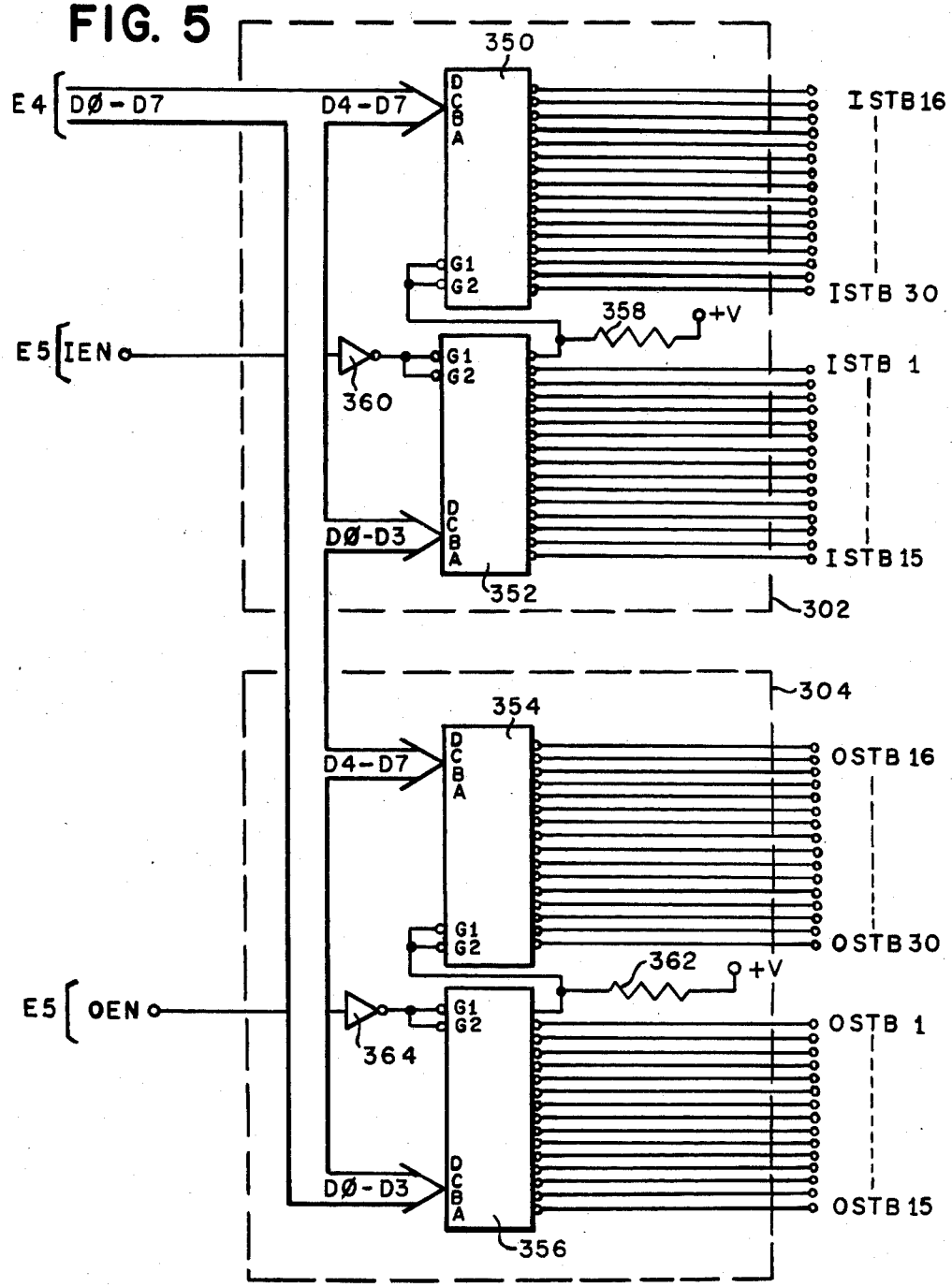
FIG. 5 is a detailed electrical schematic diagram of the digital input control and digital output control illustrated in FIG. 4.

The generation of the input strobes ISTB (x) and the output strobes OSTB (X) is more fully illustrated in FIG. 5. In that figure the digital input control 302 is ahown as the combination of two multi-channel multiplexor devices 350 and 352. Channel multlplexor 350 has seLection inputs A,B,C, and D and outputs ISTB-16-ISTB30. Further, the multiplexor 350 is provided with enabling inputs G1 and G2. Providing a digital address to the selection inputs A-D and a low enabling signal to inputs G1 and G2 of the multiplexor 350 will cause one of its output lines to traverse to a low logic level thereby producing a strobe. Multiplexor 352 operates in a similar manner and is an identical device to multiplexor 350.

The output port E4 of the microprocessor has its data lines D0-D7 connected to the selection inputs A-D of the multiplexors 350 and 352. The first four bits of the port D0-D3 are transmitted to the selection inputs of multiplexer 352 while the last four bits D4-D7 are transmitted to the selection inputs of multiplexer 350. The multiplexer 352 has its enabling inputs G1, G2 connected to the output of an inverter 360 whose input is the input enable signal IEN. The highest order output of the multiplexor 352 is connected to the enable inputs G1, G2 of the multiplexor 350 which are commonly connected through resistor 358 to a source of logic voltage plus V.

In this configuration, when a digital word is output from port E4, it is decoded into one of the input strobe signal lines ISTB1-ISTB30. The strobe signal is synchronous with the input enable signal IEN such that when the microprocessor generates the input enable signal it may further ensure that valid data will be supplied through the data path 316. The higher order bits D4-D7 are decoded into the strobe signals ISTB-16-ISTB30 when the data output from data lines D0-D3 selects the enabling input of multiplexor 352. This operation causes the highest order output of the multiplexor 352 to enable the multiplexor 350 and thereby decode the bits D4-D7.

The digital output control 304 operates in a similar manner by having a multiplexor device 354 and a multiplexor device 346 that generate output strobes OSTB1-OSTB30 from their output terminals. As was the case for the digital input control, the lower order multiplexor 356 has a highest order output connected to the enabling inputs G1 and G2 of the multiplexor @ 54. Further, these inputs are commonly connected through a pull-up resitor 362 to a source of logic voltage plus V. The lower order bits D0-D3 of the output port E4 are received by the selection inputs A-D of the multiplexor 356 and the higher order bits D4-D7 are received by the selection inputs A-D of the multiplexor 354. The output enable signal OEN is transmitted through an invertor 364 to the two commonly connected enabling inputs G1 and G2 of the multiplexor 356.

Operationally the digital output control is similar to the digital input control where, upon an address selection, and the output enable signal OEN one of the outputs of the multiplexors will go low providing a strobe output. The process is synchronized on the output enable signal OEN such that the processor can provide valid data on bus 324 synchronously with the output strobe. Multiplexor 356, therefore decodes the lower address line D0-D3 into the output strobes OSTB1-OSTB15 and the multiplexor 354 decodes the higher order bits D4-D7 into the output strobes OSTB-16-OSTB30. When the output enable signals OEN is true and the lower order bits D0-D3 are all 0 the highest order output of the multiplexor 356 enables the multiplextor 354 to decode the higher order bits D4-D7 as previously described.

Figure 6:
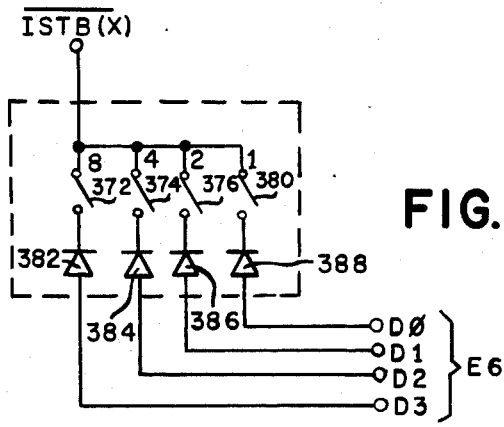
FIG. 6 is a detailed electrical schematic view of one of the common input circuits communicating with the digital input control illustrated in FIG. 4.

A specialized input circuit for grouping discrete input signals into a 4-bit word will now be more fully explained with respect to FIG. 6. A four bit input circuit 370 is illustrated as having four discrete input switches 372, 374, 376 and 380 lack associated with individual discrete inputs. One terminal of all the switches is connected to an input strobe line ISTB(x) while the other terminal of each switch is connected to the cathodes of individual diodes 382, 384, 386 and 388. The anodes of the diodes 382, 384, 386, and 388 are connected, respectively to individual data lines D3, D2, D1 and D0 of the input port E6. Depending upon which switches are closed and which switches are open, a four bit data word will be generated on the data lines D0-D3 when the input strobe signal ISTB(x) transitions to a low state. As the opening or closing of a switch indicates the state of a particular discrete input, the four bit data word input on the port E6 therefor is a digital combination of those four data inputs. This operation allows the system process controller to bring in discrete inputs in multiples of four by sequentially interrogating the input strobe lines as previously indicated.

Figure 9:
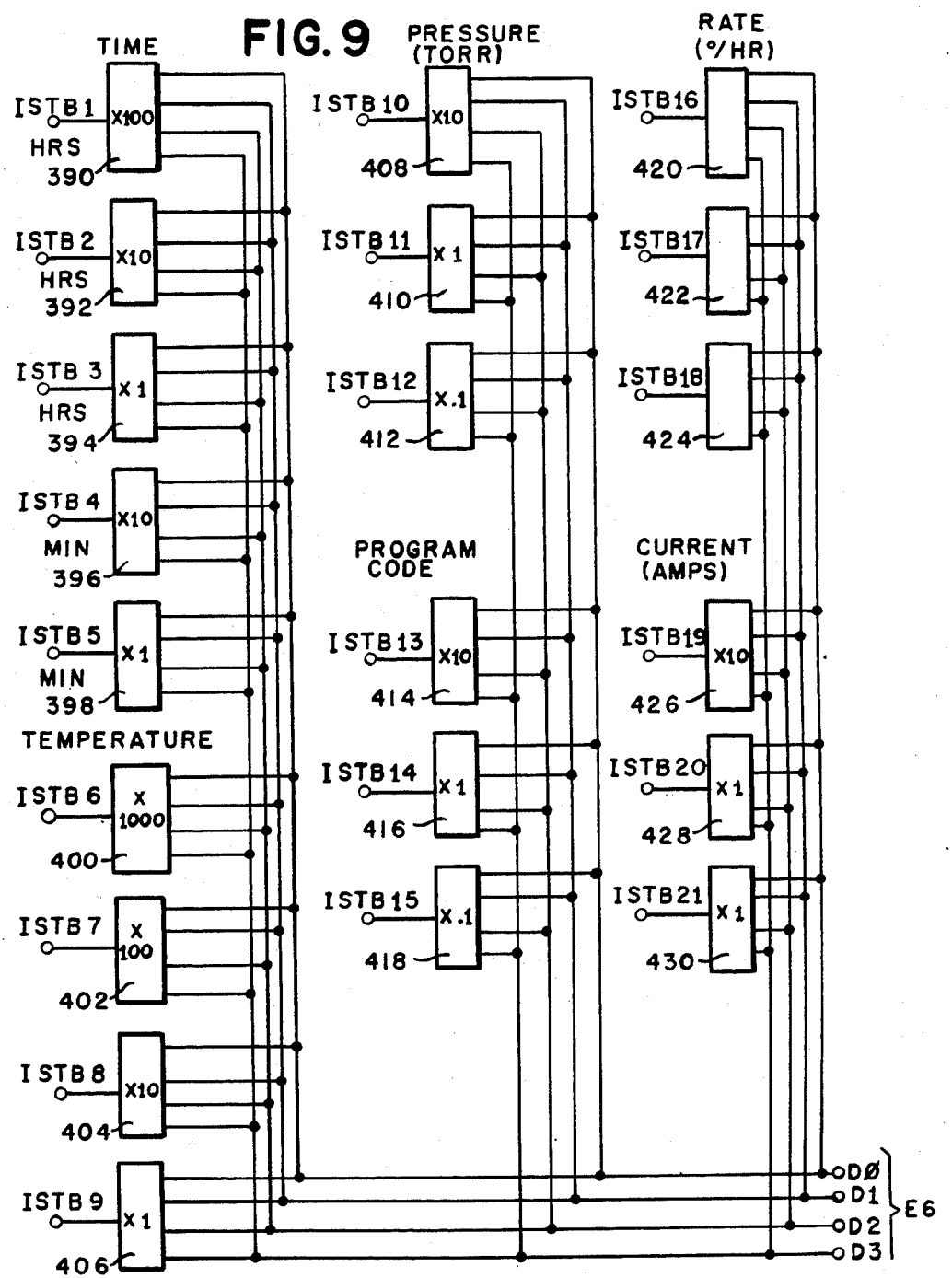
FIG. 9 is a detailed electrical schematic view of a plurality of input circuits illustrated in FIG. 6 which are utilized to input the process control parameters of the operator panel illustrated in FIG. 2.

FIG. 9 illustrates the manner in which the process control inputs 326 are received by the microprocessor controller. Each process control input circuit comprises a plurality of the discrete input circuits 370 which all have their outputs connected in parallel to individual data lines of D0-D3 of the input port E6. The process time is input by interrogating circuits 390, 392, 394, 396 and 398 with input strobe signals ISTB1-ISTB5 respectively. In similar manner, the processing temperature is input by sequentially interrogating circuits 400, 402, 404 and 406 with input strobe signals ISTB6-ISTB9, respectively. The processing pressure is input by serially interrogating circuits 40B, 410 and 412 with input strobe signals ISTB10-ISTB12. The program code is input by interrogating circuits 414, 416 and 418 with the input strobe signals ISTB13-ISTB15, respectively. The maximum temperature ramp rate is input by interrogating circuits 420, 422, and 424 with input strobe signals ISTB16-ISTB18, respectively. The maximum current limit is input by interrogating circuits 426, 428 and 430 with input strobe signals ISTB19-ISTB21, respectively.

Since ach of these state input circuits enters a four-bit digital word upon its interrogation by an input strobe signal ISTB(x), the thumbwheel switches for the process control inputs have been connected to the circuits such that each digit input is a BCD representation of the decimal number shown on the wheel. This method provides a convenient structure for serially interrogating a number of common circuits very quickly to input all of the process control data using only four data lines of one input port of the process controller.

The operator control inputs are received by the digital input path D0-D3 of input port E6 in a similar manner. Circuit 432 generates the status of the alarm acknowledge, the start switch, the hold button and the mode advance switch when interrogated by input strobe ISTB22. Circuit 434 inputs the status of the stop switch, and the mode advance switch when interrogated by input strobe ISTB23. Circuits 436 and 438 input the numerical inputs 1-8 when interrogated by input strobes ISTB24 and ISTB25 respectively.

Input data representing the status of the selector switch is generated by circuit 440 which has a moveable wiper 441 physically attached to the operator selector knob. One terminal of the wiper is connected to the input strobe signal ISTB26 and the other terminal is free to contact four terminals representing the positions of the switch indicating an off, a manual, an automatic, and a diagnostic setting. Depending upon the setting condition of the switch, the wiper will connect the input strobe signal through the conductor 441 to the appropriate signal line thereby providing a state bit to the input data path E6. Since none of the other settings receive the input strobe, the data lines will enter a four-bit digital word indicating the operator selector switch status.

In an identical manner, the furnace and power supply status inputs are generated by similar circuits to those previously described. Circuit 442 when interrogated by the input strobe signal ISTB28 will indicate the status of the furnace interlocks FIL1, FIL2, and the furnace over termperature signal FOT (FIG. 3). Circuit 444 when interrogated by input signal strobe ISTB29 will generate the status of the power supply over temperature signal PSOT, the process gas pressure low signal PGL, the cooling water flow low signal CWFL. Circuit 446 when interrogated by the input strobe signal ISTB30 will generate the status of the cooling water temperature high signal CWTH and the stepper motor open or closed signals SMO, SMC.

Circuit 448, again identical to circuit 370, is used to provide an optional four bit code input when interrogated by input strobe signal ISTB27. The code selector may be four switches on an internal panel of the processor controller which cannot be accessed by unauthorized personnel. The optional code can be used for many different purposes such as inputting a code that indicates that the temperature ramp rate and temperature control point are in degrees Farenheit instead of degrees Centigrade or a security code that must be passed prior to allowing changes in the process control parameters.

Figure 7:
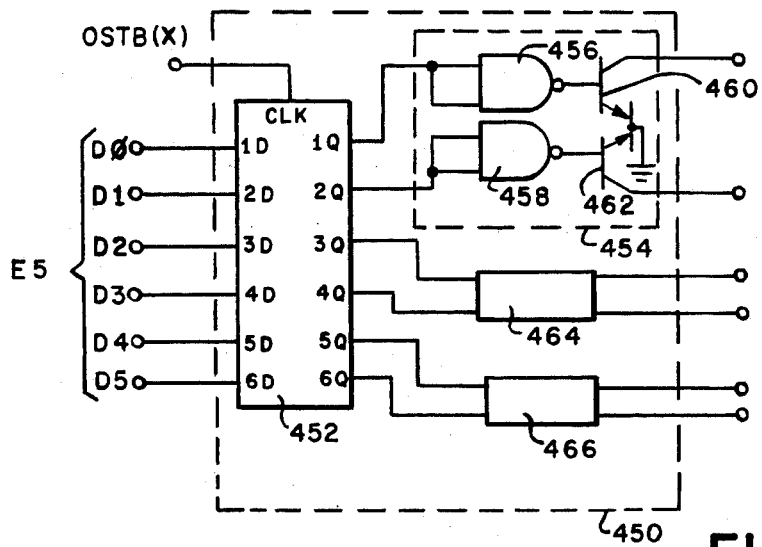
FIG. 7 is a detailed electrical schematic view of one of the common output circuits communicating with the digital output contol illustrated in FIG. 4.

The output circuits will now be more fully explained with respect to the commonly used output driver circuit shown in FIG. 7. The output driver circuit 450 is used as a commonly connected driver to receive the data output words from port E5 in combination with the output strobe signal OSTB(x) and generate driver signals to the particular indicators and relays that are controlled. The output driver circuit 450 comprises a six bit digital latch 452 having inputs ID-6D connected to the individual data lines D0-D5 of the output port E5. The latch 452 has a clock input which is connected to one of the individual strobe lines OSTB(x). A pair of the outputs 1Q-6Q of the latch 452 is connected to a buffer circuit 454. Each buffer circuit is comprised of two NAND gates 456, 458, connected as inverters. The output of each NAND gate 456, 458 drives an open collector NPN transistor 460, 462 respectively. The open collectors of the transistors are each connected to an output device such that when a transistor is activated the control terminal of the device will be grounded through that transistor. Buffer circuits 464 and 466 are similarly connected to output pairs of the latch 452 and contain circuitry identical to the output buffer circuit 454.

In overall operation the output driver circuit 450 receives a six bit digital output word from the output port E5 at the same time strobe signal OSTB(x) is generated to the latch 452. This operation clocks the output word into the latch and provides similar bit information on the outputs of the latch. The outputs of the latch are buffered before driving the control terminals of connected devices specifically, zero state bits are inverted by the NAND gates and drive the NPN transistors into conduction. A conducting transistor provides a ground signal to the output terminal of the driver device to indicate that the connected output device should be activated.

Figure 11:
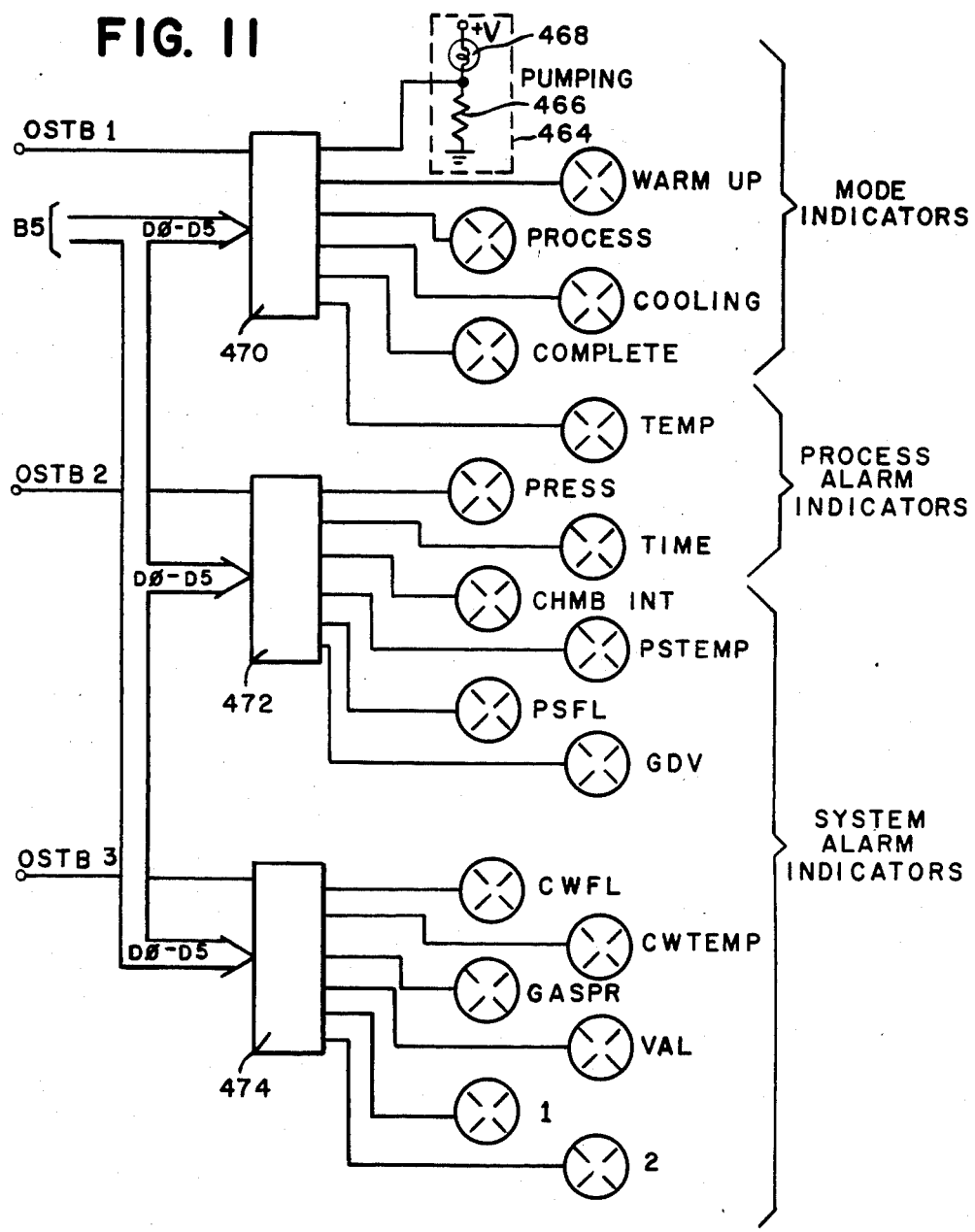
FIGS. 11 and 12 are detailed electrical schematic views of a plurality of output circuits illustrated in FIG. 7 which are utilized to drive the mode indicators, process alarm indicators, system alarm indicators, and operator control indicators as illustrated in FIG. 4.
Figure 12:
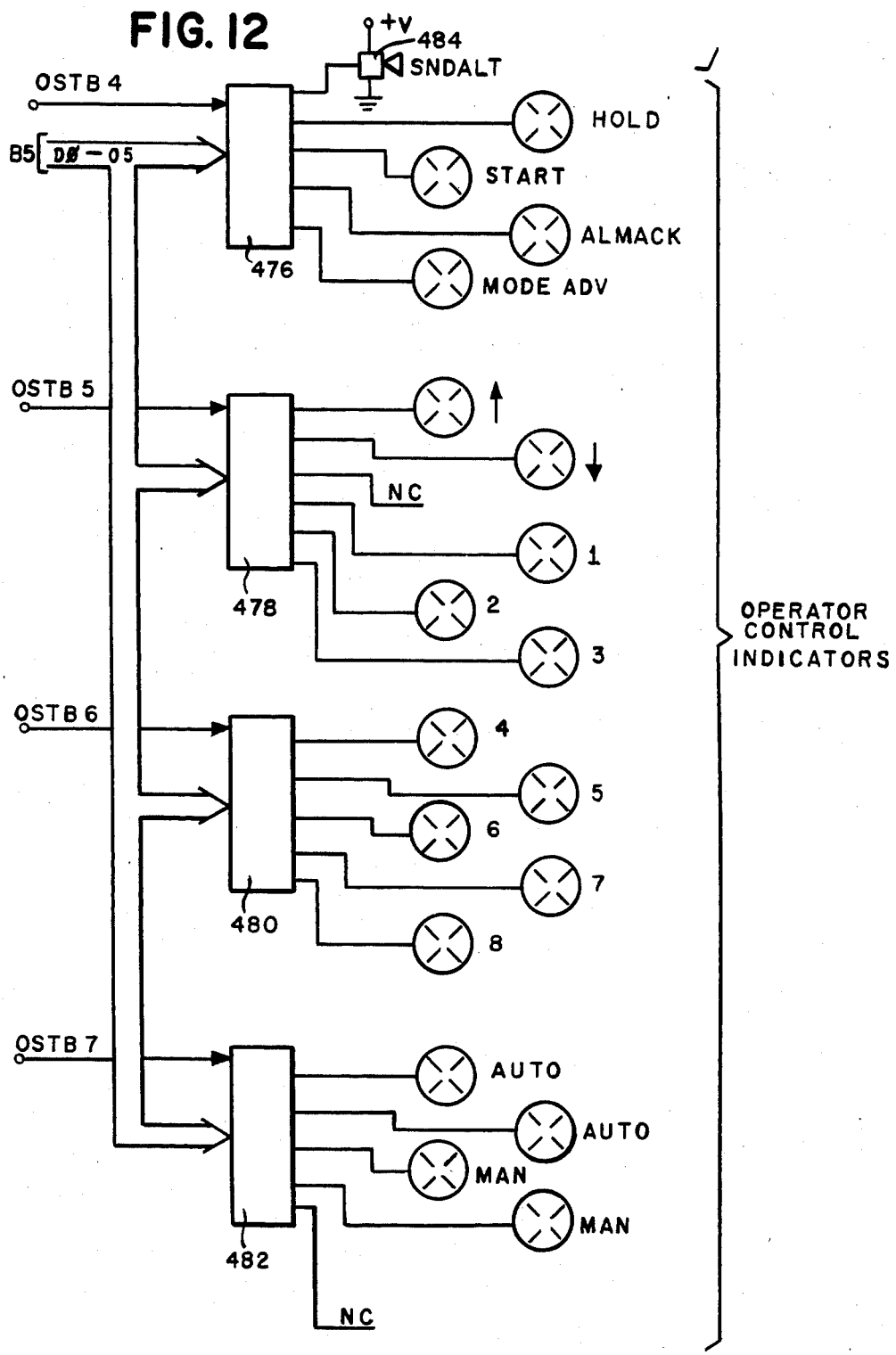

With reference now to FIGS. 11 and 12, it is illustrated there that the common output driver circuit 450 can be used to light all the indicators on the operator control panel 39. Each of the output driver circuits 470, 472, 474, 476, 478, 480 and 482 are identical with the output driver circuit 450 described previously. They are individually connected to the output strobe signals OSTB1–OSTB7 respectively and commonly connected to the data lines D0–D5 of the output port E5. Each individual driver circuit output is connected to an indicator circuit 464 mounted on the operator panel having a serial connection of an indicator 468 which can either be an incandescent light or LED or the like and an impedance 466 connected between a source of voltage +V and ground. The output terminal of each open collector transistor of an output circuit is connected to the junction between the indicator 468 and the impedence 466. The impedance 466 is high enough to maintain the indicator 466 in a nonconduction state while the open collector transistor is non-conducting. When the data word from the micro processor controller 300 is loaded into the latch and produces conduction of the transistor, a ground path is provided through the indicator 468 and transistor to provide current flow. The current flowing through the indicator 468 thereby produces a visual indication of the bit condition loaded from the output port E5.

In this manner, circuit 470 activates the mode indicators for the pumping, warm-up, processing, cooling and cycle complete modes. The circuits 470 and 472 in combination activates the process alarm indicators for the temperature, pressure and time. The circuits 472, 474 and 476 activate the system alarm indicators for the chamber interlock CHMB, the power supply over temperature alarm PSTEMP, the power supply fail alarm PSFL, the glow discharge unstable alarm GDU, the cooling water flow low alarm CWFL, the cooling water temperature high alarm CWTEMP, the gas pressure low alarm GASPR, the valve air low alarm VAL, assignable alarms 1 and 2, and the sound alarm SNDALT. The sound alarm SNDALT is provided by a device 484 which produces an audible alarm instead of a light indicator. For example, such device 484 can comprise a buzzer, horn, or the like. Circuits 476, 478, 480, and 482 activate the operator control indicators for hold, start, alarm acknowledge, mode advance, the up arrow, the down arrow, numerals 1 through 8, and the automatic and manual switches.

Figure 13:
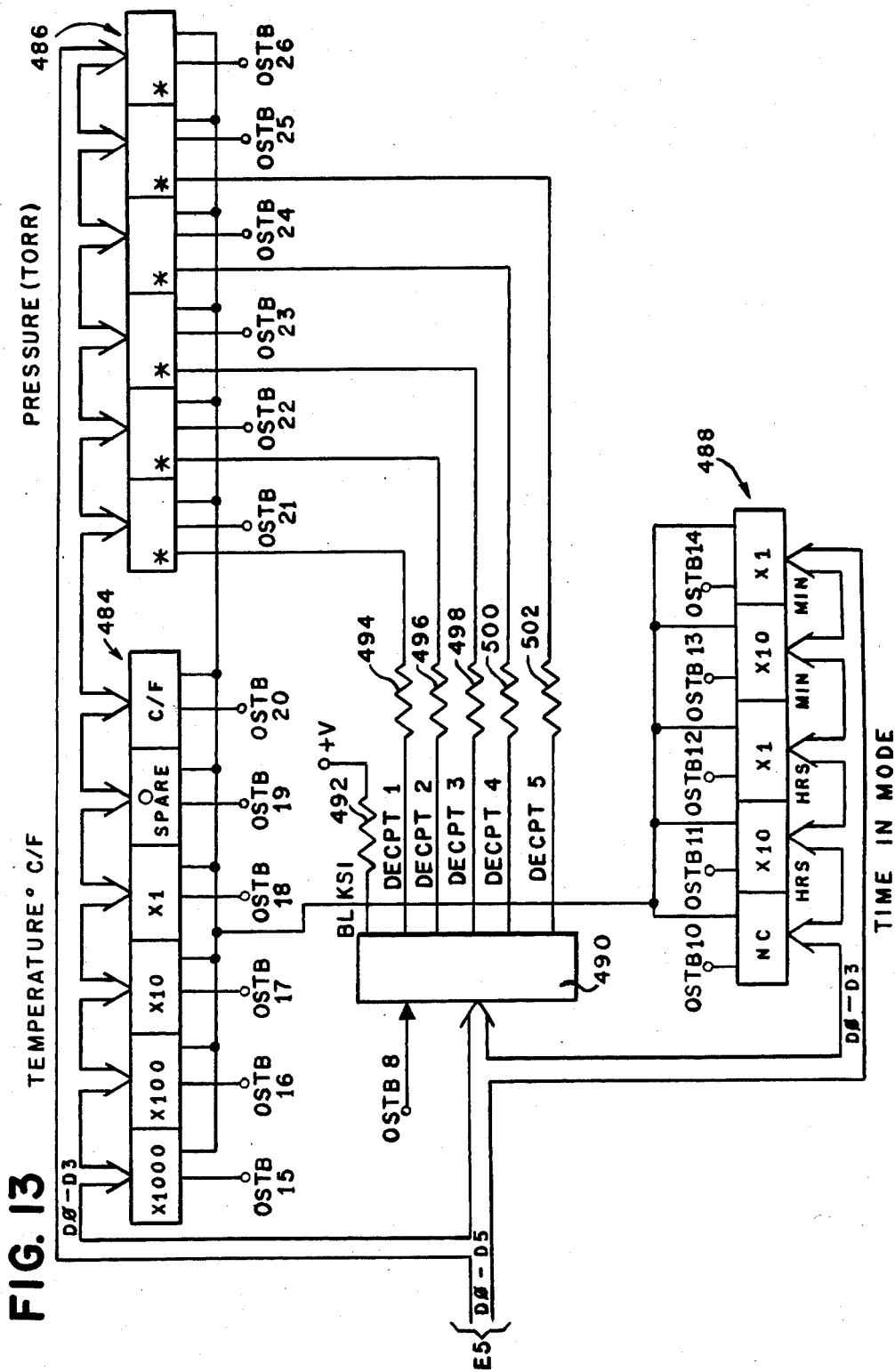
FIG. 13 is a detailed electrical schematic view of a plurality of display drivers as illustrated in FIG. 8 and an output circuit as illustrated in FIG. 7 which are utilized to drive the control displays as illustrated in FIG. 4.

An output display unit for controlling the process parameter displays illustrated in FIG. 2 will now be more fully explained with reference to FIG. 13. The display unit comprises a temperature display 484 comprised of six 7-segment display devices, a pressure display 486 comprised of six 7-segment display devices, and a time in mode display 488 comprised of five 7-segment display devices.

Figure 8:
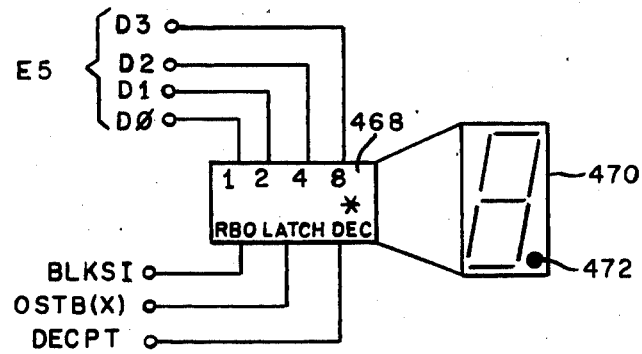
FIG. 8 is a detailed electrical schematic view of one of the common display driver circuits for the operator panel illustrated in FIG. 2.

The 7-segment display device that is used in all three displays 484, 486 and 488 is shown in more detail in FIG. 8 where each device 468 has four inputs, 1, 2, 4, and 8 that receive a digital word input from the outport E5, via data lines D0-D3. Further, each device 468 has a blanking input RBO connected to a common blanking signal BLKSI, a latch input LATCH connected to one of the strobe signals OSTB(x), and a decimal point input DEC connected to a decimal point signal DECPT. The device 468 is adapted to operate a 7-segment display 470 by lighting up individual segments of the display to form different numerals and letters. Further, device 468 is operable to light up a decimal point 472 on the display in response to the DECPT signal. In operation, each display device 468 receives a four bit digital word from the output port E5 which is latched into the device by the output strobe signal OSTB(x). The device decodes the latched digital word into one of the combinations that the display segments are able to form. The blanking signal BLKSI is used to blank the entire display and thus clear the latched word from the device 468. The decimal point signal DECPT provides an indication when the decimal point 472 should be activated when the device is used in an array.

Returning now to FIG. 13, the six devices of the temperature display 484 are connected in parallel to the output data lines D0-D3 of the output port E5. The display 484 further has all RBO inputs commonly connected to the blanking signal BLKSI. Output strobes OSTB15-OSTB20 are used to latch a×g into the display 484 thousands digit, a x hundreds digit, a x tens digit, a x units digit and an indication of whether the temperature display is reading in degrees Centigrade or Farenheit respectively.

The pressure display 486 is similarly connected with all RBO inputs connected to the common blanking signal BLKSI and all data inputs connected in parallel to output data lines D0-D3 of the output port E5. Output strobes OSTB21-OSTB26 are used to latch digits into the display devices to form a pressure indication. Additionally, since the pressure indication ranges over a large range, five decimal point signals DECPT1-DECPT5 are connected to the decimal point inputs of the first five devices via resistors 494, 496, 498, 500 and 502 respectively. In this manner, the pressure display 486 can vary its range by loading in digits corresponding to the actual pressure and then by setting one of the decimal points to indicate the magnitude of the pressure displayed.

The time in mode display 488 is connected similarly with its RBO inputs connected to the common blanking signal BLKSI and its data intputs connected in parallel to the data lines D0-D3 of the input port E5. Output strobes OSTB10-OSTB14 are used to latch digits corresponding to the x tens and x units digits for hours and the x tens and x units digits for minutes respectively.

An output driver circuit 490 identical with that described in FIG. 7 is used to generate the blanking signal BLKSI and decimal point signals DECPT1-DECPT5. The blanking signal BLKSI is generated by connecting one of the outputs of the output driver circuit 490 through a pull-up resistor 492 to a source of logic voltage +V. When the particular output bit of the output driver 490 is set low, the voltage at that point makes a transition from high to low, thereby blanking the entire three displays 484, 486 and 488. A six bit digital word determining which of the decimal point signals is set and whether the blanking signal is active is input to the output driver 490 via data lines D0-D5 of the output port E5. The output strobe signal OSTB8 is used to strobe the digital word into the latch of the output driver 490.

The output circuitry used to control the pump and valves of the furnace, the indicators for the system flow diagram, the stepping motor windings of the proportional valve V2, and the power supply will now be more fully described with reference to FIGS. 14, 15 and 16. In FIG. 16 there is illustrated a plurality of combinational control circuits 552, 554, 556, 558, 560, and 562. These combinational circuits generate the relay activation signals (FIG. 3) from their outputs necessary to activate the devices. Specifically signals are generated to the pump relay RLYP1, to the roughing valve rely RLYV1, to the proportional valve RLYV2, to the input air valve RLYV3, to the process gas valve RLYV4, and to the cooling gas valve RLYV5 respectively. Each combinational circuit is responsive to an input driver signal DRV1-DRV6 respectively, which are digital single-bit signals indicating by their state whether the particular relay should be energized or deactivated.

Additionally, each combinational circuit receives four input signals via input lines 574, 576, 578, and 580. The input signals on lines 574 and 580 are the automatic signal AUTO and the manual signal MANUAL respectively. These signals are generated from the operator controlled selector switch as will be more fully described hereinafter. The signals on input lines 576 and 578 are the manual check signal MANCHK and the signal AUTO MANCHK respectively. The AUTO MANCHK signal is a logical combination of the AUTO signal and the inverse of the MANCHK signal as will be more fully explained hereinafter. These four signals are digital in nature and by their states provide indications of conditions to further control the generation of the relay output signals RLYP1, RLYV1-RLYV5.

All five input signals of each combinational circuit are further used by the circuits to light the system flow indicators (FIG. 3) such that a visual indication of the state of the particular relay and therefore the system is provided to the operator. The operator has an additional input to the combinational circuits via the pushbutton switches associated with each system flow indicator. Setting or unsetting the switches in the system flow diagram corresponding to a particular relay wil cause the circuits to generate the relay activation signals under certain conditions.

The generation of the driver signals DRV1-DRV6 is performed by output driver circuit 544 which is identical in composition to output driver circuit 450 (FIG. 7). The output driver circuit 544 receives a six-bit digital word from the output data lines D0-D5 of the output port E5 and strobe the information into the latch of its output drivers with strobe signals OSTB26. The drive signals DRV1-DRV6 therefore are generated automatically from the micro processor controller 30 to control the relays under system program control.

Driver signals DRV11, DRV12 of output driver circuit 546 are connected to the cathode terminals of light emitting diodes (LED) 576,574 respectively. The anodes of the light emitting diodes 576, 574 are connected to a source of positive voltage +V. When the driver signal DRV11 makes a transition to a low state, it sinks current from the source +V through the LED 576 to light the device. Similarly, when the driver signal DRV12 is active or in a low state, light emitting diode 574 lights. The LED 576 is an indication in the system flow diagram (FIG. 2) that the chamber power is on an LED 574 provides a visual indication in the system flow diagram that a glow discharge has been established in the chamber.

The output circuits 548 and 550, again identical with the output driver circuit 450 in FIG. 7, generate the digital output signals SMW1-SMW4, CPORT and PSINTL. The signals SMW1-SMW4 are the logic state signals energizing and deactivating the windings of the stepper motor and controlling the opening of the proportional valve V2 (FIG. 2). The signal CPORT is a clamp on the power supply to lower the output current and voltage of the device to zero until it is released. Similarly, the power supply interlock signal PSINTL opens the circuit between the power supply and the furnace to shut down power during failure and other non-powered modes. The output driver circuits 548 and 550 receive the digital words to set the corresponding bit signals from the output data lines D0–D5 of output port E5. The six-bit digital data words are strobed into the output devices by OSTB28 and OSTB29 respectively.

Figure 10:
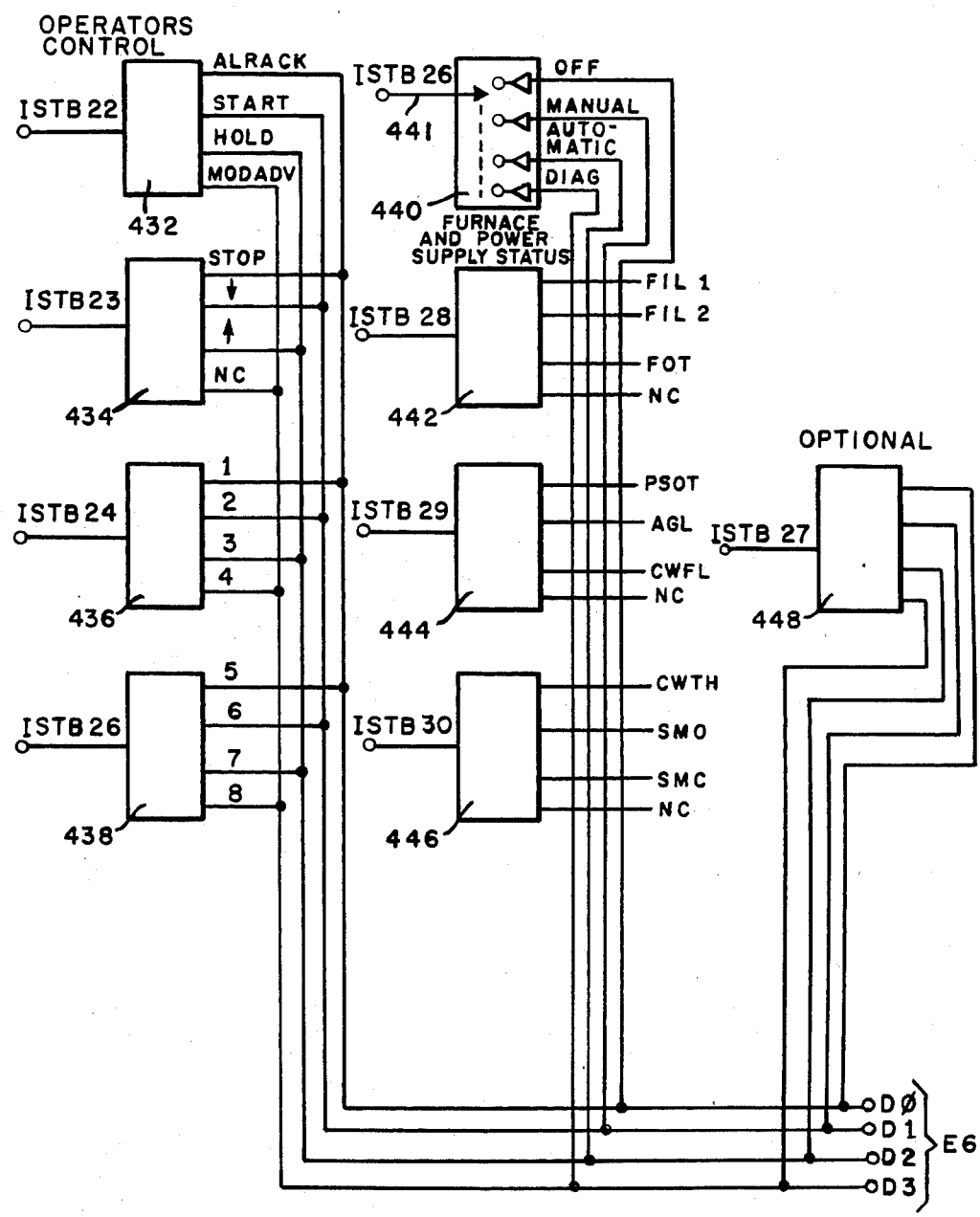
FIG. 10 is a detailed electrical schematic view illustrating a plurality of input circuits illustrated in FIG. 6 which are utilized to input the furnace and power supply status inputs, the operator control inputs, and optional inputs of the operator panel as illustrated in FIG. 2.
Figure 14:
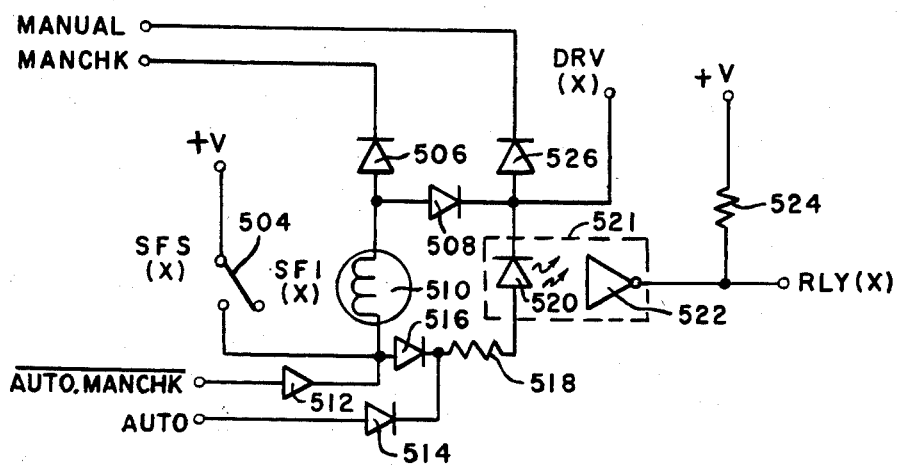
FIG. 14 is a detailed electrical schematic view of a combination control circuit.
Figure 15:
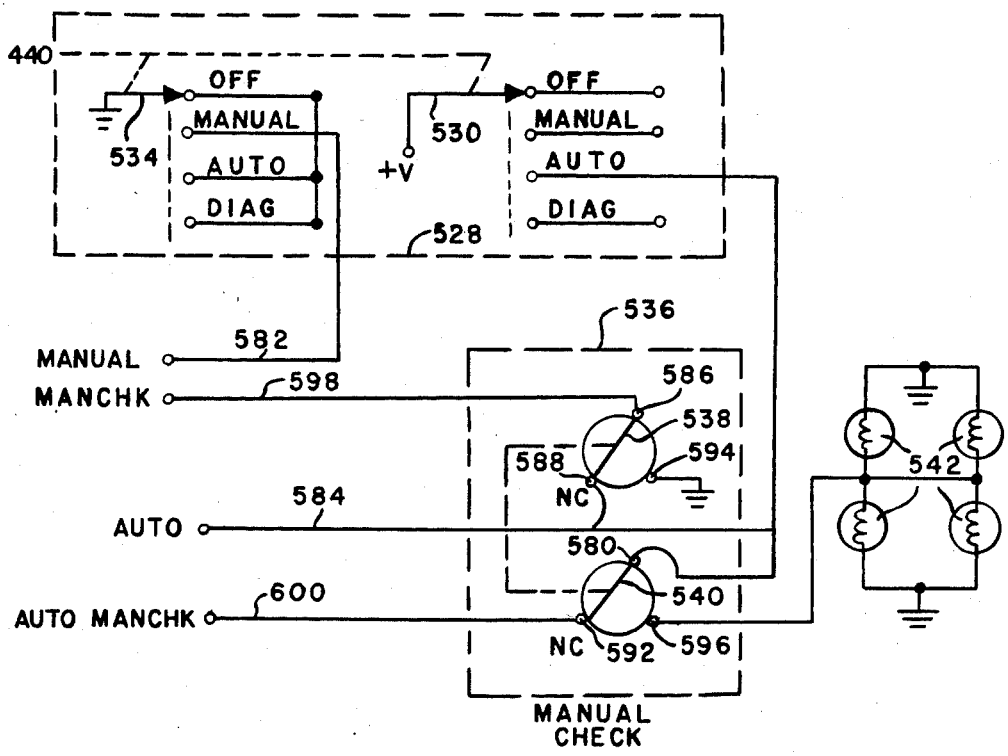
FIG. 15 is a detailed electrical schematic view of part of the operator selector switch and the manual check switch for the operator control panel illustrated in FIG. 2.
Figure 16:
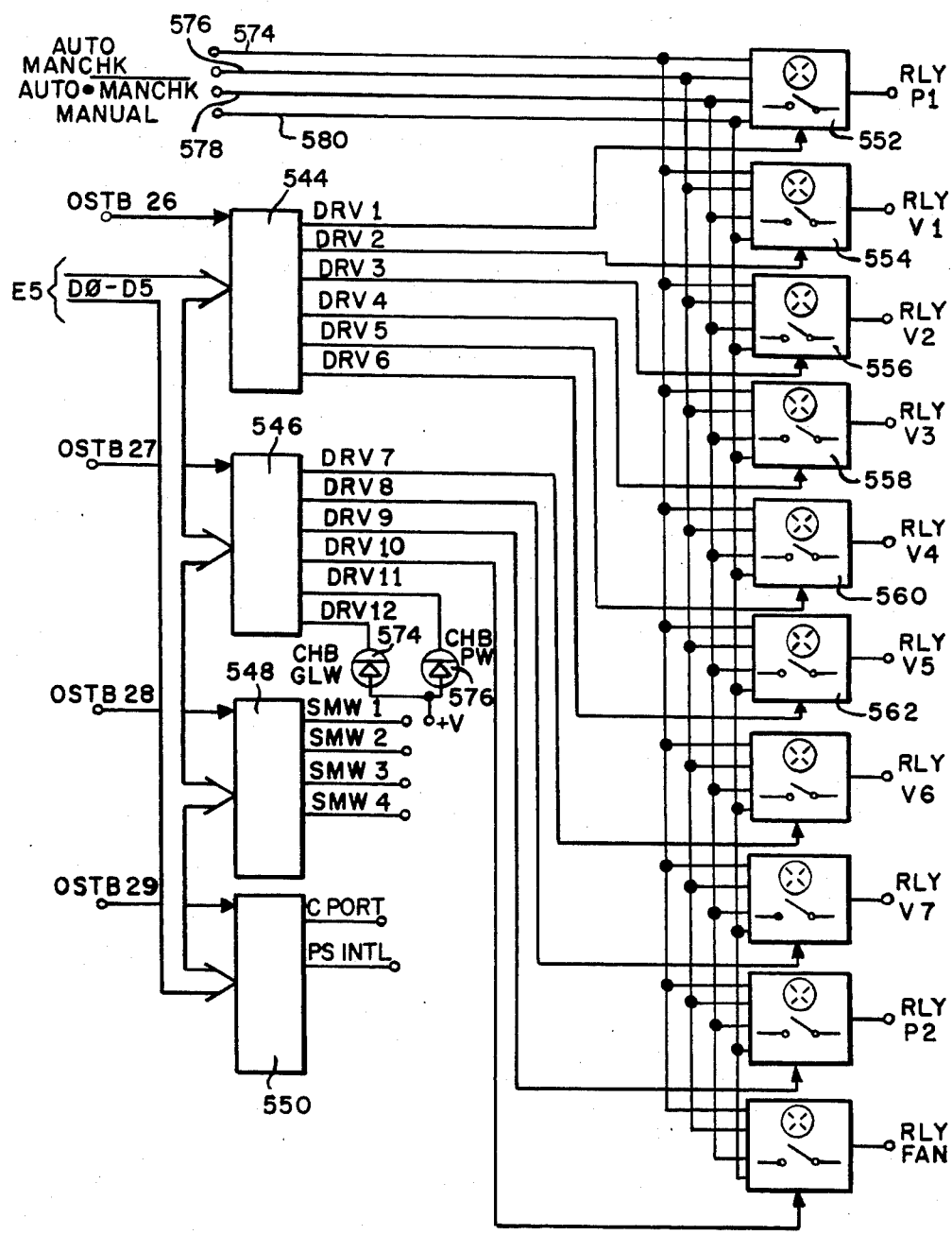
FIG. 16 is a detailed electrical schematic view of a plurality of output driver circuits illustrated in FIG. 7 and several of the combinational control circuits illustrated in FIG. 14 which are utilized to drive the system flow indicators, the relay modules, the stepper motor windings and the power supply control inputs as illustrated in FIG. 4.

The generation of the relay signals RLY(x) and the energization of the system flow indicators SFI(x) will be now more fully explained with respect to FIGS. 14 and 15. In FIG. 15 the operator selector switch is illustrated as those components within dotted box 528. Two additional poles of the switch are illustrated as connected to the pole previously described for circuit 440 in FIG. 10. Each pole has a wiper 534 and 530 respectively which when the switch is rotated will connect the wiper with the off, manual, automatic, or diagnostic terminals respectively. The wiper 534 is grounded while the wiper 530 is connected to a source of logic voltage +V. Therefore, when the operator selector switch is rotated to the manual position, the conductor 582 generates the manual signal MANUAL as a ground reference via wiper 534 and when the operator selector switch is rotated to the automatic position the conductor 584 generates the automatic signal AUTO as a logic voltage +V via wiper 530.

The manual check switch shown schematically as 536 is a double pole double throw switch having switch blades 53B and 540 connecting terminal 586 with normally closed terminal 588 and terminal 590 with normally closed terminal 592 respectively. A normally open terminal 594 on the first throw is grounded while a normally open terminal 596 on the second throw is connected commonly to one terminal of four indicators lights 542 whose other terminals are grounded.

Normally, when the manual check switch 536 is not set and the selector 528 is in an automatic position, the AUTO MANCHK signal is generated via conductor 600 through the normally closed terminal 592, blade 540, terminal 580 and wiper 530 as a positive voltage +V. Since the indicator lights 542 are not connected, they are non-activated by this condition. Further, since terminal 588 connected through blade 538 and terminal 586 to conductor 598 is open, there is no MANCHK signal generated on conductor 598. The Automatic signal in this state is generated directly via conductor 584 and wiper 530 and a source of positive logic voltage +V. However, when the manual check switch is set, and blades 538, 540 move from the normally closed terminals to the normally open terminals, the MANCHK signal is generated as a ground signal from terminal 594 and the AUTO, AUTO MANCHK signals are discontinued. Additionally when the manual check switch 536 is set and the operator selctor switch 52B is in the automatic position, a current path from the source of positive voltage +V through wiper 530, terminal 590, blade 540, and terminal 596 is provided to the indicator lights 542. The indicators 452 will therefore light the manual check switch 536 visually indicating that the switch has been set and the system has been selected for automatic mode.

With respect now to FIG. 14, it will be more fully explained how the MANUAL, MANCHK, AUTO, AUTO MANCHK, SFS(x) and DRV(x) signals are used to control the generation of the RLY(x) and SFI(x) signals. FIG. 14 is a detailed electrical schematic of one of the combinational control circuits shown in FIG. 16 where an output driver 521 is illustrated generating one of the Relay drive signal RLY(x). The output driver 521 comprises an LED 520 optically coupled to an inverter 522 whose output is connected through resistor 524 to a source of logic voltage +V. Energization of the LED activates the inverter 522 to sink current from the resistor 524, thereby generating the low state relay signals RLY(x).

A ground path for the LED 520 is provided through a diode 526 by the signal manual. Another ground path for the LED 520 is provided by the driver signal DRV(x). To complete a circuit and activate the device the anode of the LED 520 is connected through a current limiting resistor 518 to three sources of positive voltage +V. The first source is from the automatic signal AUTO through diode 514. The second source is from the AUTO MANCHK signal via diode 512 and diode 516. The third source is through the normally open system flow switch SFS(x) which has one terminal connected to a source of positive voltage +V and the other terminal connected to the anode of diode 516.

Therefore the relays are activated automatically when the selector switch is in the automatic position and the driver signal DRV(x) from the micro processor controller is low via the serial path through diode 514, resistor 518, LED 520 and the driver circuitry. Additionally, the relays are also actuated when the selector switch is in the manual position and the system flow switch SFS(x) is closed via the serial path through switch 504, diode 516, resistor 518, LED 520, diode 526 and the selector switch ground.

The system flow indicators SFI(x) as represented by indicator 510 is provided with three ground paths at one terminal. The first ground path is through diode 508 and the driver signal DRV(x), the second ground path is provided through diode 508, diode 526 and the manual signal MANUAL, while the third path is provided through the diode 506 and the manual check signal MANCHK. Sources of logic voltage +V are supplied to the other terminal of the indicator 510 through the AUTO MANCHK signal and diode 512 and further through the switch 504.

Therefore, when a relay signal RLY(x) is generated and the system is in an automatic mode and not in a manual check mode, the indicator 510 is activated. This activation is provided by the serial current path from the AUTO MANCHK signal though diode 512, the indicator 510, diode 508, and the driver signal DRV(x). Addtionally, when the system ls in a manual mode and the relay signal RLY(x) is generated by closing the switch 504, a current path is also provided for the indicator 510. The current path is from the source of positive voltage +V through the switch 504, the indicator 510, diode 508, and diode 526 to the grounded manual terminal of the selector switch.

Still further, when the system is in the automatic mode, the indicator 510 can be deactivated by the manual check signal MANCHK to determine what the status of the pump and valves would be if the manual state were to be entered. In operation, the indicator 510 as previously described will be lit when the system is in an automatic mode and the driver signal DRV(x) has been generated. Setting the manual check switch will remove the positive voltage from the anode of diode 512, thereby deactivating the indicator 510. However, if switch 504 is closed the indicator 510 is activated via the serial current path of the switch 504, indicator 510 and diode 506. The switches may then be programmed to any desired status before entering the manual state.

The control of the system by the microprocessor will now be more fully explained with respect to FIGS. 17, 18 and 19 where general system flow diagrams of the software used to command the system process controller 12 are illustrated. The software is stored in a programmable read only memory (ROM) of the process controller 12 and contains a series of commands which inputs the data from the operator control panel 36, the ion nitriding furnace, pump and valving 10, and the power supply 14; processes this information and then provides control signals to the power supply, pump, valving and furnace, and recorder.

In FIG. 17, the overall system architecture of the program is illustrated where a foreground monitor B2 and a background monitor B4 are shown. The software generally maintains control in the background monitor B4 by cycling through a number of separate task oriented control programs. However, upon a periodic interrupt, the background monitor interrupts processing and will transfer control of the system to the foreground monitor where a plurality of real time programs are executed. The foreground monitor B2 is executed once every interrupt cycle and thereafter program control control returns to the background monitor at the place where the basic program was interrupted. For the illustrated embodiment it is advantageous to generate an interrupt every 10 milliseconds. This separation of tasks into the foreground monitor and the background monitor allows the bulk of the information processing done by the system process controller to be accomplished in the background monitor where such tasks are repetitive and non-time critical. For those tasks which must be executed at a certain repetition rate and those tasks which require a rapid response to an asynchronous event, the foreground montor B2 is used. Specifically, the foreground monitor B2 is used for input/output control of the various operator control panel, furnance, and power supply variables. Another important task is the real time monitoring of arc detection which must be accomplished repetitively at a high rate of speed.

A more detailed flow diagram of the foreground monitor B2 is illustrated in FIG. 18. The foreground monitor is entered in block B6 by the interrupt and its first task is to save the registers for returning to the background monitor routine from which it was entered and the program status word PSW. Next in block B8 the hardware interrupt timer which initiates the cycle is reset to maintain the program on a real time basis. In block B10 the real time clock is updated to provide a real time reference for all other parts of the program.

Thereafter, a group of programs termed the vector programs are called in block B12. The vector programs are a set of routines which are called repetitively at certain points in a one second cycle. The sequence of their calling is illustrated in the offset to block B12 where in block B14 the routine TIMERS is called, in block B16 the routine PMPVLV is called, in Block B18 the routine FLOCHG is called, in block B20 the routine OUTDRV is called, in block B22 the routine TMBIN is called, in block B24 the routine TMPRES is called, and in block B28 the routine DADRIVE is called.

Figures 20, 22:
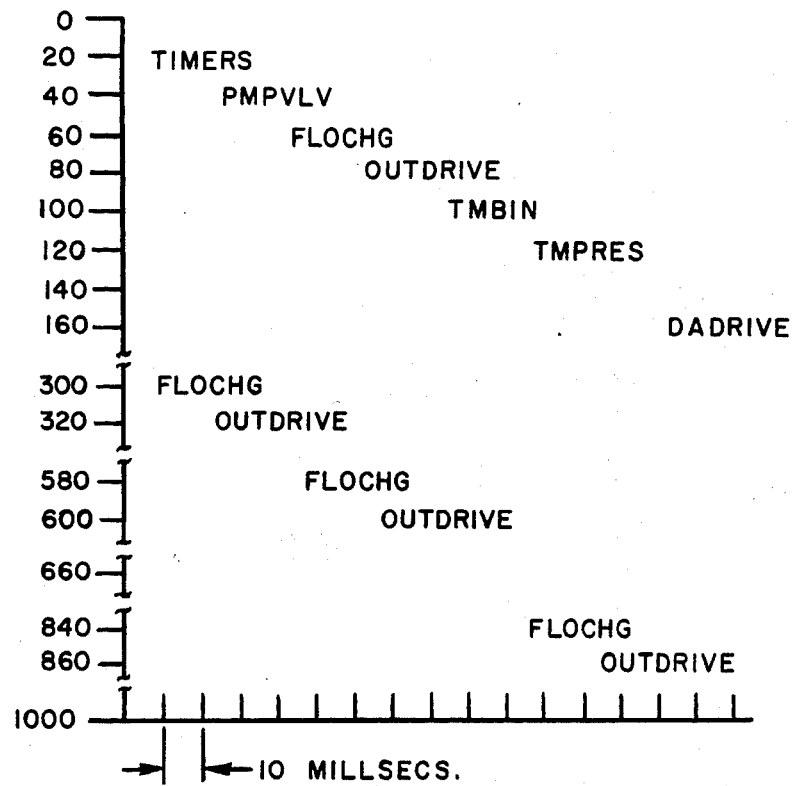
FIG. 20 is a pictorial view of the sequence for calling the Vector Programs illustrated in FIG. 18.
FIG. 22 is a pictorial view of a system condition table illustrating the modes and states for the system illustrated in FIG. 1.

In FIG. 20 the one second cycle time is shown as broken up into twenty milisecond increments on the ordinate axis of the graph. The figure is segmented into the ten milisecond increments at abscissa which the interrupts occur. It is there shown that the vector programs of blocks B14–B28 are called in sequence at twenty milisecond intervals from the start of the cycle to 160 miliseconds where the routine DADRIVE is called. The cycle is completed by repeating three of the routines at other points in the remaining portion of the one second cycle. The routine FLOCHG is repeated at 300, 580 and 840 milliseconds. The routine OUTDRIVE is repeated at 320, 600 and 860 miliseconds and the routine PRMCHG is repeated at 660 miliseconds. The cycle table therefore allows the vector programs to be interleaved and called periodically during the one second cycle without taking too much time per pass through the foreground monitor for each interrupt.

The routine TIMERS called by blocR B14 ms illustrated is called once per second and has the function providing a plurality of count down timers for general purpose use by the control programs in the background monitor. The routine TIMERS receives the value of a time period from a background routine and each pass through the foreground monitor decrements that time period by one second if the particular timer is still active (non zero).

The routine PMPVLV is utilized to control the pump and the valves of the system. The routine receives values for the states of the pump and the valves from other routines in the background monitor and controls whether the devices are active or inactive.

The routine FLOCHG is used to control the stepper motor which opens and closes the proportional valve V2. The routine receives a variable from another routine in the background monitor to determine whether the stepper motor should be incremented (opened or closed). The routine is called (four times a second) and increments or decrements the stepper motor one step depending upon the variable. The program in the background monitor which controls the stepper motor can request that tbe routine FLOCHG increment the stepper motor open or closed or have it remain the same.

The routine OUTDRV is used to output data to the seven-segment displays on the controller front panel. The routine takes consecutive bytes of RAM beginning at an address and displays the BCD values found in the lower four bits of each word in a display. These values are placed in the seven-segment displays by the routine.

The routine THMBIN is called to read the thumbwheel swiches. The routine THMBIN accesses the front panel thumbwheels once per second. If seven consecutive examinations are identical, then the reading is considered valid. Otherwise, the data is ignored and the scan count reset. After all the thumbwheels have been scanned, all the valid thumbwheel data is placed in a table beginning with a storage address location which can thereafter be accessed by other routines in the background monitor.

The routine TMPRES is called once per second by the vector program block B12 and is used to convert the analog variables PR1, PR2 and PTEMP into digital numbers which can be used by other routines in the background monitor. The routine sets up the channel address of each variable for the analog digital conversion and the gain multiplier needed by the analog input control 306 (FIG. 4). Thereafter, the conversion request command is given by the routine and the cycle repeated for the next two variables.

The routine DADRIVE in block B28 is called once avery second and is used as a general conversion routine to output digital parameters and convert them to analog outputs. This routine drives the analog channels for the variables RCDR, IDRV, VDRV.

After the particular vector program in the one second interval is executed, the foreground monitor returns to the program path from which it is called every ten miliseconds. The next program in the program path is a routine SWHIN, illustrated in block B30. This routine contains a by-pass switch which allows it to be called every other pass through the foreground monitor at twenty milisecond intervals. The routine SWHIN looks at all front panel switches, and the system interlocks every twenty miliseconds. If seven consecutive scans are identical, then the switch actuation is considered valid. At the end of the switch scan, all valid switch values are placed in a storage table for later access by the routines of the background monitor.

Thereafter, the foreground monitor calls the routine KIKDWN in block B32. This routine is used to kick down the power supply drive to zero in the presence of an arc. The power supply is clamped to a zero value via the control variable CPORT for a predetermined delay before it is released. The detection of an arc by the routine KIKDWN and its action will be more fully explained hereinafter.

After the foreground monitor has made one pass through the particular routines that it will call during its interrupt interval, the program sequences to block B34 where the registers and program status word PSW are restored. Thereafter, in block B36 the interrupt is enabled to permit the next calling of the foreground monitor. The program then transfers control of the sequence to the background monitor at the place where the background monitor was interrupted.

Figure 21:
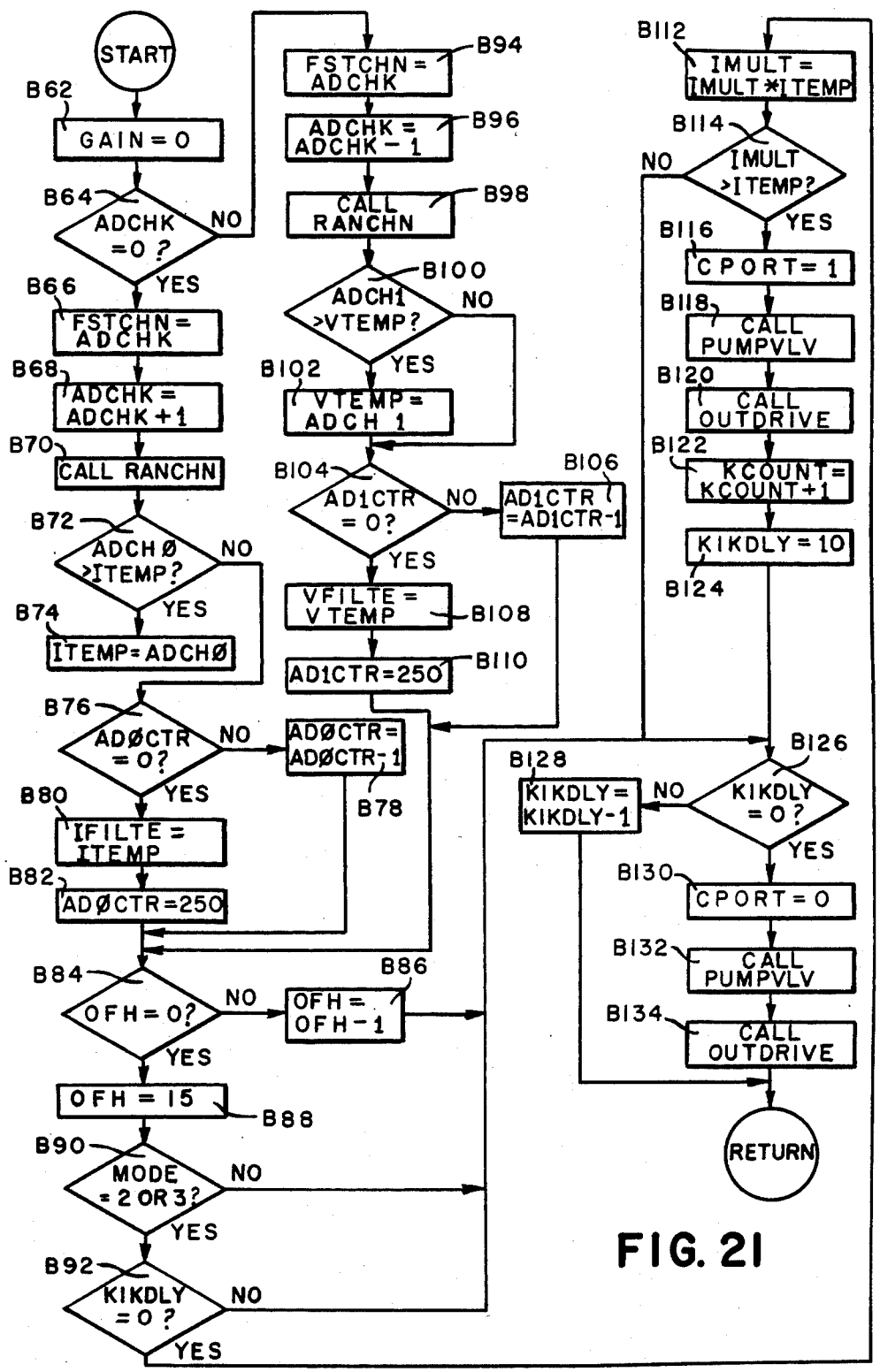
FIG. 21 is a detailed flow chart of the major interrupt routine KIKDWN illustrated in FIG. 18.

The arc suppression means including the routine KIKDWN will now be more fully described if attention will now be directed to FIG. 21. In that Figure, the routine begins in block B62 where the gain of the A/D converter is set equal to zero. Therafter in block B64, the variable ADCHK for determining which channel to read of the A/D converter is tested. If the variable ADCHK is zero then the analog channel to be read is the one corresponding to the current measurement IDISCH. This path is continued in block B66 where the variable FSTCHN is replaced by the value of ADCHK. The value of ADCHK is thereafter incremented in block B68 to provide an alternating channel sequence between the voltage and current readings. In block B70 the subroutine RANCHN reads the channel pointed to by the variable (in the present case channel 0). The value that the A/D converter generates from channel 0 is the instantenous value of the current discharge IDISCH and is provided with the label ADCH0 in block B72. Additionally in that block that value is tested to determine whether it is greater than a temporary current value ITEMP.

If the value for ADCH0 is greater than ITEMP, then the temporary value is replaced by the instantaneous value in block B74. Otherwise the program branches around block B74 to block B76. This is a method of peak detecting the instantenous value of the current discharge variable IDISCH of the power supply. Next in block B76 the channel zero counter AD0CTR is tested to determine whether it is equal to zero. If it is not, it is decremented in block B78 before continuing to block B84. If the counter is zero, then a filtered value for the current FILTE is set equal to the intermediate current ITEMP in block B80. Next, the channel zero counter is reset to 250 scans in block B82.

The path just described for the routine reads the immediate or instantenous value of the current discharge of the power supply and provides a peak detecting means over 250 scans to determine a filtered value. It additionally sets a switch which alternates the next pass of the routine to a similar path for reading and filtering the voltage discharge VDISCH.

Thus when the next iteration of the program reaches block B64, the switch will have set the variable ADCHK to one and the negative path to block B94 is taken. Again the channel director FSTCHN is set equal to the variable ADCHK to indicate that the analog channel 1 should be read. Next in block B96 the switch ADCHK is decremented to return it to point to channel 1. After resetting the switch, the program calls the subroutine RANCHN in block B98 to read into memory the instantenous value of the voltage discharge variable VDISCH from channel 1. This value is given the variable name ADCH1.

In Block B100, the instantaneous value of the voltage ADCH1 is compared against a temporary storage value VTEMP. If the instantaneous value is greater than the temporary value then the temporary value is replaced by that instantenous value in block B 102, otherwise block B102 is circumvented. Thereafter, the channel 1 scan counter AD1CTR is tested to determine whether it is equal to zero. If it is not, the counter is decremented in block B106 and the program thereafter transfers control to block B84. However, if the counter is equal to zero, then a filtered value for the voltage VFILTE is replaced by the temporary value VTEMP in block B108 and the channel 1 counter reset to 250 scans in block B10.

The path from block B94 to block B110 performs a similar function for the voltage as the other filtering section did for the current. 250 scans are used to peak detect a voltage before producing the filtered value in block B108. Additionally, in this part of the routine the switch is reset back to channel 0 such that the routine alternates reading the two channels.

Next the program tests the constant OFH to determine whether the incipient arc test should be accomplished. If the clock OFH is not zero, then it is decremented in block B86 and control of the sequence transfer to block B126. However, if the variable OFH is zero then in block B88 it is reset to 15 and the path for accomplishing an arc detection test is taken. Therefore, since the routine KIKDWN is executed every 10 miliseconds the impedance ratio of the workpiece is tested every 150 milliseconds.

In block B90 the program subsequently tests to determine whether the mode of the system is warmup or processing. If the system is not in either of these modes, there is no reason to test the impedance as a kickdown or arc suppression action would be superfulous and thus negative answer to this test will transfer control to block B126 directly. If however it is currently time for a test and the system is in a warmup or processing mode then block B92 is entered. In this block the kickdown delay clock variable KIKDLY is tested. If this variable is not zero then a kickdown is in progress and an impedance test cannot be accomplished. The program finding a negative result in block B92 is transferred to block B126. However, if there is no kickdown in process, then in block B12 the immediate or instantaneous current value ITEMP is multiplied by the current multiplier IMULT. Thereafter in block B114, IMULT which is the product determined in block B112 is tested against the value for the voltage VTEMP. This step determines whether the immediate voltage current ratio or the impedance has decreased by greater than the allowed percentage of IDROP since the last test.

If it has, then an affirmative branch from block B114 indicates that an arc is in its incipiency. Therefore, an arc suppression must be effected by block B116 where the power supply clamp CPORT is set equal to one. Further in block B118 the routine that sets the digital outputs and valve sequence PUMPVLV is called to immediately output the CPORT signal during kickdowns. This routine in combination with the OUTDRIVE routine called in block B120 will provide a clamp on the power supply until the delay is completed.

Next the number of arcs that occur in a predetermined period KCOUNT is increased by 1 in block B122 to keep track of the present arcing condition. Next the kickdown delay counter KIKDLY is set equal to 10 passes through the program or approximately 100 milliseconds in block B124. The program next tests the kickdown delay to determine whether it is zero in block B126. If it not then the kickdown delay KIKDLY is decreased by 1 in block B128. When the delay has expired, the affirmative branch of block B126 will be taken to block B130. The power supply clamp CPORT in that block is then released by setting it equal to zero and the pump-valve sequence returned to its active status by calling block B132 and block B134. The routine thereafter returns to the point in the foreground monitor from which it is called.

The background monitor will now be more fully described with respect to FIG. 19, where upon an initial power up the system, the background monitor program is entered in block B38. In block B38, B40, B42, B44, B46, there is performed the initialization of the system. In block B38 the random access memory is initialized, in block B40 the control ports of the microprocessor are initialized, in block B42 the initial pressure ranges are initialized, in block B44 the pump and valve values are initialized, and in block B46 all other system constants are initialized. This path through blocks B38-B46 is only taken once upon power up conditions and does not form part of the major program loop of the background monitor. The background monitor consists primarily of a control program loop comprising blocks B48-B60 which are called in sequence and then repeated during the remaining ten portions of the interrupt cycle not used by the foreground monitor.

The first routine called in the background monitor in block B48 is TWCNV. This routine is used to convert the values input from the thumbwheel switches from their BCD values to usable binary numbers which can be used by the other control programs of the background monitor. In this manner the routine forms binary values for the temperature, pressure, process time, ramp rate, current limit and program code.

The routine following the thumbwheel conversion is labeled MODEXC or the mode executive which is executed in block 650. The mode executive determines from the states and the modes of the system which sequence of operations is next to be followed. The mode executive has inputs from the operator, including the start, hold, manual and automatic inputs. The mode executive further receives input parameters indicating the actual temperature and pressure of the system and alarm status. The mode executive routine MODEX will be more fully explained with respect to FIGS. 23, 24, and 25 hereinafter.

Subsequently, the background monitor sequences to a routine ALMCHK in block B52 which is termed alarm check. The alarm check routine monitors all of the alarm conditions and places an appropriate code for each condition in one of the positions of an alarm status array. Each position in the array corresponds to one of the alarms that can be indicated on the operator panel 39. Codes for the alarms can include an indication that the alarm is to be off, the alarm shown as flashing, or the alarm shown as steady. A code indicating that an alarm is to be flashing can be given when a alarm condition is not cleared or acknowledged or another code can be given when the alarm is to be flashing that indicates that the alarm condition is clear but not acknowledged. The code indicating that the alarm is on steady is given when the alarm is acknowledged but not clear.

A second array is used to store alarms which have occurred but which have not been acknowledged by the operator. When new alarms occur, they are placed in this array in a first-in-first-out stack. When a cycle of the alarm acknowledge switch is detected, the first alarm in the array is removed from the array. The code in the alarm status array is then changed accordingly.

Next the routine FRTDSP which runs the front panel display is called in block B54. This routine drives the alarm status lights and other indicators and further provides a means for causing the alarm indicators to flash if the correct codes have been stored in the alarm status array.

Thereafter, the pump-valve control routine PVCONT is called in block B56. The pump valve control routine regulates the sequence of the opening and closings of the valves and the activation of the pump of the system. Further, the routine controls the stepper motor of the proportional control valve V2 to regulate the pressure in the system. The system pressure is regulated as a function of temperature in the warm up mode utilizing a pressure profile. This routine will be more fully described hereinafter with respect to FIGS. 25-30.

Next in the sequence block B58 is called to provide the routine ALGCHK. The analog check routine, ALGCHK, is used to filter the temperature mnd pressure values input from the TMPRES routine of the foreground monitor and display the actual temperature and pressure in real time on the front panel.

The last program in the control loop is PSCNTL called in block B60. This routine which is termed the power supply control routine, determines the drive signals IDRV, VDRV for the power supply 14 (FIG. 1) to regulate the temperature of the work piece during warm up and processing. The power supply control program PSCNTL, as will be more fully explained hereinafter, is generally a proportional-integral-derivative controller which regulates the current applied to the work piece based on arcing activity, the maximum temperature increase per unit time that can be sustained by the work piece, a current limit, and the processing temperature. The power supply control routine PSCNTL will be more fully explained with reference to FIGS. 31-47.

The mode executive program MODEX will now be more fully explained with reference to FIGS. 22, 23, 24 and 25. In FIG. 22, a system condition table is illustrated where the five modes and five states of the system are listed. Each mode and each state correspond to a mode and state code 1-5. Generally, the mode executive MODEX routine if in the automatic state will cycle the system through the modes 0-5 in sequence to provide a convenient automatic processing. When in the manual state, the system may change the status of the pump and valves to produce a convenient manual operation. The system may also be put in a hold state which stops processing regardless of the previous state or mode in the system. A manual-entrant state is also provided which is entered through the hold state to permit manual operation of the system prior to returning to the previous automatic state. The states of the power supply shut down and the system shut down are entered in response to an alarm or abnormal conditions.

Figure 23:
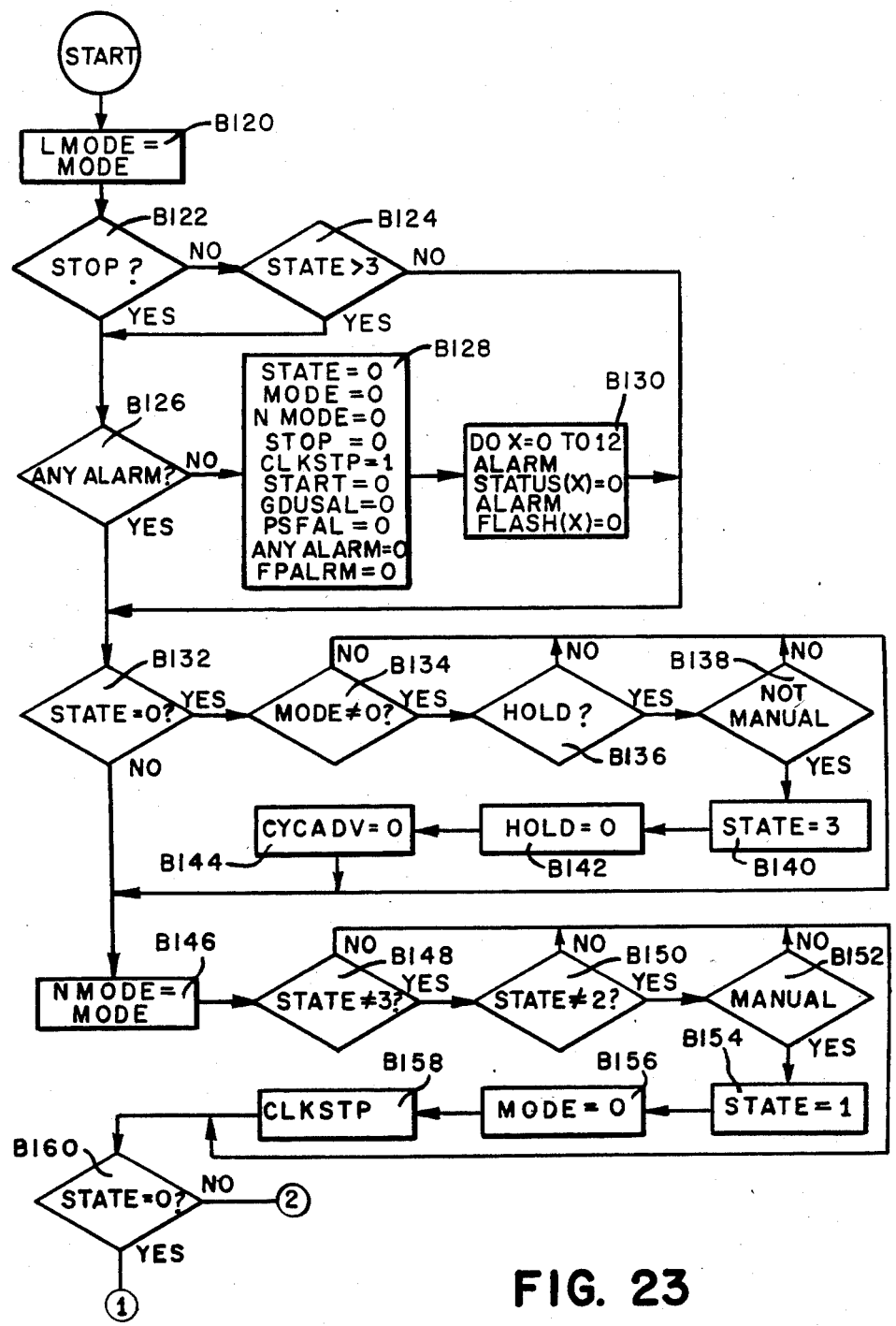
FIGS. 23 and 24 are detailed system flow charts for the routine MODEXC illustrated in FIG. 19.

The MODEX routine begins in FIG. 23 at block 120 where the variable LMODE is set equal to the variable MODE. LMODE is the variable indicating the previous or last mode of the system while MODE is the present mode. The routine then enters three decision blocks, B122, B124 and B126 to determine whether the stop button has been activated or the system is in a state greater than three and no alarm has been set. If these three conditions are present, then the system will execute blocks B128 and B130, otherwise the sequence will continue to block B132. Block B128 initializes the variables: STATE, MODE, NMODE, STOP, START, GDUSAL, PSFAL, FPALRM, ANYALARM and sets the variable CLKSTP equal to one to stop the time in mode clock. Further, in block B130, the alarm status array is reset along with the condition array. Thus for a stop condition or in a power supply shut down state or a system shut down state without any alarm, all these variables are initialized.

Next a series of tests in block B132, B134, B136 and B138 are executed to determine whether the system is in an automatic state, the mode is not equal to zero, the hold switch has been activated, and the selector is not in the manual position. If all these test conditions are present, the program executes block B140, B142, and B144 in sequence, otherwise it continues to block B146 immediately. The tests performed indicate that the system is in an automatic state and the hold switch has been depressed, indicating that the operator desires to transfer the system from an automatic state to a hold state. Since the system is active, i.e., not in an idle mode, and the selector switch is not in a manual position, then the desired state transfer should occur. Therefore, in block B140 the state is transferred to state 3 or the hold state, in block B142 the hold switch is cleared, and in block B144 the variable CYCADV is set equal to zero to initialize the cycle advance counter.

Thereafter, in block B146, the variable NMODE indicative of the next mode is set equal to the variable MODE indicative of the present mode. A series of tests in block B148, B150 and B152 are then executed to determine whether the system is not in the manual/reentrant mode or the hold mode and the selector switch has been set to the manual position. If all these conditions are present, the program executes blocks B154, B156 and B158 in sequence, otherwise the program transfers control to block B160 immediately. The test conditions indicate that the operator has selected the manual state of operation by moving the selector switch to the manual position and the system is in either state 0, 4, or 5 from which the manual state can be entered. Therefore, the program will transfer the system to state 1 or the manual state in block B154, clear the variable MODE to zero or idle in block B156, and stop the clock in block B158 by setting the variable CLKSTP equal to one.

Figure 24:
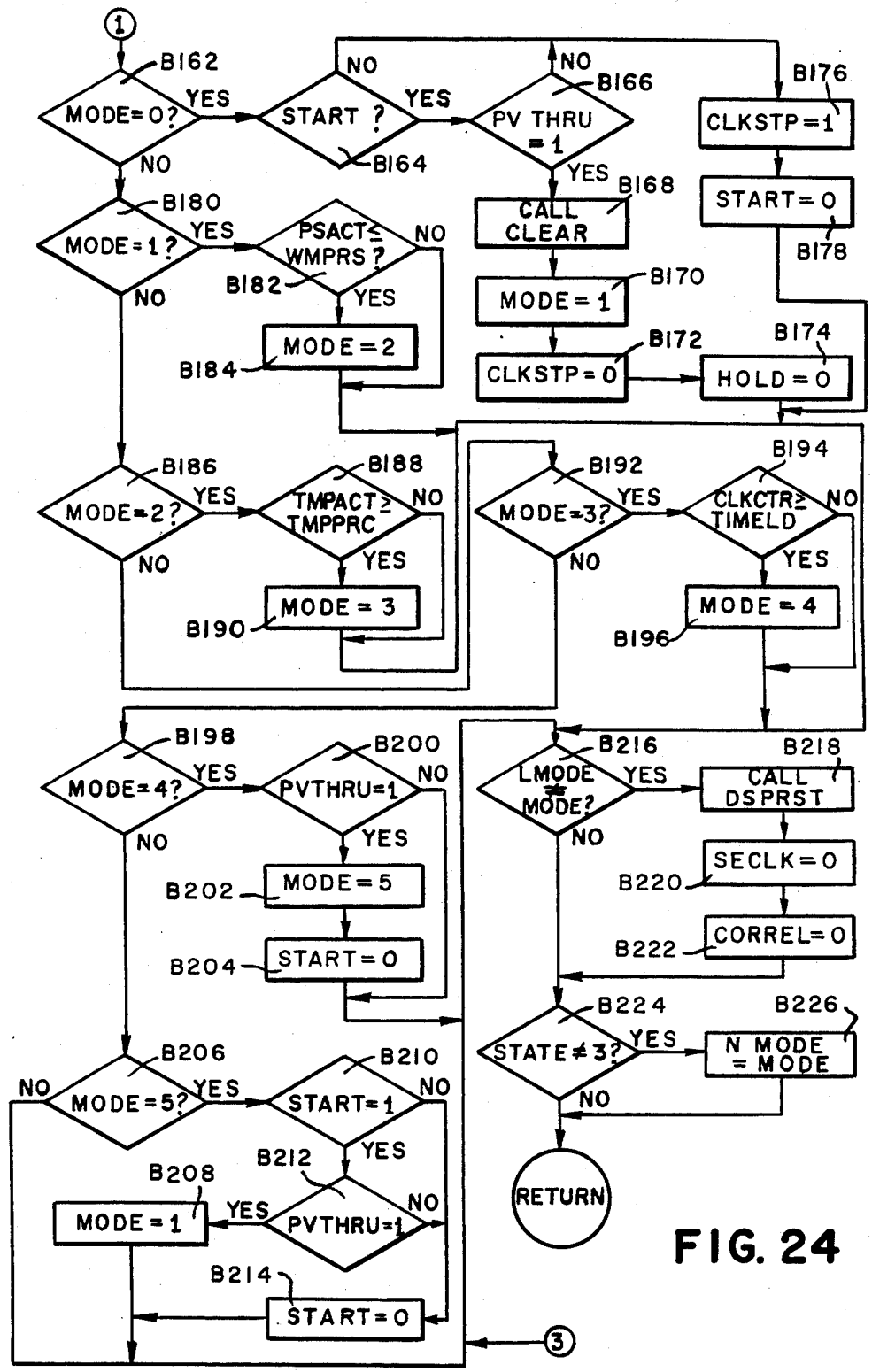
Figure 25:
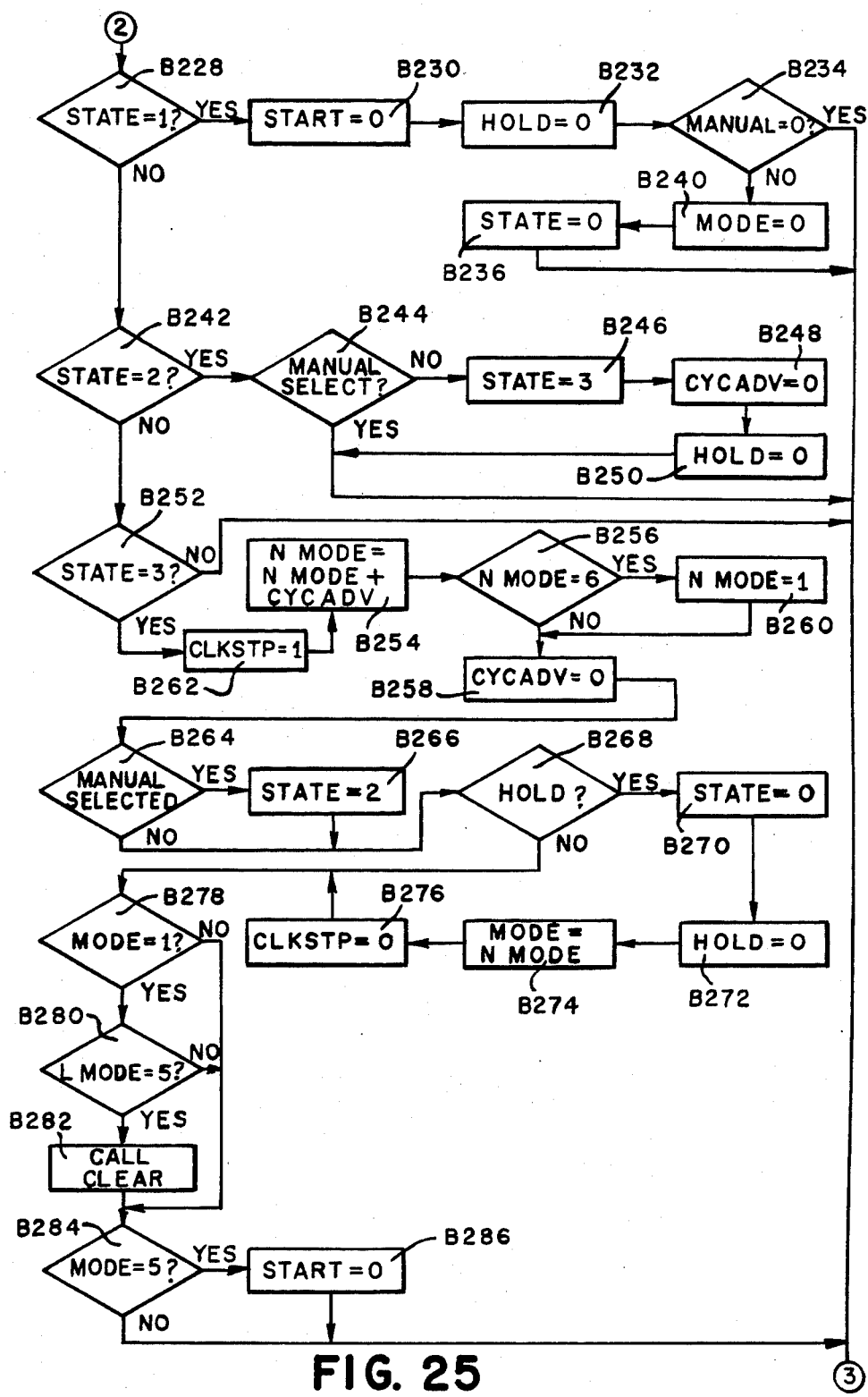
FIGS. 25 and 26 are detailed system flow charts for the routine PVCONT illustrated in FIG. 19.
Figure 25A:
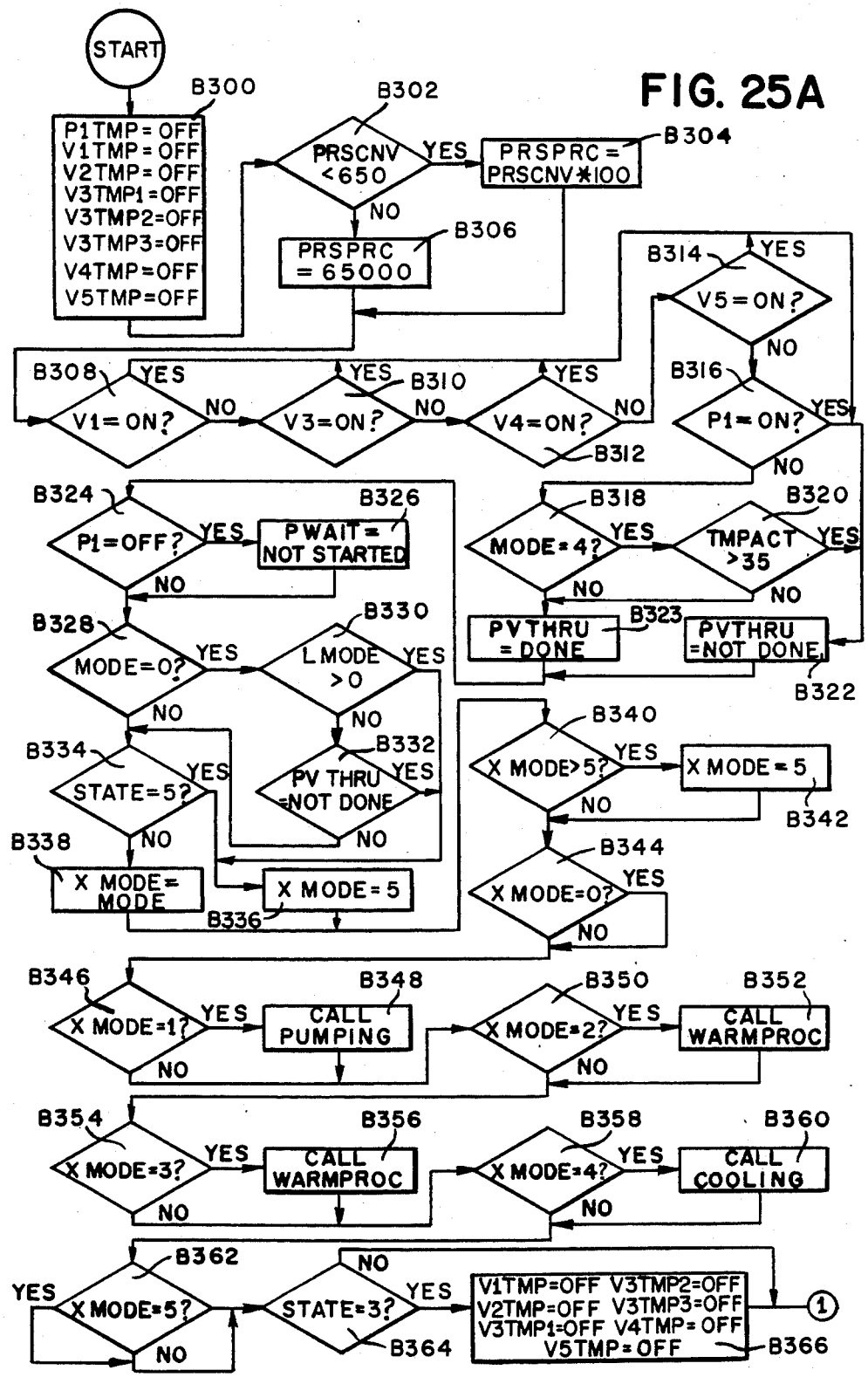

After the sequences that handle the stop, hold and manual commands from the operator, the system enters a state test sequence in block B160 where various conditions and tasks are completed for each of the different states. State zero is tested for in block B160 and the program sequences to block B238 (FIG. 25) if the state is not zero. State one is tested for in that block and if not present, state two is tested for in block B242. If the test in that block is negative, then the program will determine whether the state of the system is equal to three in block B252. The control path of the program if the system is in neither state zero, one, two or three is a return to a common point block B126 (FIG. 24). If however any of the states 0-3 are active, the program will sequence to the particular tasks assigned for completion during those states.

For example, if the affirmative path is executed from block B160 indicating the system is in an automatic state, the program control will be transferred to block B162. When the system is in an automatic state, it will automatically sequence through modes 0-5 depending upon the occurrance of certain conditions. Each mode will cause certain control processes to occur which set parameters and variables for the subsequent modes.

Therefore, in block B162 a test is performed to determine whether the system is in mode 0 or the idle mode. If the test is affirmative, then the program transfers control to block B164 where it is determined whether the start switch has been pressed. If it has not, block B176 and B178 are mxecuted to stop the clock and to clear the start button. If, however, the start button has been pressed transferring control to block B166, a test is performed to determine whether the system variable PVTHRU is equal to zero. This test, as will be more fully explained with respect to the power supply shut down and system shut down states indicates that the pumps and valves have been reset and the furnace cooled from a previous processing cycle. If the previous processing cycle therefore is not through indicated by a negative path from block B156, then the clock is stopped and the start button reset as was previously described with respect to blocks B176 and B178.

If, however, the variable PVTHRU is zero, indicating that a new cycle can occur, then blocks B168, B170, B172 and B174 are called in sequence to initiate a pump down cycle. Block B168 calls the subroutine CLEAR to clear all the system variables, Block B170 sequences the system to mode 1 or the pump down mode, block B172 starts the time in mode clock by clearing the variable CLKSTP to zero, and block B174 clears the hold button. After executing the sequences assigned to mode zero, the program returns to the common point at block B216.

Thereafter, on the next pass through the program, the mode executive will find that the system is still in an automatic state but the mode is now equal to one. Therefore, in block B180, the program path will be transferred to block B182 where the variable PRSACT indicative of the actual pressure in the furnace is compared to the constant WMPRS, indicative of a predetermined set warm up pressure. When the actual pressure PRSACT is greater than the warm up pressure during evacuation of the chamber, the program bypasses the step in Block B184 and returns to the common point B216. Further passes through the program are made during the pump down routine until the roughing pump has lowered the actual pressure in the chamber to less than the warm up pressure. At that time, the test in block B182 will be passed and block B184 executed to transfer the system from MODE 1 to MODE 2 or a warm up mode.

Thereafter, on subsequent passes through the program, block B186 will find that the system is in a warm up mode and transfer control to block B188 where the variable TMPACT indicative of the actual temperature of the work piece is compared to a variable TMPPRC indicative of the predetermined processing temperature as set by the thumbwheel switches on the operator control panel. While in the warm up mode, initially the test in block B188 is failed and program control transferred to the common return point in block B216. On subsequent passes through the program, the test in block B188 is executed until the system has sufficiently heated the workpiece to where it can be processed. At that time, the test is passed by executing the affirmative branch of the step and the mode transferred to mode 3 or the processing mode in block B190.

Now that the system is in a processing mode, the test in block B192 is passed to transfer control of the program to block B194 where the variable CLKCTR indicative of the amount of time that the workpiece is to spend in the process is compared to a variable TIMELO which is indicative of the actual amount of time spent in the mode 3. If the elapsed time in the mode is not greater than or equal to the processing time, then block B194 transfers the control to the common point at block B216. Further tests are made of block B194 as the program sequences through its loop until the elapsed time becomes greater than the set processing time. At this point, the affirmative branch in block B194 is passed and the mode transferred to mode 4 or a cool down mode in block B196.

Block B198 detects that the system is now in a cool down mode and will transfer control to block B200 where the variable PVTHRU is tested to determine whether the cool down process is completed. If the process has not been completed, the negative branch will return program control to the common point in block B216. The test is performed until the variable PVTHRU is set to one indicating that the cool down process has been completed. At that point, the affirmative branch of block B200 transfers control to bLock B202 where the system is changed to mode 5 or a cycle complete mode and the start switch is cleared in block B204.

The program thereafter executes the affirmative branch of block B206 when it finds the system in a cycle complete mode. The block B210 is next executed to test whether the start switch has been pressed and block B212 executed to determine whether the variable PVTHRU is set equal to one. If both of these conditions are present, then the system has completed the cool down process and the start button has been activated, thereby requesting that a new cycle be initiated. This is accomplished by changing the system from mode 5 to a mode 1 or a pump down mode in block B208. Otherwise, if the start switch is not set or the cool down process is not completed when the start switch is set, then block B214 is executed to clear the start switch. Program control is thereafter transferred to the common return point at block B216.

There has been illustrated the process steps that the system controller executes in an automatic state to sequence through an entire process of modes 0–5. Normally, this is the basic procedure that the program executes with the routines PVCONT and PSCNTL to control temperature and pressure in the system. However, as was previously indicated, if the system is not in the automatic state, then further tests will be performed to determine tasks related to the other specialized states.

In block B238 (FIG. 25), the manual state is tested for. If the system is in the manual state, control is transferred to blocks B230, B232 where the start and hold switches are cleared. Next, in block B234, a test is executed to determine whether the operator selector switch is in the manual position. If the selector is in the manual position (negative branch) then the program returns immediately to the common return point in block B216. Otherwise, when the selector switch is not in the manual position and the state is equal to one it indicates the operator desires to exit from this state and the affirmative path from block B234 will be taken to block B240. In that block the system is set to mode 0 or idle and thereafter in block B236 the system is set to state 0 or automatic. Thus, when existing from a manual state the operator knows that the system will be idling in an automatic state and waiting for the next command. The program thereafter exits to the common return point block B216.

If the program finds the system in the manual-entrant state as indicated by taking the affirmative branch of block B244, then a test is performed in block B244 to determine whether the selector switch is in the manual position. If it is, as indicated by taking the negative branch, the program will return immediately to the common return block B216 as no state or mode changes need to be made. However, if the system is in the manual-re-entrant state and the selector switch is not in the manual position, indicating that the operator desires to exit this state, then the affirmative branch of the test is taken. This branch will sequence the program to block B246 where the manual-entrant state will be exited by setting the system back to a hold state. Thereafter, in block B248 and B250, the cycle advance variable CYCADV and the hold switch are cleared respectively. The prgoram thereafter returns to the common return point block B216.

If the system is in a hold state, the test in block B252 will be passed and control transferred to block B262. In that block the time in mode clock is stopped by setting the variable CLKSTP equal to one. The clock will not be started again until the system exists the hold mode. In the next block B254, the variable NMODE is set equal to its last value plus the value of the cycle advance variable CYCADV. This step in the program is to permit the operator a means of advancing the mode in the hold state by as many times as he operates the MODE advance switch. The operator in this manner can halt any mode of operation by placing the system in a hold state and then can transfer the mode to any other mode by incrementing the MODE advance switch to the next desired mode. In block B256 the variable NMODE is tested to determine whether it is equal to six. If this test is positive, then block B260 sets the variable NMODE equal to one, thereby wrapping the cycle advance counter around to the beginning of the mode sequence. Thereafter, in block B258 and block B262 the cycle advance variable CYCADV is set equal to zero.

Next, a program test to determine whether the selector switch is in the manual position is performed in block B264. If not, the program continues with the next test in block B268. However, if the selector switch is set in the manual position during the hold state, this indicates that the operator desires to enter the manual-reentrant state. Therefore, the affirmative branch of the test in block B264 is taken to block B266 where the state is changed to state 2.

Thereafter, the hold switch is tested in block B268 to determine its presence. While in the hold state, if the hold switch is depressed again, this is an indication that the operator desires to exit the hold state and return to an automatic state. Therefore, if the switch variable is present the system takes the affirmative branch to block B270 where the state is set equal to zero. The hold switch is then cleared in block B272 and the present variable MODE set equal to the variable NMODE which was calculated from the number of cycle advances. Since the system has now exited the hold state, the time in mode clock is restarted by setting the variable CLKSTP equal to zero in block B276 before transferring control to the next step of the program.

In the next steps, blocks B278 and B280 determine whether the system is in a pumpdown mode and whether the last mode was a cycle complete mode. If both of these conditions are present, then the subroutine CLEAR is called in block B282 to insure that all system variables are cleared. Thereafter, in block 284, a test is performed to determine whether the present mode of the system is a cycle complete mode. If it is, then the start switch is cleared in block B286. If not, the program continues to the common return point, block B216.

After all the mode and state tasks are complete, the program executes the common return block B216 where a test is performed to determine whether the last mode LMODE is not equal to the present mode MODE. If this test is true, then the program had made a mode change and therefore the subroutine DSPRST is called in block B218, the second clock SECCLK is set equal to zero, and the correction variable CORRREC is set equal to zero. If there has been no change as indicated by the negative branch of block B216, then block B224 is executed to determine whether the system is in a hold state. If the system is not in a hold state, then the next mode is set equal to the present mode before returning to the next sequential program in the background monitor loop. Otherwise, the program returns immediately to the next program in the background monitor.

Figure 26:
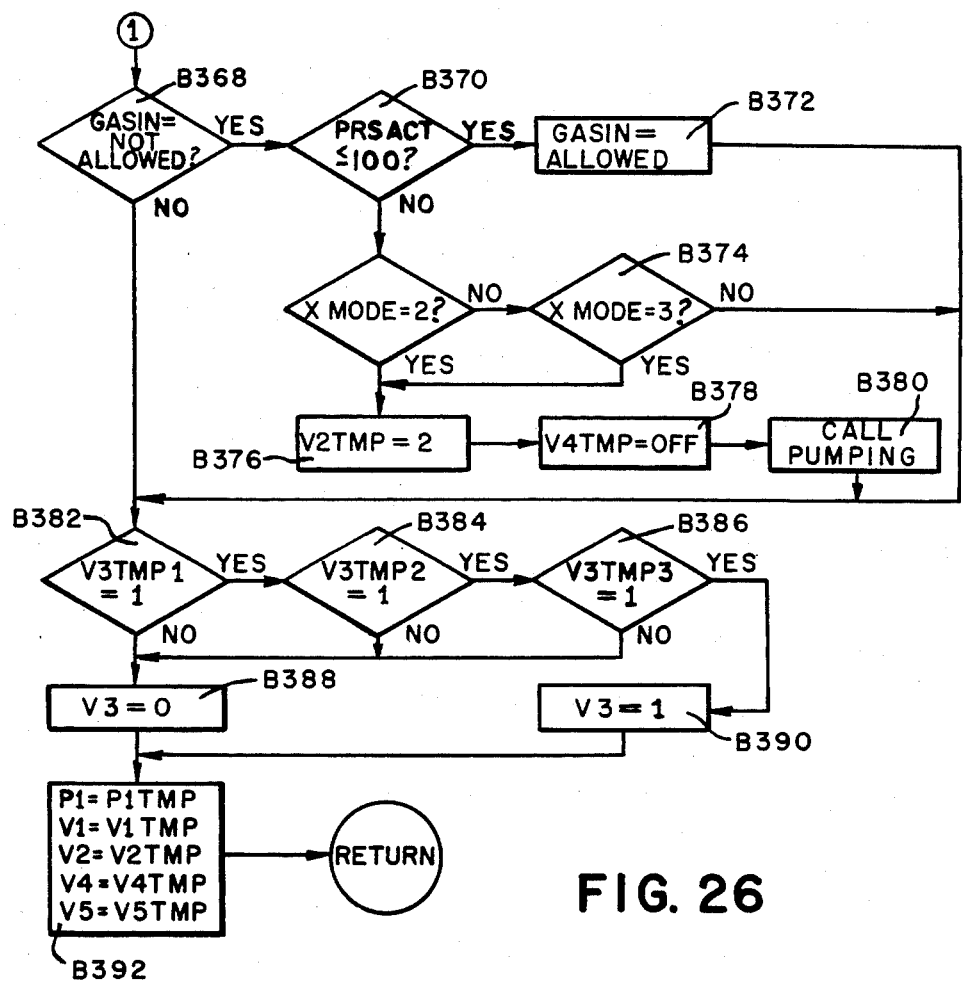

The pump and valves control routine PVCONT will now be more fully explained with reference to FIGS. 26 a, b, and c. This procedure is called by the system background monitor to control the status of the pump and all valves depending upon the system mode and operating state. Initially in block B300 the pump and valve variables P1, V1-V5 are given temporary variable names and placed in an inactive state. The chamber vent valve variable V3 is given three temporary variable values V3TMP1-3 to provide a filtering process for that valve so that this valve is not opened accidentally during the processing of a workpiece.

The pressure variable PRSCNV indicating the desired processing pressure read in from the thumbwheel switches of the operator panel is compared to 650 in block B302. If the thumbwheel switches indicate a desired processing pressure of less than this limit amount, then the affirmative branch is taken to block B304 where the process pressure variable PRSPRC is set equal to the PRSCNV value times 100. Otherwise, the process pressure variable PRSPRC is limited to the maximum value times 100 in block B306. Conveniently the multiplication times 100 is for scaling purposes to convert the input number to milliton for later calculations.

Next a series of tests are performed in blocks B308, B310, B312, B314, and B316 to determine if any of the valves are open and whether the pump in on. If any of these variables are in an active state, then control of the program is transferred to block B322 where the variable PVTHRU is set equal to a non-done value. This indicates that one of the valves or the pump is still active and the system may not automatically begin another process sequence until a complete shut down of the previous cycle has been completed. Only when all of the tests in blocks B308-B316 are negative does the system sequence to block B318 where the system is tested to determine whether it is in mode 4 or a cool down mode. If none of the valves are on and the pump is off and the system is not in a cool down mode then another cycle may take place immediately. This is indicated by clearing the variable PVTHRU in block B323. If, however, all the pumps and valves are inactive, but the system is in a cool down mode as sensed by block B318, then the affirmative branch of that test transfers control to block B320. In that block the variable TMPACT indicative of the actual temperature of the workpiece is tested to determine whether it is greater than 35° C. If the workpiece tmmperature is still greater than 35° C., then the variable PVTHRU is set equal to the not-done value in block B322. Otherwise, the process is complete and the pump and all valves have been inactivated and the workpiece temperature cooled below 35° C. such that the variable PVTHRU should be set to the done value in block B323.

Subsequent to the test for setting or resetting the shut down variable PVTHRU, the program enters block B324 where it tests whether the pump is off. If it is, the pump is in a waiting state and therefore the variable PWAIT is set equal to a not-started value in block B326. Otherwise the program continues directly to block B328 where the of the mode variable is tested for an idle mode. If the system is in an idle mode, as indicated by the affirmative branch to block B330, and the last mode, as indicated by the variable LMODE, is greated than zero then XMODE is set to a cycle complete mode in block B336. These conditions distinguish the case where a shutdown has been requested by the operator when the stop button is pressed during a processing run.

An alternate path is provided when it is determined in block B328 that that idle mode is present and in block B330 that the last mode LMODE was not greater than zero. These conditions indicate that the system is presently in an idle mode and during its last cycle was additionally in an idle mode. If such is the case, then block B332 is executed where the shutdown variable PVTHRU is tested to determine whether the system has been shut down. If it has, then the program completes the path by setting XMODE in the cycle complete mode in block B336. If it has completed the shut down cycle, then the next test in block B334 is performed to determine whether the system is in a system shut down state. If the system is in a shut down state, then the program will set XMODE equal to a cycle complete mode in block B336. Otherwise, the mode variable XMODE is set equal to the mode that was passed to the sub routine in block B338.

The two paths from block B336 and B338 thereafter converge at block B340 where a trap is performed. The mode variable is tested to determine whether it is a valid value; i.e., less than or equal to five. If the mode variable XMODE is greater than five or an unpermitted value, the affirmative branch from block B340 transfers control to block B342 where the mode variable XMODE is set equal to five. This produces a failure mode that always fails to the cycle complete mode, in which the pump and values are all turned off.

If, however, the mode variable is within range, the program continues to block B344, B346, B350, B354, B358 and block B362 where the system mode is determined from the series of tests. If the system is in mode 0 as indicated by the affirmative branch block B344, then no operation takes place. If the system is in mode 1 as indicated by an affirmative branch from block B346, then a subroutine PUMPING is called in block B348 to sequence the pump and valves in such a manner that the furnace chamber is evacuated to the warm-up pressure. If the system is in a warm-up mode as indicated by an affirmative branch from block B352 to block B352, then a subroutine WARMPROC is called to produce a control of the pump and the valves to raise the warm-up pressure to the process pressure by inletting process gas. If the system is in a process mode as indicated by the affirmative branch from block B354 to block B356, then again the subroutine WARMPROC is called to sequence the pump and valves to control the furnace pressure at the process pressure. If the system is in a cool down mode as indicated by an affirmative branch from block B358 to block B360, then the subroutine COOLING is called to shut down the furnace with the pump and valves and to bring the environment of the workpiece back to ambient pressure. If the system is in a cycle complete mode as indicated by an affirmative branch in clock B362, then the system produces no operation and continues directly to block B364. Control of the pressure in the furnace chamber in this manner is illustrated pictorially in FIG. 26c.

In block B364, the state of the system is tested to determine whether the operator has placed the process operation into state 3, a hold state. If he has not, then the program continues to the next slip through the negative branch of the test, but if he has, the affirmative branch is taken to block B366. In this block, the furnace chamber is isolated during the hold state by inactivating all five valves. This operation freezes the pressure environment in the chamber and allows the operator to vary certain other process parameters without losing the particular environment for the workpiece that has been created over time.

The next part of the program determines whether the process gas is allowed to be input to the furnace chamber by testing the variable GASIN in block B368. If process gas is not allowed in the furnace chamber, then the program transfers control to block B370 where the actual pressure as indicated by variable PRSACT is tested to determine whether it is less than or equal to a limit value of 100 millitorr. If the pressure is less than or equal to the limit value, then the furnace chamber has been pumped down sufficiently to allow the start of inletting process gas. Therefore, an affirmative branch from block B370 will transfer control to block B372 where the process gas inlet variable GASIN is set equal to an allowed value.

Otherwise, the negative branch is taken from block B372 and the system tested to determine whether it is in a warm-up or processing mode in block B373, B374 respectively. If the system is in neither of these modes, then the evacuation of the furnace chamber is proceeding normally and the program continues. However, if the actual pressure as tested by block B370 is above the limit value and the system is in either the warm-up or processing mode, then the pressure must be lowered because the furnace has not yet been sufficiently evacuated to begin admission of process gas. Therefore, the program in blocks B376, B378 and B380 will begin opening the proportional pumping valve V2 and close the process gas inlet valve V4 while calling the pumping routine. This operation will shut off the process gas from being input to the furnace chamber while the pumping routine lowers the pressure through the proportional valve to below the limit valve.

Thereafter, the status of the pump variable P1 and the valve variables V1–V3 are tested and set for output to the system. In blocks B382, B384 and B386, the temporary variables for the chamber vent valve V3 are tested to determine whether they are all equal to an active status. If they all are on then in block B390, the chamber vent valve variable V3 is set equal to one or an active status. If any of one of the temporary variables are not active, then the variable V3 is set equal to zero in block B388. This provides a filtering to prevent the chamber vent valve from being operated in error. Next, in block B391, the variables P1, V1, V2, V4 and V5 are set equal to their temporary values before the routine exits to the next program in the background monitor.

Figure 27:
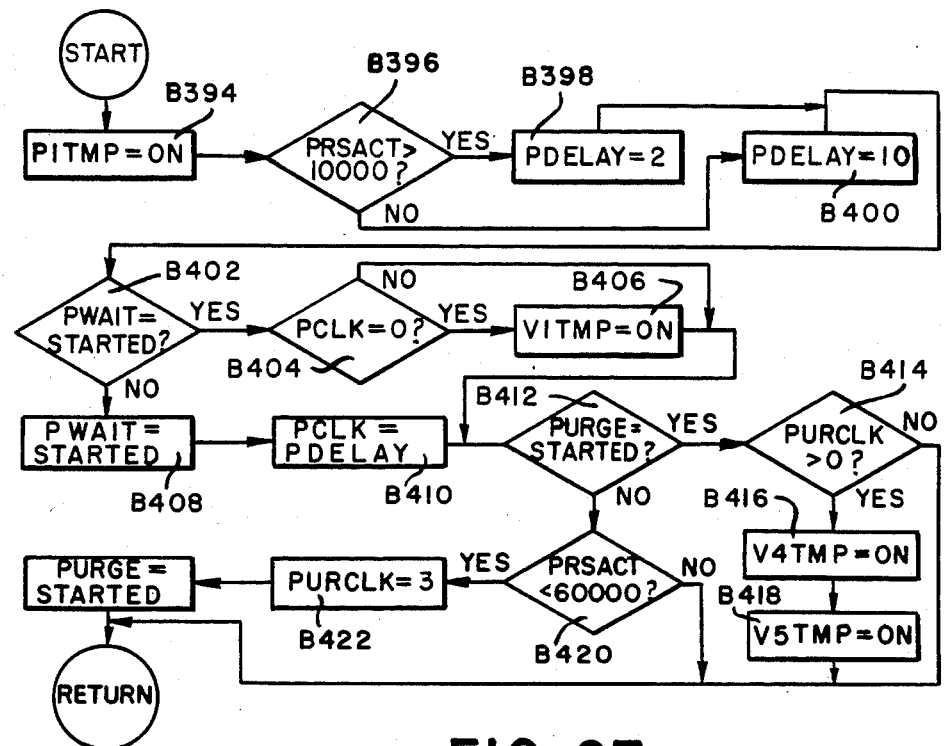
FIGS. 27, 28, 29, and 30 are detailed system flow charts for the subroutines PUMPING, COOLING, WARMUP and PROFILE, respectively, which are called in the routine PVCONT illustrated in FIGS. 25 and 26.
Figure 28:
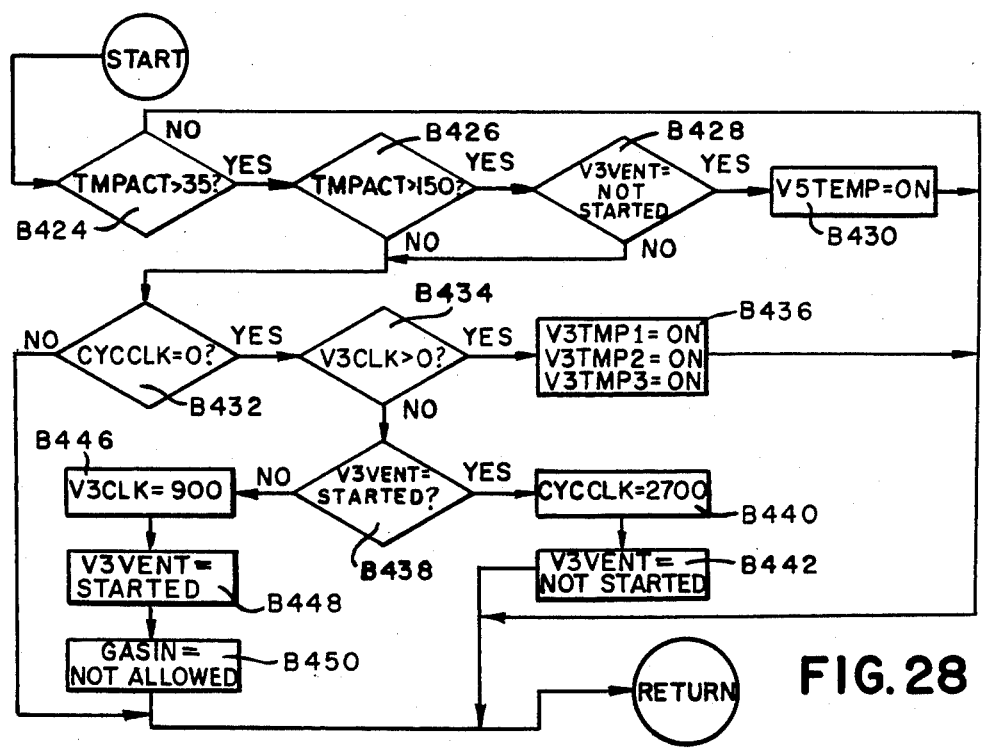

The subroutine PUMPING will now be more fully explained with respect to FIG. 27. This routine is the pumping control which determines the pump and valve status during the pumpdown mode where the chamber pressure is reduced until a required warmup pressure is reached as decided by the mode executive as previously discussed. The routine is entered through block B394 where the temporary pump variable P1TMP is set equal to an active status. This operation activates the pump and begins the purge of the furnace chamber.

Thereafter, in block B396 the actual pressure in the chamber PRSACT is tested to determine whether it is greater than ten torr. If the pressure is greater than the ten torr, then a pump delay of two seconds is regulated in block B398. Otherwise, a pump delay of ten seconds is regulated in block B400. After the pump delay has been established, the pump waiting variable PWAIT is tested in block B402 to determine whether it is equal to a started value. If not, then in block B408 the variable PWAIT is set equal to a started value and the pump clock PCLK is set equal to the pump delay PDELAY in block B410. Therefore, on the next pass through the B402, the pump waiting variable PWAIT will be a started value and the affirmative branch to block B404 will be executed where the pump clock PCLK will be tested to determine whether it has counted down the pump delay yet. If it has not, the program will exit and continue that path until the delay has been counted down. Thereafter the affirmative path from block B404 will be taken to activate the roughing valve variable V1. This operation provides a delay equal to the pump delay PDELAY before turning roughing valve V1 on after the vacuum pump is activated. This delay operation prevents oil from the pump from being drawing into vacuum of the furnace through the conduits.

The program thereafter sequences to block B412 where the variable PURGE is tested to determine whether it has a started value. If not, the negative branch of the test is executed at block B240 where the actual pressure PRSACT is tested to determine whether it is less than 60 torr. Until the actual pressure in the furnace chamber falls below 60 torr, the negative path of block B412 and the negative path of block B420 to the return is executed. Once the pressure falls below 60 torr for the first time, the affirmative path from block B420 is taken to block B422 where the purge clock variable PURCLK is set equal to three seconds and the purge variable PURGE is set equal to a started value in block B422.

Thereafter, when the test in block B412 is executed, the affirmative branch will transfer control to block B414 where the purge clock PURCLK is tested to determine whether it is greater than zero. If the purge clock is still active, then in block B416 and block B418 the process gas inlet valve V4 and the cooling gas inlet valve V5 are opened. This procedure allows the process and cooling gas valves V4 and V5 to be open for three seconds the first time the pressure falls in the furnace chamber below 60 torr. This purge is to remove any air trapped in the conduits before starting the process.

Figure 29:
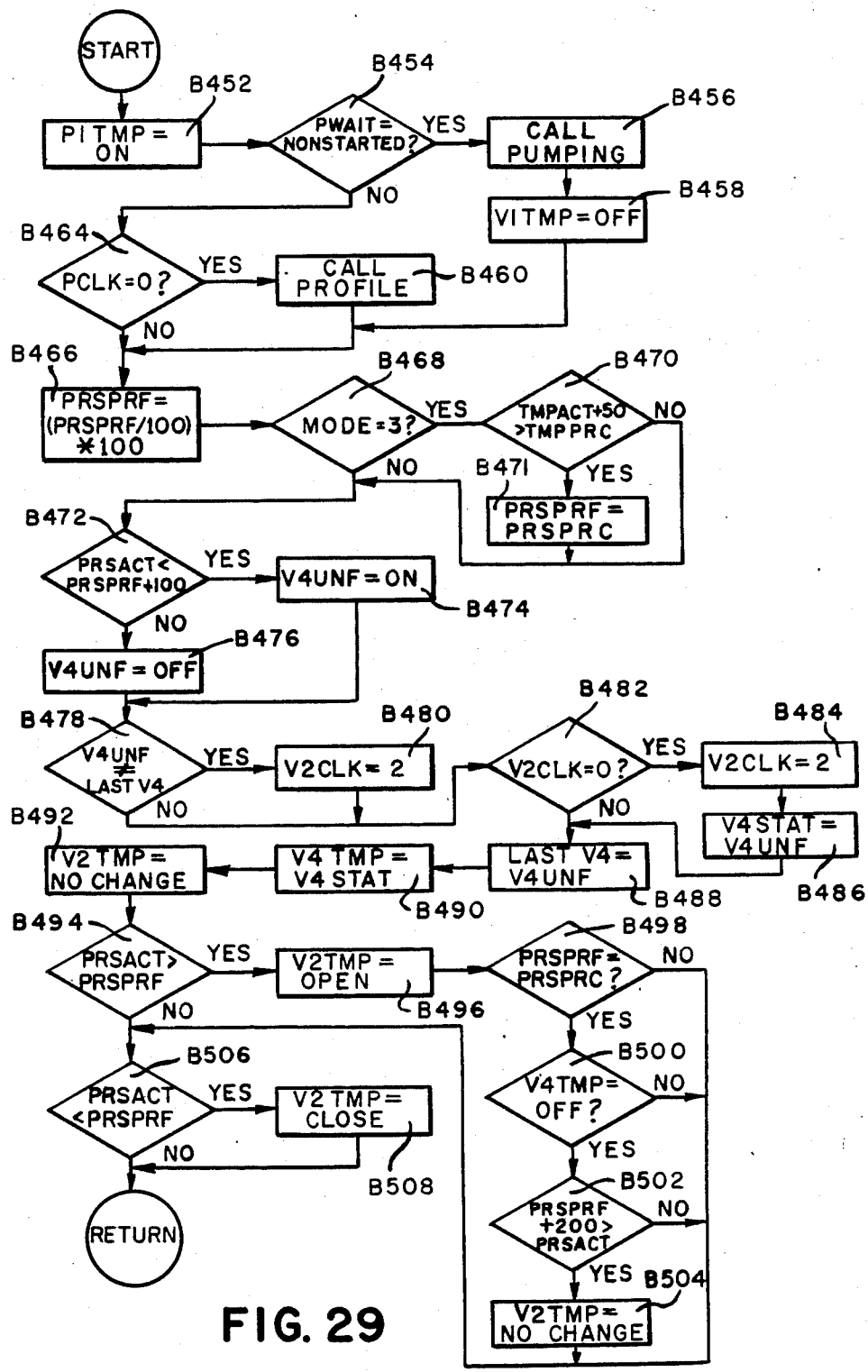

The warm up and processing subroutine will now be more fully explained with reference to FIG. 29. This subroutine is called by the routine PVCONT when it finds the system is in a warm-up or a processing mode and determines the pump and valve status values during those modes. Generally, the procedure turns on the pump P1 and opens the process gas valve V4. The procedure also determines a value for the proportional valve V2 during the warm up mode in order to maintain a pressure at a profile value. The proportional valve V2 variable can take on a value that indicates it should be closed, opened, or have no change in position. This variable is passed to the routine FLOCHG to move the stepping motor in a direction corresponding to that value.

Initially, the routine begins at block B452 where the pump P1 is activated. Next in block B454, the variable PWAIT is tested to determine whether it has a non-started value. If the pump delay variable is not started, then subroutine PUMPING is called in block B456 and the roughing valve V1 turned off in block B458. This action transfers control back to the pumping routine where the pump delay variable PWAIT is started and the pump clock counted down before the roughing valve V1 is turned on again. Thereafter, in block B454, the negative branch will be taken to block B464 where the pump clock variable PCLK will be equal to zero. Upon finding the pump clock zero, the program transfers control to block B460 where the subroutine PROFILE is called. The routine PROFILE, depending upon the actual temperature and pressure of the process and a program code, will return a pressure value PRSPRF that the present program will act on.

The profile pressure value PRSPRF in block B466 is next divided by 100 and then multiplied by 100 to round off the returned value to the nearest 10th torr. Thereafter, in block B468, the present mode of the system is determined by questioning whether the mode=3. Since the entry into this program is only by the warm-up or processing mode, an affirmative branch to block B470 indicates that the system is in a process mode, while a negative branch indicates the system is in a warm-up mode.

If the system is in a processing mode, then in block B470 the actual temperature plus 50.C. is tested to determine whether it is greater than the processing pressure. If this test is true, then the profile pressure variable PRSPRF is set equal to the processing pressure PRSPRC in block B471. Thus, when the actual temperature of the workpiece is within 50° C. of the processing temperature point and the system is in a processing mode, the control pressure will be set equal to the processing set point.

A part of the procedure is entered next where the process gas inlet valve V4 is controlled until the actual pressure in the furnace chamber is greater than 10th torr above the profile pressure value PRSPRF. A two-second filter is used to prevent limit cycling in this sequence. The sequence begins in block B472 where the actual pressure PRSACT is tested to determine whether it is less than the profile pressure PRSPRF plus 10th torr. If it is, then the process gas valve V4 is opened in block B474 and if not, the process gas valve V4 turned off in block B476. In block B478 the unfiltered value V4UNF for the process gas valve is tested against the value LASTV4 that it had in the last program cycle. If the affirmative branch is taken to block B480, this indicates that the last value and the present value are unequal and the process gas clock V2CLK should be set equal to two seconds in block B480. The clock is thereafter tested in block B482 to determine if it has counted down and become inactive. If the two second filter has elapsed, then control is transfered to block B484 where the clok variable V2CLK is reset to two seconds and block B486 where an intermediate variable V4STAT is set equal to the unfiltered value V4UNF. Next, in block B488, the last value for V4, LASTV4, is set equal to the unfiltered value V4UNF and in block B490 that value is returned to the PV CONT routine by setting V4TMP equal to the intermediate value V4STAT.

Next, the routine enters a sequence that will determine the value of the proportional valve V2 based upon the pressure. Initially, the proportional valve value V2TMP is set equal to a no-change value in block B492. This is the default condition and initially the position where the program sets V2. In block B494, a test is performed to determine whether the actual pressure PRSACT is greater than the profile pressure PRSPRF. If the test is affirmative, then in block B496 the proportional valve variable V2TMP is set equal to an opening value. The opening of the valve V2 will lower the actual pressure to the profile pressure.

However, a series of tests is performed in blocks B498, B500, B502 and B504 to modify this action if the profile pressure PRSPRF is equal to the process pressure set point PRSPRC or the process valve V4 is off. In that case, if in block B504 the actual pressure PRSACT is not greater than the profile pressure PRSPRF by more than 10th of a torr, then the variable for the proportional pump V2 is set to a no-change value in block B504.

Both the paths from block B494 and block B504 converge at block B506 where the second part of the proprotional valve V2 control is executed. In that block, the actual pressure, PRSACT is tested to determine whether it is less than the profile pressure PRSPRF. If the actual pressure PRSACT in the furnace chamber is less than the profile pressure, then the proportional valve variabLe V2TMP is set equal to a closing value in block B508 to increase the actual pressure. The program thereafter returns to the PVCONT routine.

Figure 30:
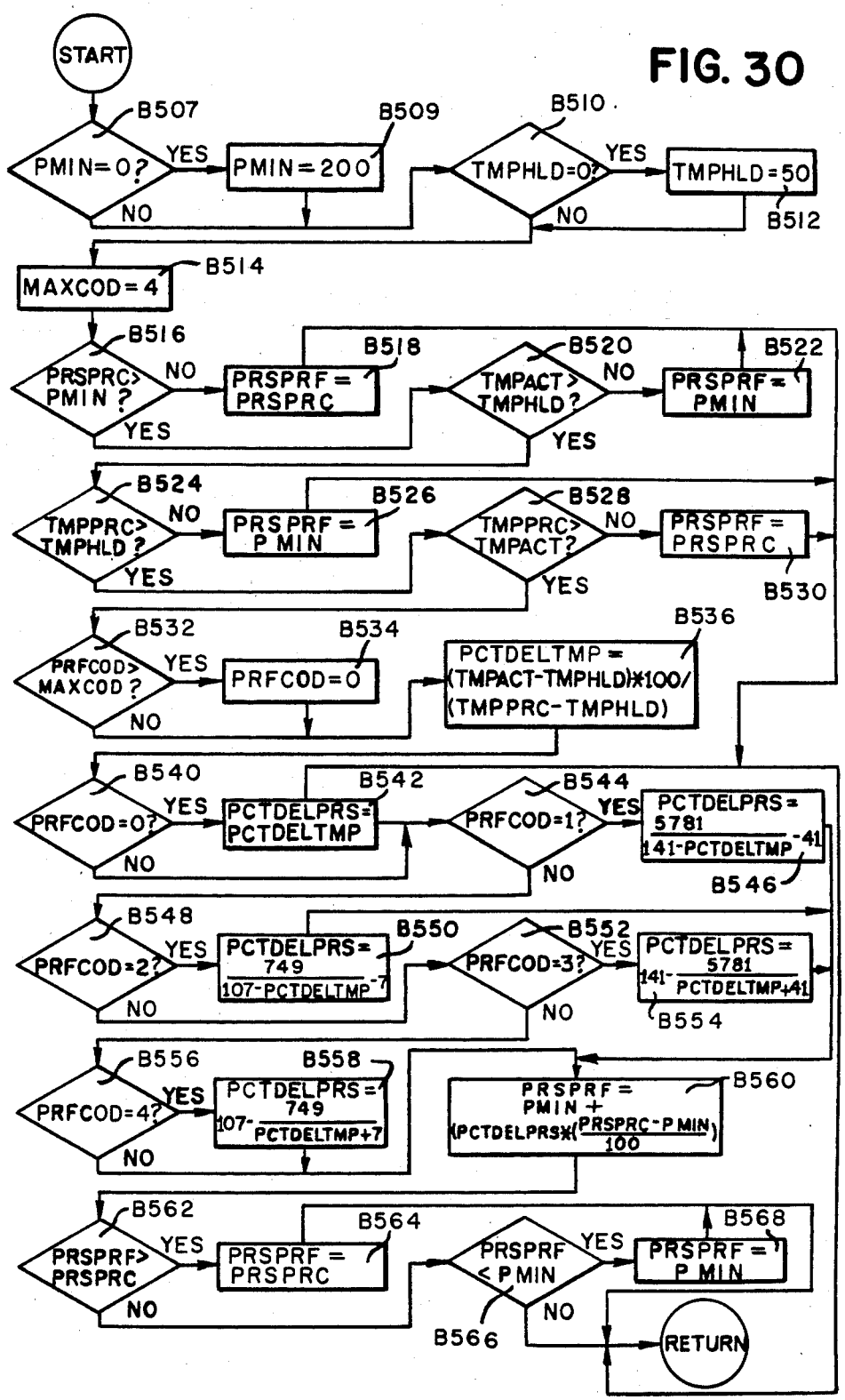

In FIG. 30 there is shown the routine PROFILE which generates the profile pressure value PRSPRF which the warm-up and processing routine operates on. The routine initiates in block B507 where the minimum value for the pressure PMIN is tested to determine whether it is equal to zero. If it is, then the minimum pressure value is initialized to 200 millitors in block B509. Next, the minimum temperature variable TMPHOLD is tested to determine if it is equal to zero in block B510. If it is, then TMPHDL is initialized to 50° C. in block B512. The maximum profile code MAXCODE is initialized to four in block B514.

Thereafter, the processing pressure set by the thumbwheels, PRSPRC, is compared to PMIN in block B516 to determine whether the setting is greater than the minimum value. If the operator has selected a processing pressure below the minimum value, then the profile pressure PRSPRF will be defined as the operator set value PRSPRC in block B518. In the more normal case, an affirmative answer from block B516 transfer the program control to block B520 where the actual temperature TMPACT is compared with the minimum temperature TMPHLD. If the test is negative, then block B522 sets the profile pressure PRSPRF equal to the minimum value PMIN. In this manner the profile pressure is always held at the minimum value until the actual temperature is above the minimum temperature of 50° C.

When the actual temperature rises above the minimum temperature, the affirmative branch of block B520 transfers control to block B524 where the processing temperature TMPPRC is tested against the minimum temperature TMPHLD. If the operator has defined the processing temperature by the thumbwheels to be less than the minimum temperature TMPHLD, then block B526 will set the profile pressure PRSPRF equivalent to the minimum value PMIN. In the normal case where the processing temperature is greater than the minimum temperature, block B528 is executed to determine whether the processing temperature is greater than the actual temperature. Once the actual temperature TMPACT exceeds the processing temperature TMPPRC, then the negative branch of the test is executed and control transferred to block B530 where the profile pressure PRSPRF is set equal to the processing set point PRSPRC. This situation is indicative of a system conditions where the system has completed warm-up and the actual temperature has increased to the processing temperature. Thus, the pressure in the furnace chamber should be equivalent to the processing pressure set point.

However, if the actual temperature has not yet reached the processing temperature, the affirmative branch of block B528 is executed and block B532 called next for execution. Blocks B532 and B534 test the profile code PRFCOD against the maximum code MAXCOD. If the profile code exceeds the maximum allowable code, then a default value of zero is provided in block B534. Next, in block B536, a temperature variable PCTDELTMP is calculated as the ratio of the difference of the actual temperature minus the minimum temperature to the difference of the temperature processing set point minus the minimum temperature. This ratio is then multiplied by 100 to generate the result as a percentage. The temperature delta value PCTDELTMP is then an indication as a percentage of how far the actual temperature has traveled between the two points of the minimum temperature and the processing set point temperature. From this temperature value and the profile code, the procedure will generate a delta pressure value PCTDELPRS from a plurality of profile equations. The profile equations determine the delta pressure variable PCTDELPRS based on how far the actual temperature TMPACT has progressed from the minimum temperature to the processing temperature.

In block B540, if the profile code PRFCOD is zero, control is transferred to block B542 where the delta pressure value PCTDELPRS is set equal to the delta temperature value PCTDELTMP. A profile code of zero is therefore a default profile and produces a linear increase of the profile pressure PRSPRF from the minimum pressure to the processing pressure that follows the actual temperature from the minimum temperature to the processing temperature.

Alternate profiles for profile codes 1-4 are curves which produce schedules above and below a linear profile. In block B544, if the profile code is one, then block B546 is executed to produce a profile which curves slightly below the linear profile so that the pressure increases slowly during the first half of the process and more quickly during the second half of the temperature span. If the profile code is two, then block B550 is executed to provide a lower curve which raises pressure very slowly and then rapidly raises it to the final set point within the last 20% of the temperature span. For a profile code of three as determined by block B552, the program executes block B554 to provile a profile which curves slightly above the linear profile so that the pressure increases quickly during the first half of the process and more slowly during the second half of the temperature span. Finally, for a profile code of four, as determined by block B556, the program will execute block B558 where a profile is provided which raises the pressure quickly during the first 20% of the temperature span and then gradually increases it to the final set point.

It is evident that many other non linear profiles can be provided by this method. The actual profile used for any process depends upon the geometry and material of the workpiece being nitrided, the processing temperature and pressure set points, the atomoshere used in the process, and the desired result. The method is extremely flexible in that pressure-temperatures points where "hollow cathode" effects take place on certain workpieces can be avoided entirely.

After the delta pressure value PCTDELPRS has been calculated, it is used in block B560 to calculate the profile pressure PRSPRF by adding PMIN to the delta pressure value multiplied by the difference between the processing pressure set point and the minimum pressure value over 100. This calculation provides a profile pressure PRSPRF as a function of temperature and more specifically as a function of the percentage distance the temperature actually has risen from the minimum temperature value to the temperature set point.

Thereafter, the profile pressure PRSPRF is compared to the processing pressure PRSPRC set point in block B562. If the profile pressure PRSPRF is greater than the processing pressure PRSPRC, then the profile pressure is set equal to the processing pressure in block B564. Otherwise, the program continues to block B566 where the profile pressure PRSPRF is compared to the minimum pressure PMIN. If the calculated profile pressure is less than the minimum pressure, then the profile pressure is set equal to the minimum pressure in block B568. These two tests are limits to insure that the value of the profile pressure variable PRSPRF is not greater than the processing pressure set point PRSPRC or less than the minimum pressure PMIN. This routine then returns the value of the profile pressure PRSPRF to the PVCONT routine.

Figure 31:
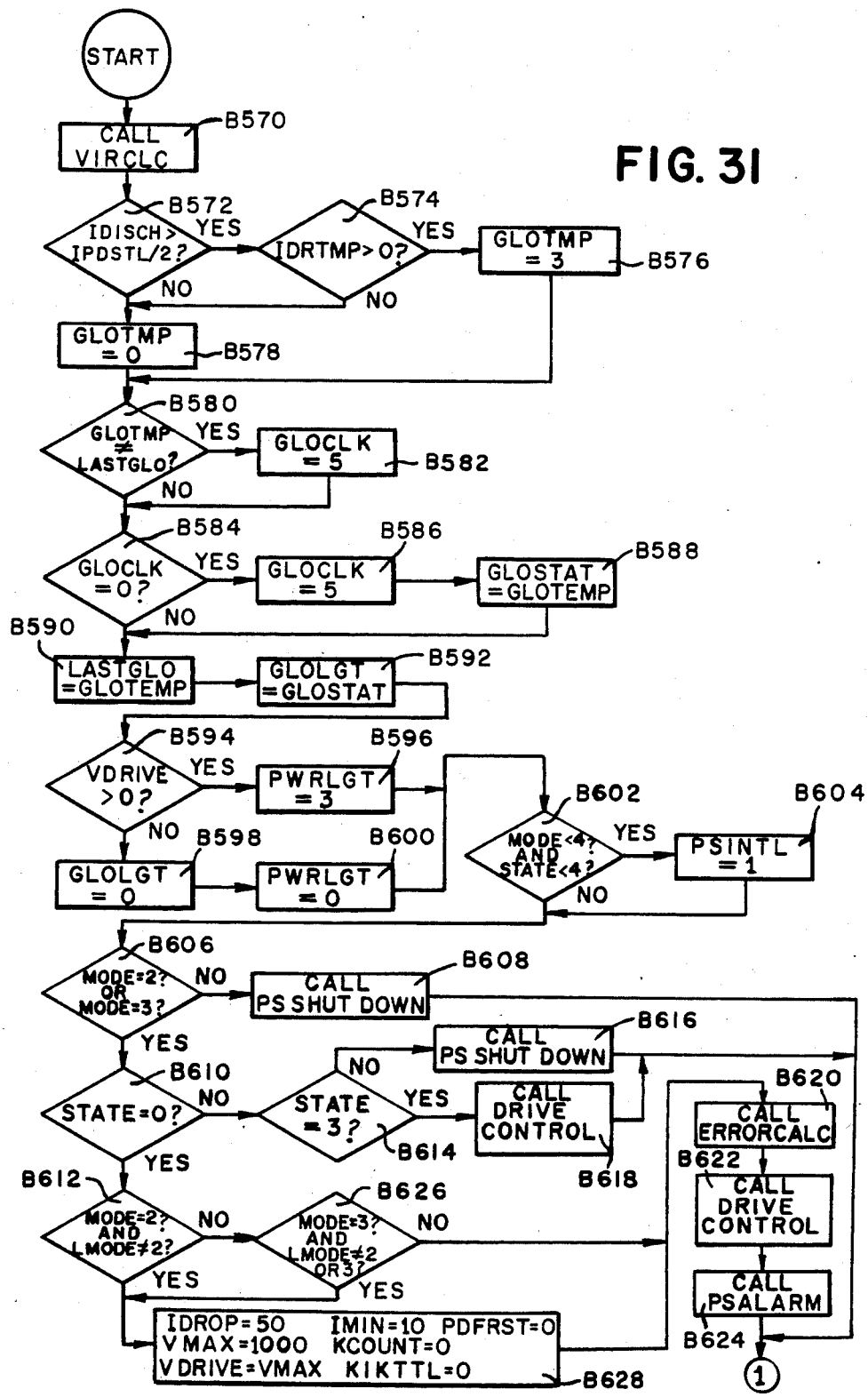
FIGS. 31 and 32 are detailed system flow charts of the routine PSCNTL illustrated in FIG. 19.
Figure 32:
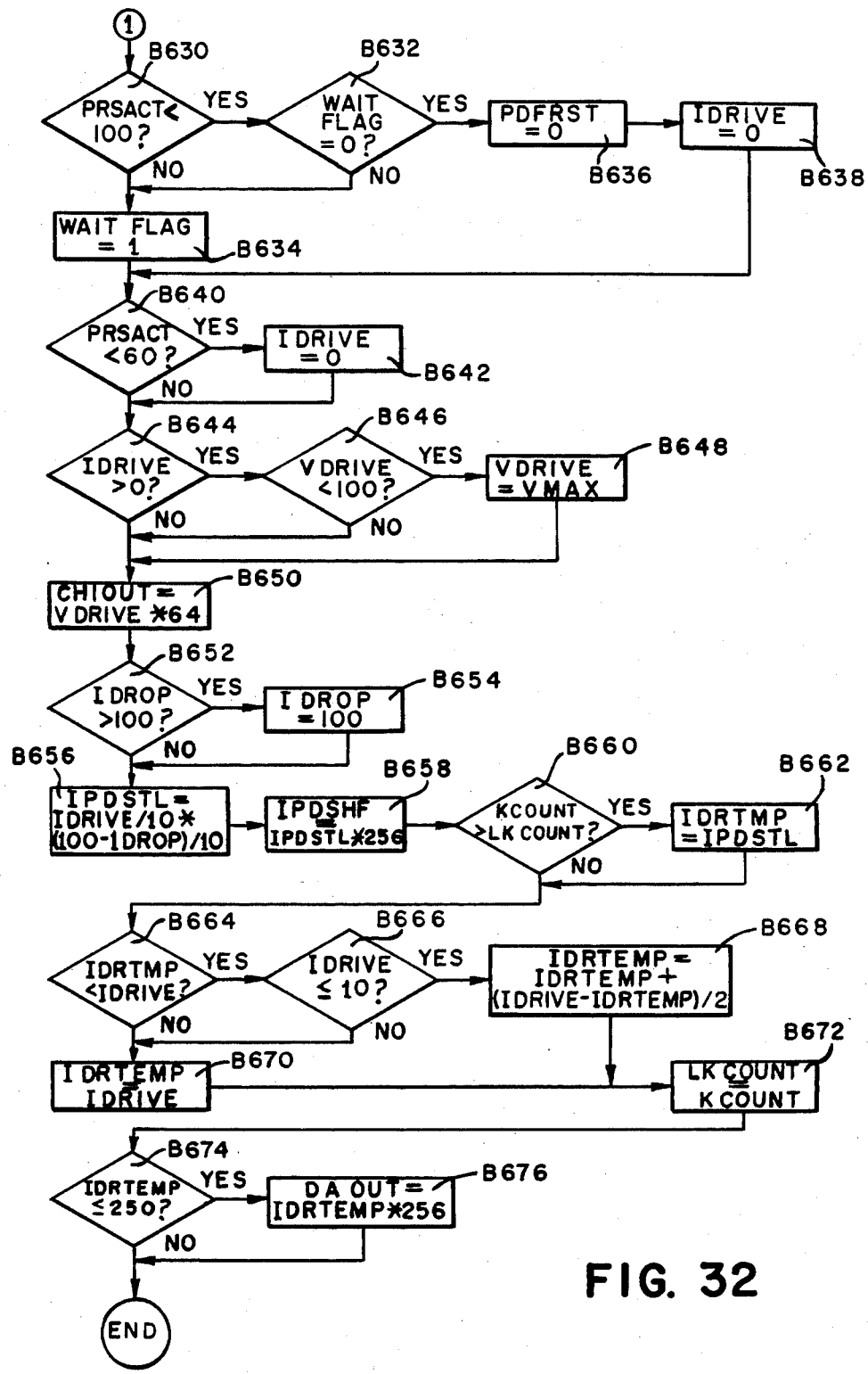

With respect now to FIG. 31, there is shown the routine PSCNTL control which determines the status and control signals to the power supply. The routine is initiated at block B570 where the routine VIRCLC is called to calculate values of the current and voltage along with an instantaneous impedance ratio from the input parameters related to the current discharge and voltage discharge of the power supply.

The procedure then executes a group of steps from block B572 to block B600 to determine the status of the glow indicator and the power indicator on the system flow diagram of the operator panel. In block B572 a test is performed to determine if the variable IDISCH indicative of the output current of the power supply is greater than the pedestal value IPDSTL divided by two. This condition and the current drive variable IDRTMP being greater than zero (tested in block B574) indicates that the glow discharge process is in a healthy state and the glow indicator should be activated. Therefore, in block B576 the variable GLOTMP is set equal to an active value (3). If either of the tests in block B572 or B574 are negative, then the variable GLOTMP is set equal to a non-activated value (0) in block B578. Thereafter, a five second filter is used to keep the glow light from flickering. In block B580, the variable GLOTMP is tested to determine whether it is equal to the last value LASTGLO. If it is not equal to that last value, then the filter clock variable GLOCLK is set equal to five seconds in block B582. Next, in block B584 the filter clock variable GLOCLK is tested to determine whether the clock is active. If zero, indicating that the delay has timed out, then in block B586 the clock is reset to five seconds and an intermediate variable GLOSTAT is set equal to the present variable GLOTEMP.

Otherwise, if the filter clock is active, a negative branch from block B584 transfers control of the program to block B590 where the previous variable LASTGLO is set equal to the present variable GLOTEMP. Thereafter, the glow light variable GLOLGT which is used by the input and output routines to activate the glow light through the driver circuitry is set equal to the intermediate status value of GLOSTAT in block B592.

Next, the routine will set the power light status by first determinining in block B594 whether the value of the voltage drive variable VDRIVE is greater than zero. An affirmative answer to this test transfers control to block B596 where the power light variable PWRLGT is set equal to an active value. On the other hand, if the voltage drive variable VDRIVE is zero, the negative branch from block B594 transfers the control to block B598 where the glow light variable GLOLGT is set equal to zero and block B600 where the power light variable PWRLGT is also set equal to zero.

In this manner, the routine turns the power light and glow light off if the voltage drive is not greater than zero. Otherwise, the routine allows the lights to be activated. Additionally, the current drive signal is checked to determine whether it is above or below one half of the pedestal value for five seconds before a change is made.

In the next part of the routine, the system is checked to determine whether the mode is less than four and whether the state is less than four. If neither of these conditions is present, then the program continues to block B606 immediately. When both of the conditions are present, however, the power supply interlock signal PSINTL is set equal to an activated value in block B604 to engage the power supply.

The procedure progresses to block B606 where the system is tested to determine whether it is in a warm-up or a processing mode. If the system is in neither of these modes, then a subroutine call in block B608 transfers control to a power supply shut-down subroutine PSSHUTDOWN. However, if the system is in a warm-up or a processing mode, then the affirmative branch from block B606 transfers control to block B610 where a query is made to deterine whether the system is in an automatic state. If the system is not in an automatic state and the system is not in a holding state (determined by block B614) then the power supply shut down subroutine PSSHUTDOWN is again called in block B616. If, on the other hand, the system is not in an automatic state but is in a holding state, then a subroutine call to DRIVECONTRL is made in block B618. The subroutine DRIVECONTRL provides a variable IDRIVE back to the PSCNTL routine which is indicative of the magnitude of current to be provided by the power supply.

In the normal case, the system will be found in an automatic state in block B610 and control transferred to block B612 where the system is tested to determine whether this is the first time through the routine. The routine determines that this is the first pass through if in block B612, the system is now in a warm-up mode and the last mode was not warm-up. Additionally, the system determines this is the initial pass through the routine, in block B626, if the mode of the system is a processing mode and the last mode was not warm-up or processing. This status could be effected, for example, by the operator placing the system in a hold state and advancing the mode from any other mode to the processing mode.

If these conditions are present, then in block B628 a step is executed to initialize the power supply routine constants. Once the routine has initialized the constants, the program enters a sequence of blocks B620, B622, and B624 where the main control subroutines of the PS CNTL routine are called. In block B620, the subroutine ERRORCALC is called to calculate the difference between the set temperature ramp rate and the actual temperature ramp rate as a percent. The set temperature ramp rate in the warm-up mode is based upon the ramp rate set by the operator control panel thumbwheels or the processing temperature when in the processing mode. The DRIVECONTL routine in block B622 receives the error value and operates on it to null the error by regulating the current drive signal IDRIVE. The DRIVECONTL routine as will be more fully explained hereinafter is basically a PID (proportional-lntegral-derivative) controller which attempts through feedback of the actual temperature to null the error difference.

Next, in block B624, the PSALARM subroutine is called to alarm any conditions where the power supply or other operating parameters have determined that an abnormal or dangerous condition exits. In block B630 (FIG. 32), the actual pressure of the system is tested to determine whether it is less than 10th of a torr. This test is to provide a branch where the current drive signal IDRIVE can be held equal to zero until the actual pressure gets above 1/10th torr and a processing gas back-fill is accomplished. To this end, an affirmative branch from block B630 tests a waiting flag in block B632. If the waiting flag is present (equals 0), then the drive control variable PDFRST is set equal to zero in block B636 and the current drive variable IDRIVE is set equaL to zero in block B638.

When the actual pressure PRSACT obtains a value of greater than 10th torr and processing can begin, then the wait flag is set to a cleared value in block B634. After, the affirmative branch of block B632 will be bypassed during subsequent executions of the PSCONTL program.

Subsequently, in block B640, the actual pressure PRSACT is tested to determine whether it is less than 60 militorr. If the pressure is this low, then ignition for the glow discharge can be difficult to initiate and therefore the current drive signal IDRIVE is set equal to zero in block B642. This portion of the routine therefore performs a limiting value on the current drive signal such that it is controlled by pressure below a certain value.

In the next portion of the routine, beginning in block B644, the current drive IDRIVE is tested to determine whether it is greater than zero and the voltage drive VDRIVE is tested to determine whether it is less than 100 volts in block B646. If both of these conditions are present, then the voltage drive variable VDRIVE is set equal to the maximum voltage limit VMAX. This step is to reinitialize the variable VDRIVE for those conditions where it has been set to zero during the routine by the manual reentrant state.

By setting the voltage drive variable VDRIVE equal to the maximum voltage limit, or 1,000 volts, the actual voltage output of the power supply may float to any value between zero and 1,000 depending upon the impedance of the work piece and the current drive signal IDRIVE. Therefore, the power supply is advantageously current controlled by the signal IDRIVE in this manner.

In the next block B650, the voltage drive variable VDRIVE is multiplied by a constant 64 and set equal to the D/A variable CH1OUT. This is the address of the digital to analog converter channel that is connected to the power supply control input for the voltage drive. Statement B650 therefore outputs the voltage drive control variable VDRIVE to the power supply during its execution.

In block B652 the variable IDROP is tested to determine whether it is greater than 100%. If the variable exceeds 100%, then it is limitd to that value in block B654. This test is a trap to insure that the current drop value IDROP does not exceed 100%. The pedistal value IPDSTL is then calculated by multiplying the curring drive variable IDRIVE times 100% minus IDROP in block B656. This calculation yields a pedistal value that is a pre-determined percentage of the current drive variable IDRIVE. Generally the variable IDROP is 50% as was set in the initialization of the routine program. However, the IDROP value may be changed by operator input to be any percentage value that is desired for system stability. In the next block B658, the pedistal value is multiplied by 256 to become the intermediate value IPDSHF. This intermediate value is used in further calculations and the multiplication is merely a scaling factor for use in other parts of the program.

The kickdown count KCOUNT is then compared with the last kickdown count LKCOUNT to determine the magnitude of each. If KCOUNT is greater than LKCOUNT, then during the Last pass through the program a kickdown has occurred. Therefore, the temporary drive signal IDTEMP should be replaced by the pedistal value which occurs in block B662. This arc suppression activity lowers the current value to the pedistal value such where after an arc suppression delay the program can increase the current drive from the pedistal value back to the original current drive value.

In concert with this action, in block B664 the temporary current drive signal IDRTEMP is compared to the present current drive variable IDRIVE. If this temporary variable is less than the present current drive, then a kickdown has occurred and the system must be incremented back to the present current drive value IDRIVE. Therefore, in block B666, the current drive variable is tested to determine whether it is greater than a lower limit of one amp. If the answer to this test is affirmative then the temporary value IDRTEMP is replaced by its present value plus half the distance between the temporary value and the present current drive variable IDRIVE. Otherwise, in block B670 the temporary current drive variable IDRTEMP is replaced by the present current drive variable IDRIVE. Thereafter, the Last kick count LKCOUNT is set equal to the present kick count KCOUNT in block to reset the variable for a test for the next kickdown.

Thereafter, in block B647 a maximum value for the current drive temporary value of 25 amps is tested for in block B674. If the current drive value is less than that, then the value is output through the digital analog conversion program by replacing the variable DAOUT with the temporary current variable IDRTEMP times 256 in block B676. The program will then continue by executing the next service routine in the background monitor.

Figure 33:
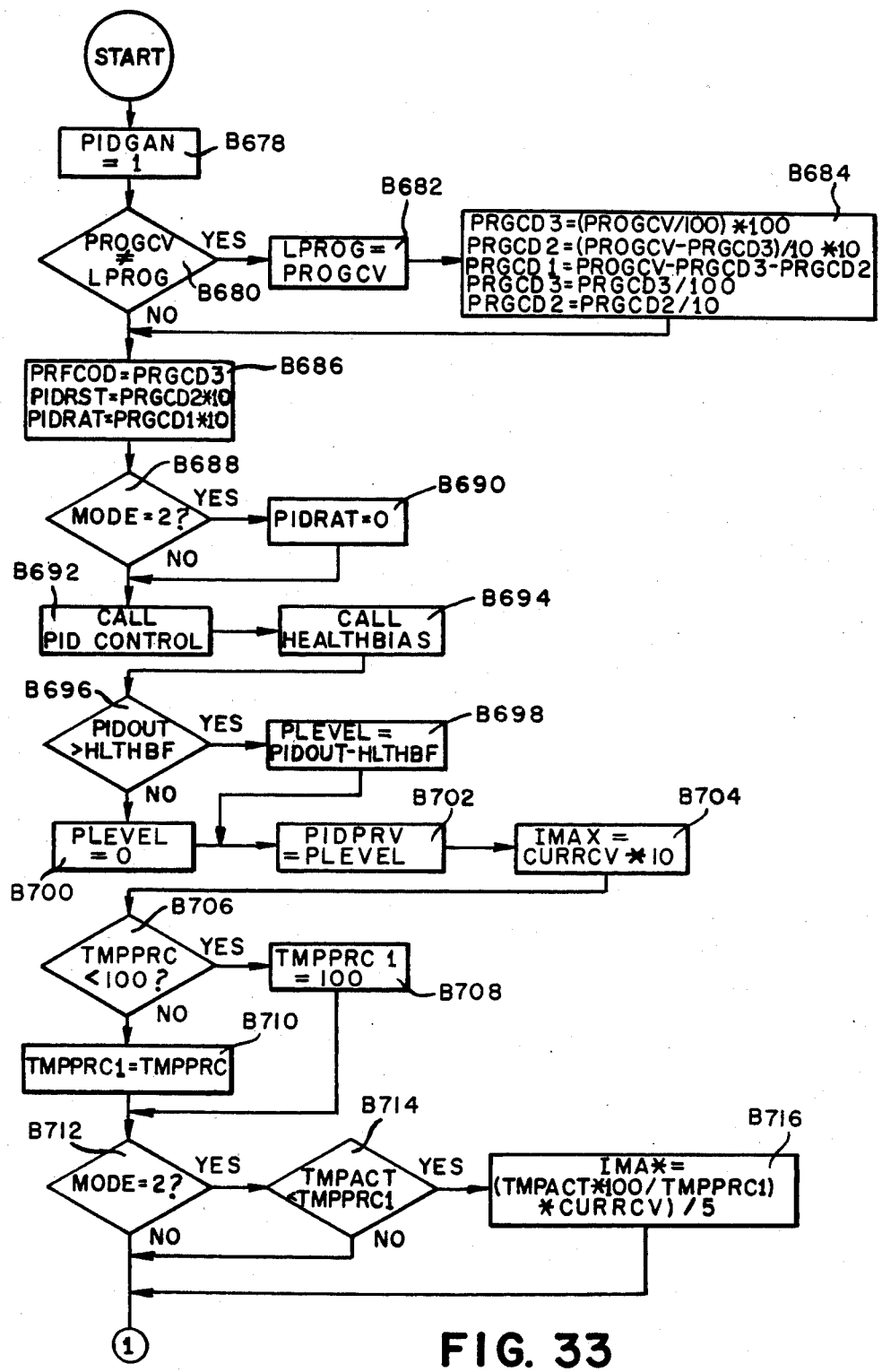
FIGS. 33, 34, and 35 are detailed system flow charts for the subroutine DRIVECONT called in the routine PSCNTL illustrated in FIGS. 31 and 32.
Figure 34:
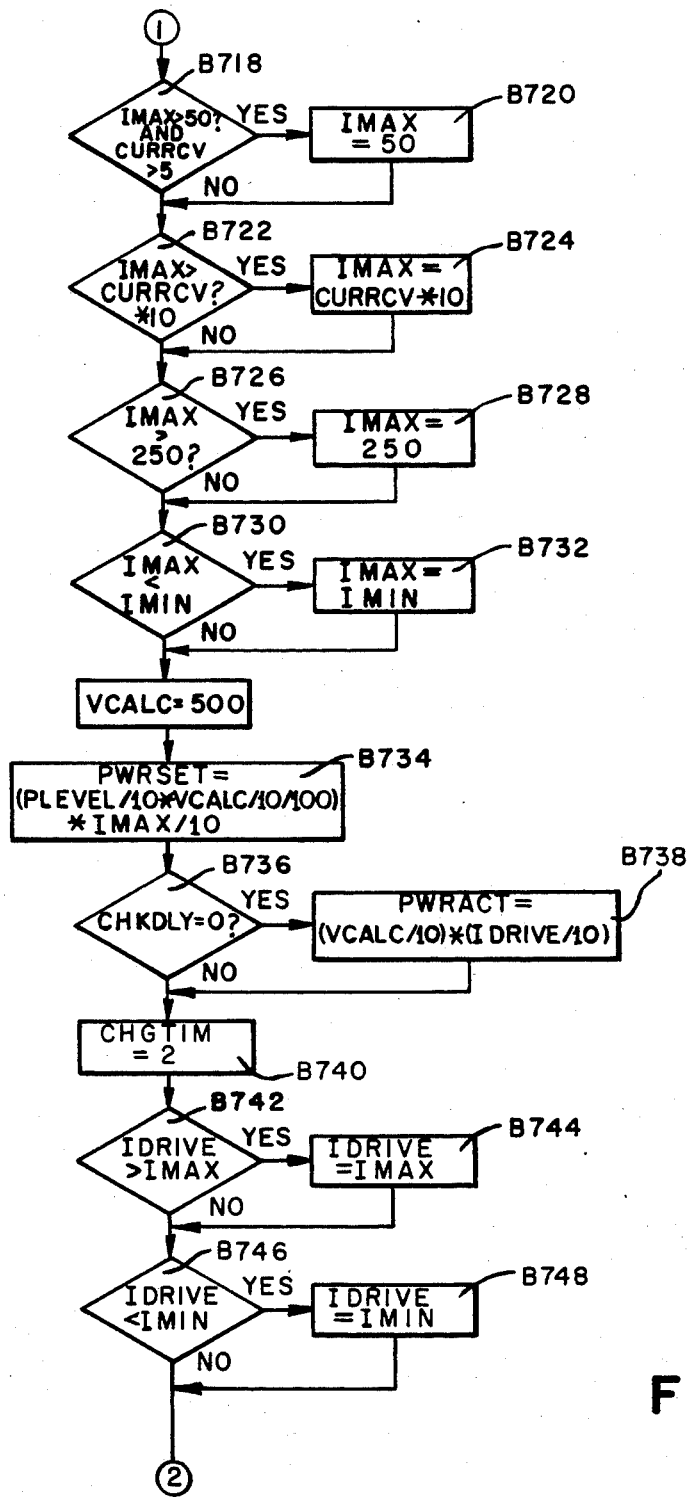
Figure 35:
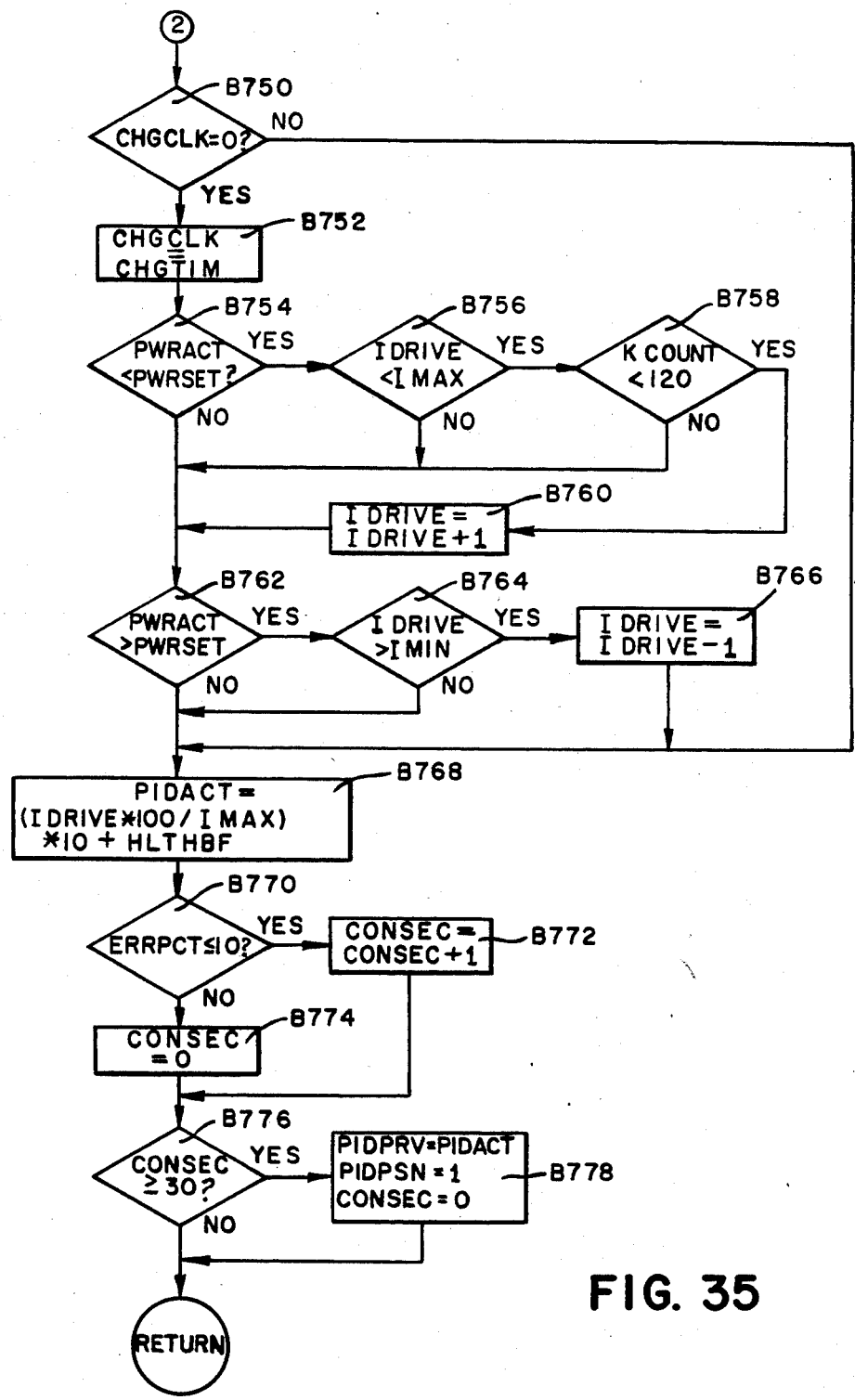

The subroutine DRIVECONTL will not be more fully described with respect to FIGS. 33, 34 and 35. This routine is called to calculate the current drive variable IDRIVE from the output of the subroutine PIDCONTL and the subroutine HEALTHBIAS. Generally, it calculates the current drive signal IDRIVE as an integral controller, dependant upon whether a set power level is above or below the actual power level.

The routine initiates a sequence in block B678 where the gain of the PID controller is set equal to one. Next, in block B680 the program code which is set in the thumbwheels of the operator panel is tested against the last program code of previous passes. If the program codes are not equal, then the affirmative branch will sequente program control to block B682 where the last program code variable LPROG is set equal to the present program code variable PROGCV. This action indicates that the operator has changed the program code by the thumbwheels and therefore the program code variables should be updated. The program code input from the thumbwheels is divided into three digits and block B684 decodes and separates this code into three separate variables PRGCOD1-3. Next, in block B686 the three separated digits are set equal to program variables PRFCOD, PIDRST, PIDRAT which represent scaled versions of the codes. The temperature profile code PRFCOD is set equal to the third digit, the PID controller reset PIDRST is set equal to the second program code digit, and the PID controller rate variable PIDRAT is set equal to the first program code digit.

In block B688 the system determines whether the control is in a warm-up or in a processing mode. If the system is in a warm-up mode as indicated by an affirmative branch to block B690, then the PID control rate variable PIDRAT is set equal to zero. Therefore, in the warm-up mode, the PID control will function as a proportional plus integral control as the derivative constant has been set equal to zero.

Thereafter, in block B692 the PID control routine is called to produce the output variable PIDOUT. The output variable PIDOUT is an indication of the power level to be set as a result of attempting to null the error signal. The program thereafter calls the subroutine HELTHBIAS in block B694 to determine the health bias factor HLTHBF. The health bias factor HLTHBF is representative of a variable proportional to the rate of arcing activity that the system is presently undergoing.

The next block B696 compares the set output power level PIDOUT with the health bias factor HLTHBF to determine which is greater. If the power level output PIDOUT is greater than HEALTHBIAS then, the power level variable PLEVEL is set equal to PIDOUT-HLTHBF in block B698. Otherwise, the power level variable PLEVEL is set equal to zero in block B700. Therefore, the power level variable PLEVEL is a calculated value vased upon the difference of the output of the PID control PIDOUT and the health bias factor HLTHBF if PIDOUT>HLTHBF and equal to zero if PIDOUT<HLTHBF. This operation supplies a glow discharge stability control which is based upon arcing activity. Even if the PID control is requesting a maximum rate of temperature increase, if the glow discharge is becomming more unstable as indicated by an increase in the health bias factor HLTHBF then the power level will still be decreased proportionately. If the glow is so unhealthy that the health bias factor HLTHBF becomes equivalent to the PID control output the calculated power level is set equal to zero until the health bias factor decreases.

Thereafter, the previous power output level PIDPRV is set equal to the calculated power level PLEVEL in block B702. A maximum current IMAX for use in the processing mode is calculated in block B704 by multiplying by 10 the variable CURRCV indicative of the maximum current amount set by the operator in the thumbwheels. Next, the program goes through a series of tests to determine the maximum current IMAX for the warmup mode based on actual temperature. First, the program tests in block B706 whether the process temperature set point TMPPRC is less than 100° C. If it is not, then the intermediate variable TMPPRC1 is replaced by that processing set point in block B710. Otherwise, in block B708 the intermediate variable TMPRC1 is set equal to 100° C.

Subsequently, in block B712 the system determines whether it is in a warm-up or processing mode. If in a processing mode, the maximum current IMAX remains equal to the value set in the thumbwheels as was described with respect to block B704. However, if the system is in a warm-up mode, then in block B714 the actual temperature is tested to determine whether it is less than the intermediate temperature TMPPRC1. If the actual temperature is less than the temporary set point, then the system still must raise the workpiece temperature to that set point. Therefore, in block B716, a maximum current value IMAX is calculated as a ratio times the current limit CURRCV. The ratio is formed by dividing the actual temperature TMPACT by the processing set point temperature TMPPRC1. This ratio therefore provides a maximum current value which is proportional to the maximum current set in the thumbwheels but is proportioned by how close the actual temperature is to the processing temperature. As the actual temperature increases, the maximum current value IMAX available to the system during the warm up mode increases to the maximum input value CURRCV as the temperature increase to the set point. Therefore, the maximum available discharge current is proportionally increased during warm up until a maximum value is reached. During the first half of the warm up cycle, this action restricts the range of authority of the temperature controller to improve control stability.

In the next blocks, the routine generates limits for the maximum current variable IMAX. In the example, if IMAX is greater than 5 amps and the current set point CURRCV is greater than 5 amps (determined by block B718), then IMAX is set equal to 5 amps in block B720. Further, if IMAX is greater than the current set point CURRCV, then IMAX is set equal to that value in block B724. An ultimate limit of 250 amps on IMAX is set in blocks B726, B728. Further, an absolute minimum limit of IMIN is set on IMAX in blocks B730, B732.

The voltage variable VCALC is set equal to one-half the distance between the minimum and maximum values of OV and 1,000 V in block B733. Since the voltage is allowed to float in the system, this provides a reasonable approximation of the actual voltage available and a means to calculate the actual power delivered to the workpiece. This voltage value, in addition to the maximum current value IMAX is next used to calculate the power set point in block B734. The maximum power set point PWRSET is the percentage of the maximum power available as determined by the variable PLEVEL times the voltage variable VCALC and the maximum current variable IMAX. Thus, the power set point is the maximum power level at which the system can operate without going beyond the bounds of the health bias limits or the maximum current limits.

Thereafter, in block B736, the variable CHKDLY is tested to determine whether it is equal to zero. If the kickdown delay is not equal to zero the system is supressing an arc, then block B738 will be bypassed. If the delay, however, is not in effect then that block will calculate the actual power PWRACT being supplied to the workpiece by multiplying the voltage variable VCALC by the current drive IDRIVE. This section of the program provides a means for not calculating the actual power if the system is in the middle of a kickdown. The variable CHGTIM is set equal to two in block B740 to provide a two-second timer as will be more fully described hereinafter. The current drive variable IDRIVE is thereafter limited, both to the positive and negative extent, to insure that it does not exceed IMAX or is lesser than IMIN in blocks B742, B744, B746 and B748.

Subsequent to the limiting of the current drive IDRIVE, the current drive clock CHGCLK is tested in block B750. If the clock has not timed out, then a sequence changing the current drive variable IDRIVE in the next blocks is skipped and the program sequences to block B768. However, if the clock has timed out, indicating that the current drive variable IDRIVE can be changed, then in block B752 the clock is reset with the variable CHGTIM to another two seconds. Therefore, the variable IDRIVE can only be changed once every two seconds and this provides an integral time constant for ramping the current drive positive or negative. A positive ramp for the current drive variable IDRIVE is determined in block B754 if the actual power is less than the set power. Next, in block B756 the current drive IDRIVE is again limited to make sure that it is less than IMAX. If these conditions are present and the kickdown count KCOUNT is less than 120, then in block B760 the current drive variable IDRIVE is incremented by one unit.

If the system fails to pass the test in block B754, then the test in block B762 is executed where the actual power supplied is found to be greater than the power set point. In that case, it is determined that if the drive current value IDRIVE in block B764 is greater than the minimum value IMIN, then the current drive variable IDRIVE will be reduced by one increment in block B766.

The next sequence of blocks in the DRIVECONT subroutine provides a dead band value about which the PID controller output is not varied. The dead band includes those conditions where the error percent is less than 0.1% and remains that small for a predetermined time. In block B768 the actual output of the PID controller PIDACT is determined by dividing the current drive variable IDRIVE by the maximum current variable IMAX and adding it to the health bias factor HLTHBF. Thereafter, in block B770, the error percent is tested to determine whether it is less than or equal to 10th of a percent. If the test is affirmative, then the timing variable CONSEC is increased by one in block B772. Otherwise, the timing variable CONSEC is set equal to zero in block B774. Immediately thereafter in block B776, the timing variable CONSEC is tested to determine whether it is greater than or equal to 30. If it is, then the previous output of the PID control is set equal to the calculated value of the actual PID output in block B778. Also, in that block, the PID control sign is set equal to one and the timing variable CONSEC set equal to zero. This sequence in the program accomplishes a dead band where if the error percent is less than 10th of a percent for thirty consecutive passes through the program, then the output of the PID control is set equal to the actual calculated output.

Figure 36:
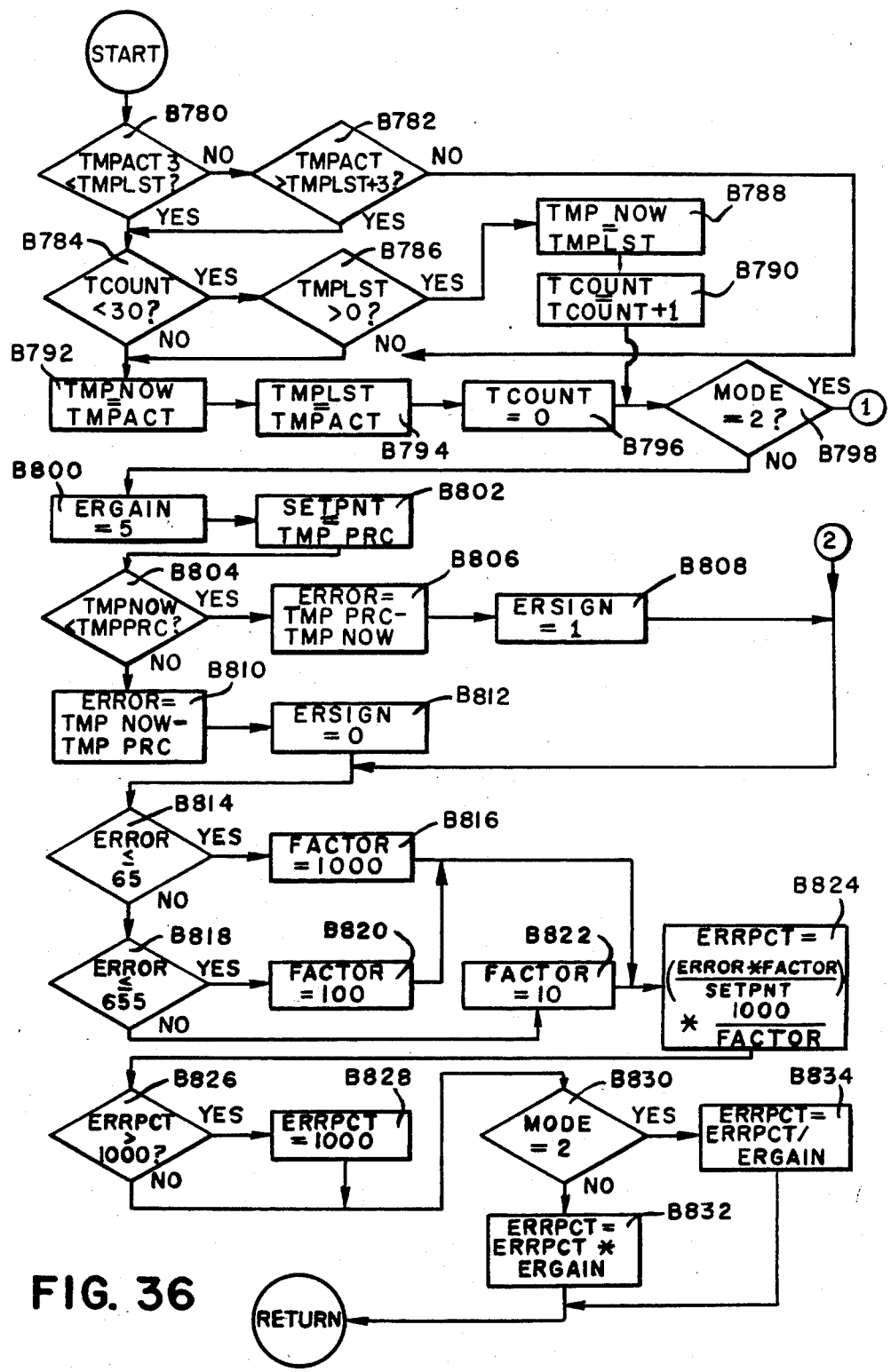
FIGS. 36 and 37 are detailed system flow charts of the subroutine ERRORCALC called in the routine PSCNTL illustrated in FIGS. 31 and 32.
Figure 37:
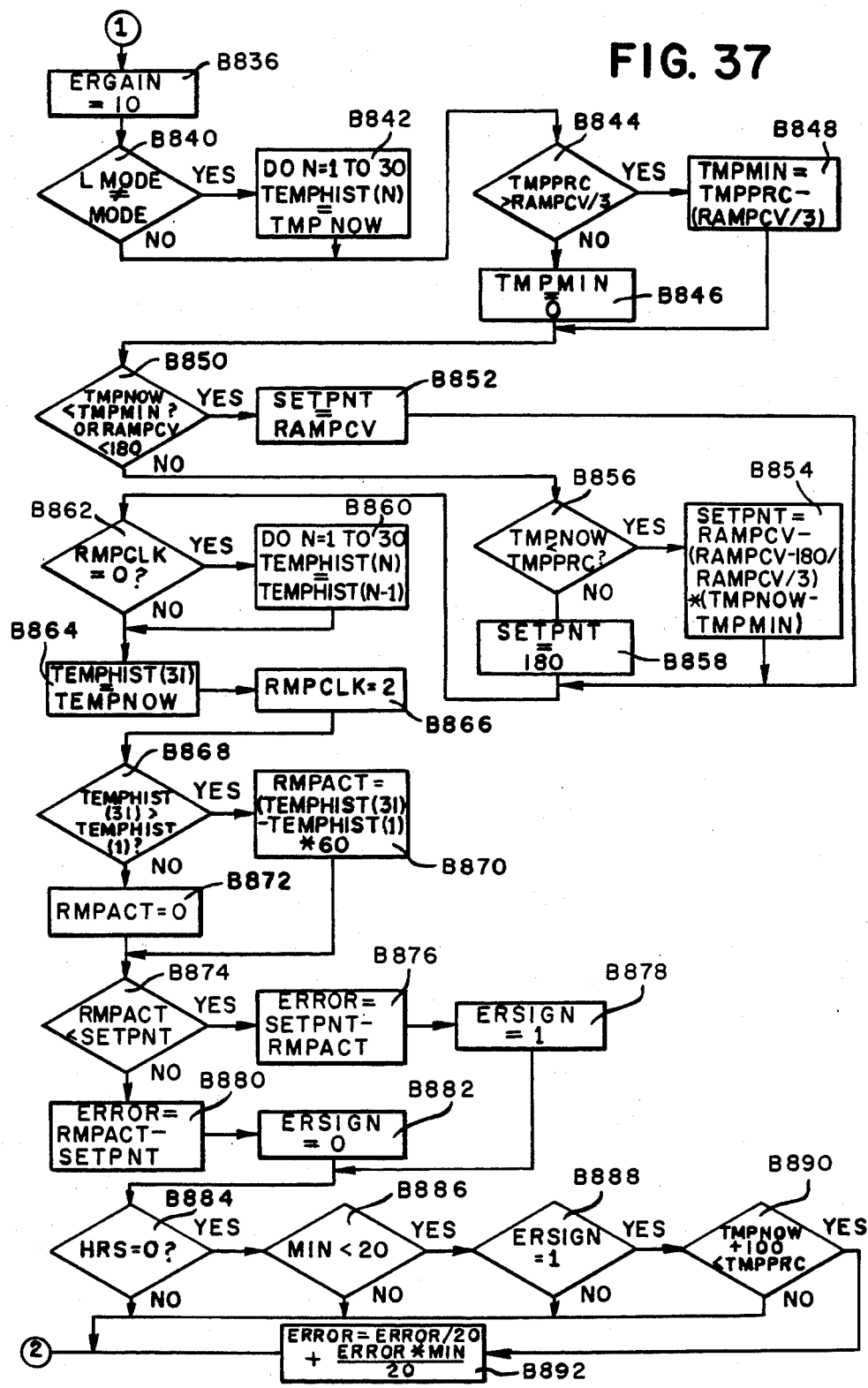

The subroutine ERRORCALC for calculating the percentage error will now be more fully explained with reference to FIG. 36. In that figure, block B780 and block B782 test the actual temperature TMPACT against the last temperature TMPLST of the previous pass through the program. If the actual temperature read is not within 3° of the last temperature read as indicated by affirmative paths from either of the blocks, then block B784 is entered to determine whether the temperature count variable TCOUNT is less than 30. If TCONT is less than 30 and TMPLST is greater than zero as indicated by an affirmative branch from block B786, then the present temperature is to be used in the routine TMPNOW is set equal to the last accepted temperature in block B788. Thereafter, TCOUNT is increased by one in block B790.

The alternate path from block B784 or block B786 is to block B792 where the present temperature variable TMPNOW is replaced by the actual temperature. This path continues by replacing the last temperature with the actual temperature in block B794 and setting the TCOUNT equal to zero in block B796.

The operation of this portion of the routine produces a temperature variable TMPNOW with the value which is the actual temperature measured by the routine if the change is not greater than 3° for every pass. If the actual temperature does change by greater than three degrees during a single pass the previous temperature is used and a timing loop of 30 passes is implemented to determine whether the affect is noise or transients producing the rapid variance. If, however, the actual temperature still differs from the last temperature by 3° after the timing loop, then the present temperature variable TMPNOW is replaced by the actual temperature.

The program then determines whether the system is in a warm-up or a processing mode in block B798. When in a warm-up mode, the sequence of the program is from the affirmative branch of the test to block B836 (FIG. 37), where the error gain ERGAIN is set equal to ten. Next, if the system determines that the present mode is not equal to the last mode in block B840, then an initialization of a thirty element temperature history array TEMPHIST is performed by loading each address with the value of the present temperature variable TMPNOW in block B842. On subsequent passes of the program in the warm-up mode, this block will be bypassed.

Next, a part of the procedure to set the minimum temperature variable TMPMIN is executed in blocks B844, B846 and B848. In the first block, the processing temperature TMPPRC is tested to determine whether it is greater than the maximum temperature ramp rate divided by three. If a negative answer is found, then the minimum temperature TMPMIN is set equal to zero in block B846. If an affirmative answer to the test is determined, then block B848 sets the minimum temperature variable TMPMIN is set equal to the processing temperature minus the ramp rate divided by three. These operations calculate the temperature TMPMIN which will initiate the last twenty minutes of the process at the RAMPCV rate. This temperature is used in the next portion of the program to proportionally reduce the ramp rate to 3°/min during this time period so that the actual temperature of the workpiece will not overshoot the process temperature.

Thereafter, in block B850 the present temperature variable TMPNOW is tested to determine whether it is less than the minimum temperature TMPMIN or whether the ramp conversion rate RAMPCV is less than 180°/hr. If the answer to either of these questions is yes, then the block B852 sets the ramp set point SETPNT of the system equal to the maximum ramp rate RMPCV. This path is taken until the temperature of the workpiece equals tmpmin, then in block B856 the present temperature TMPNOW is tested to determine whether it is less than the processing temperature TMPPRC. If the present temperature has reach the processing temperature, then the set point is immediately set equal to 180°/hr. in block B858. If the temperature is still less than the processing temperature, then in block B854 the set point SETPNT is set equal to the maximum ramp variable RAMPCV minus a product. The product is the multiplication of a ratio times the difference between the present temperature TMPNOW and the minimum temperature TMPMIN. The ratio is calculated by dividing the difference of −180°/hr. by RAMPCV/3. The difference RAMPCU-180°/hr is the difference between the maximum ramp rate RAMPCV and the desired 3°/min ramp rate at the processing temperature. If this difference is subtracted from the RAMPCV rate then the 3°/min rate will be established. However, instead of switching ramp rates drastically when TMPMIN is reached the program applies a multiplier that varies from zero to one to proportionally lower the rate. At TMPMIN the multiplier is zero and thus RAMPCV is not reduced but at TMPPRC the processing temperature the multiplier is one thereby reducing the rate to 3°/min. The multiplier varies proportionally between zero and one as the difference (TMPNOW-TMPMIN) varies with temperature difference RAMPCV/3.

In the portion of the procedure that follows, the temperature history array is updated. Initially, in block B862 a ramp clock RAMPCLK is tested to determine whether it is active. If the ramp clock has timed out, the affirmative branch takes the program to block B860 where the array is updated. The array is updated by replacing the previous element of the array TEMPHIST(N) with the present value of the next element TEMPHIST(N+1). This is accomplished for all thirty elements of the array. Thereafter, a new temperature value is stored in the array in block B864 by replacing element 31 with the present temperature TMPNOW. The ramp clock is thereafter reset for two seconds in block B866. In this manner, the temperature history array is updated with a new value once every two seconds and therefore has 30 values representative of the temperature for the last minute stored in the 30 elements of the array.

In block B868 the value of array element 31 is tested against the value of array element (1). If the latest temperature datum is greater than the first temperature datum, then the actual temperature ramp rate of the system in °/hr. is positive and the difference of the two elements times the conversion factor 60 which calculation is accomplished in block B870. However, if the last element in the array is less than the first element, then the ramp rate is negative and should not be used to control the system. Therefore, for negative actual ramp rates, the variable RMPACT is set equal to zero in block B872.

The actual ramp rate RMPACT is thereafter compared with the set point or desired ramp rate in block B874. If the actual ramp rate is less than the set point ramp rate, then the error is positive and the program transfers to block B876. If the actual ramp rate is greater than the set point ramp rate, then the error is negative and the program control transfers to block B880. For a positive error, the set point ramp rate has subtracted from it the actual ramp rate to generate the error variable ERROR in block B876 and has an error sign variable ERSIGN set equal to one in block B878. For negative errors, the error variable ERROR is set equal to the actual ramp rate minus the set point ramp rate in block B880 and the error slgn variable ERSIGN set equal to zero in block B882.

During the first 20 minutes of the warm-up operation of the system, a soft-start feature provides a proportional underestimation of the actual error rate. This action brings the work piece up to the maximum current ramp rate slowly and increases the temperature to the workpiece at start up without thermal shock upon initiation of the heating current. Initially in blocks B884, B886, B888 and B890, the system determines that the time of processing is less than 20 minutes, the error sign is positive, and the actual temperature is not within 100 degrees of the processing temperature. If all these conditions are present, then the error variable ERROR is set equal to ERROR/20 plus the factor ERROR*MIN/20. As the minutes variable MIN increase to 20, the second factor in the equation increases proportionally to bring the error value up to its true extent. The program thereafter returns to block B814 (FIG. 36).

Returning now to the test in block B798 the alternative negative path will be taken when the system is in a processing mode. The program path is then sequenced to block B800 where the error gain is set equal to five. Thereafter, the set point SETPNT is set equal to the processing temperature in block B802. The program will calculate the error for the processing mode by first comparing the actual temperature to the processing temperature to determine whether the error is positive or negative in block B804. If the error is positive, then in block B806 the error is determined as the difference between the processing temperature and the actual present temperature and the error sign set equal to one in block B808. If the error is negative, the error variable ERROR is calculated as the difference between the present temperature and the processing temperature in block B810 and the error sign set equal to zero in block B812.

The routine thereafter takes the absolute error value calculated by the warm up sequence path or the processing sequence path and changes it into a percentage. Intially, tests are done in blocks B814, B818 to determine the relative magnitude of the error. If the relative magnitude of the error is less than or equal to 65, then a variable FACTOR is set equal to 1,000 in block B816. If the error is less than or equal to 655, then FACTOR is set equal to 100 in block B820. For error values greater than 655, FACTOR is set equal to ten in block B822. The variable FACTOR is used in block B824 where the error is calculated as a percentage of the set point. The variable FACTOR is used in both numerator and denominator of the calculation to provide a greater accuracy. The error percentage is calculated by dividing the error by the set point and multiplying by 100 percent. The actual number for the percentage calculation is 1,000 to yield a percentage number in terms of 10th of a percent.

Next, the error percent is tested to determine whether it is greater than 1,000 or 100 percent. If it is, then the percentage is limited to 100 percent in block B828. Subsequently, the error calculation routine determines which mode the system is in in block B830. If the system is in a warm-up mode as indicated by the affirmative branch to block B834, then the error percent is divided by the warm-up error gain. However, if the system is in a processing mode, then the error percent is multipled by the processing error gain in block B832. After the procedure accomplishes these tasks, it returns to the power supply control routine from which it was called.

The PID control routine algorithm will now be more fully explained with respect to FIGS. 38, 39, 40 and 41. The PID control procedure provides for a digitally simulated replica of a three-mode control having a proportional, integral and derivative control function. The combination of control functions simulates the transfer function of the following equation:

$$CN/EN = K(T1S+1)(T2S+1)/(T1S)[(T2S+1/RA]$$

where:
 CN = normalized output (percent).
 EN = normalized error
 K = gain constant (proportional band)
 T1 = integral time constant in minuterepeat
 T2 = derivative time constant (rate) in minutes
 RA = rate amplitude The PID control therefore outputs an output number CN which is EN times the transfer function. The transfer function acts to null the error for all non-zero error inputs.

Additionally, the PID control program is multimodal where either a single porportional mode, a two-mode proportional plus integral, or a two-mode proportiopnal plus derivative control can be derived from the basic three-mode control by appropriately adjusting the time constants K, T1 and T2. Thus, to eliminate derivative action, T2 can be set below its lower limit and the derivative computation will be ignored. To eliminate integral action, the constant T1 is set beyond its upper limits. Under this condition the integral computation is ignored.

Figure 38:
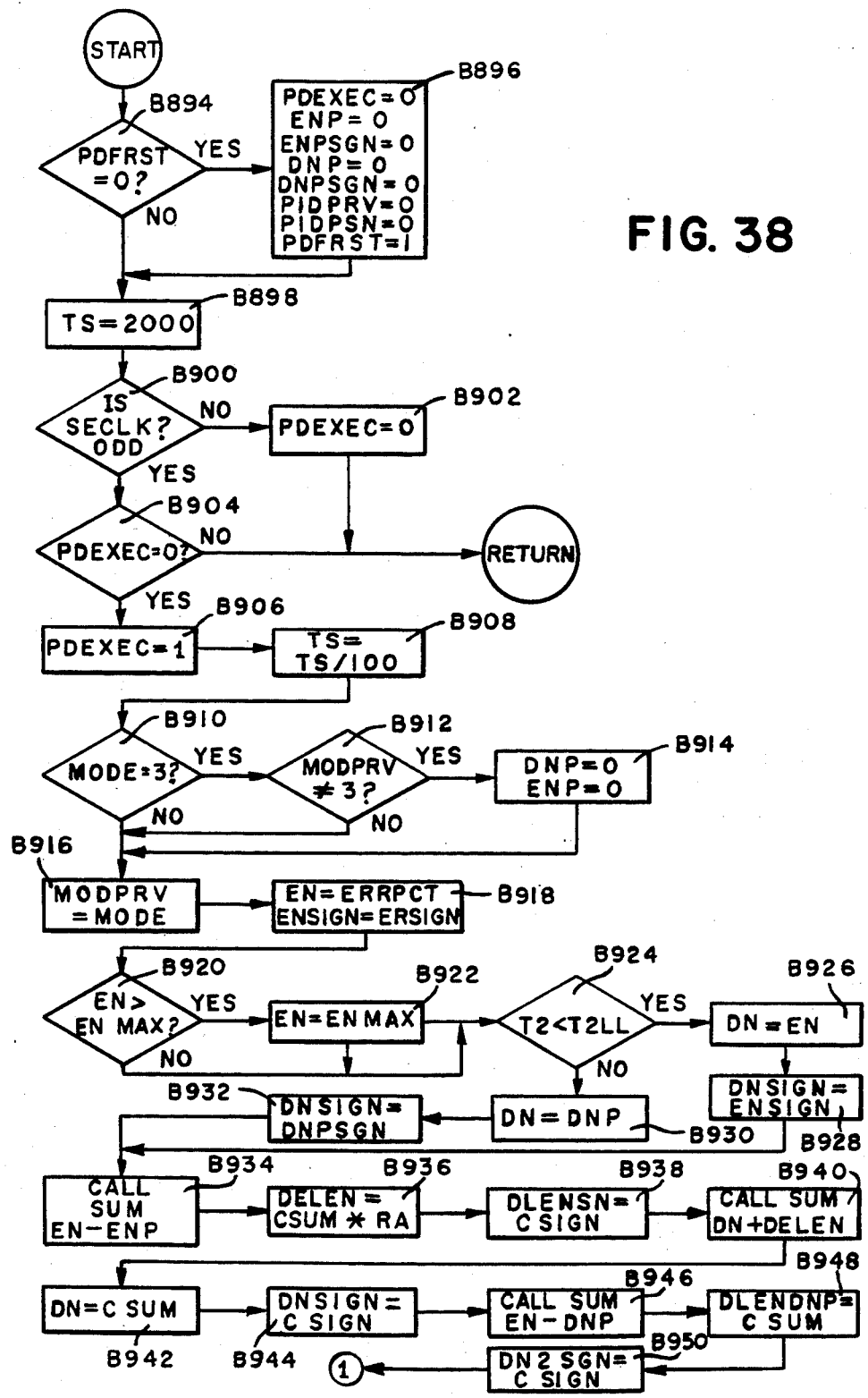
Figure 40:
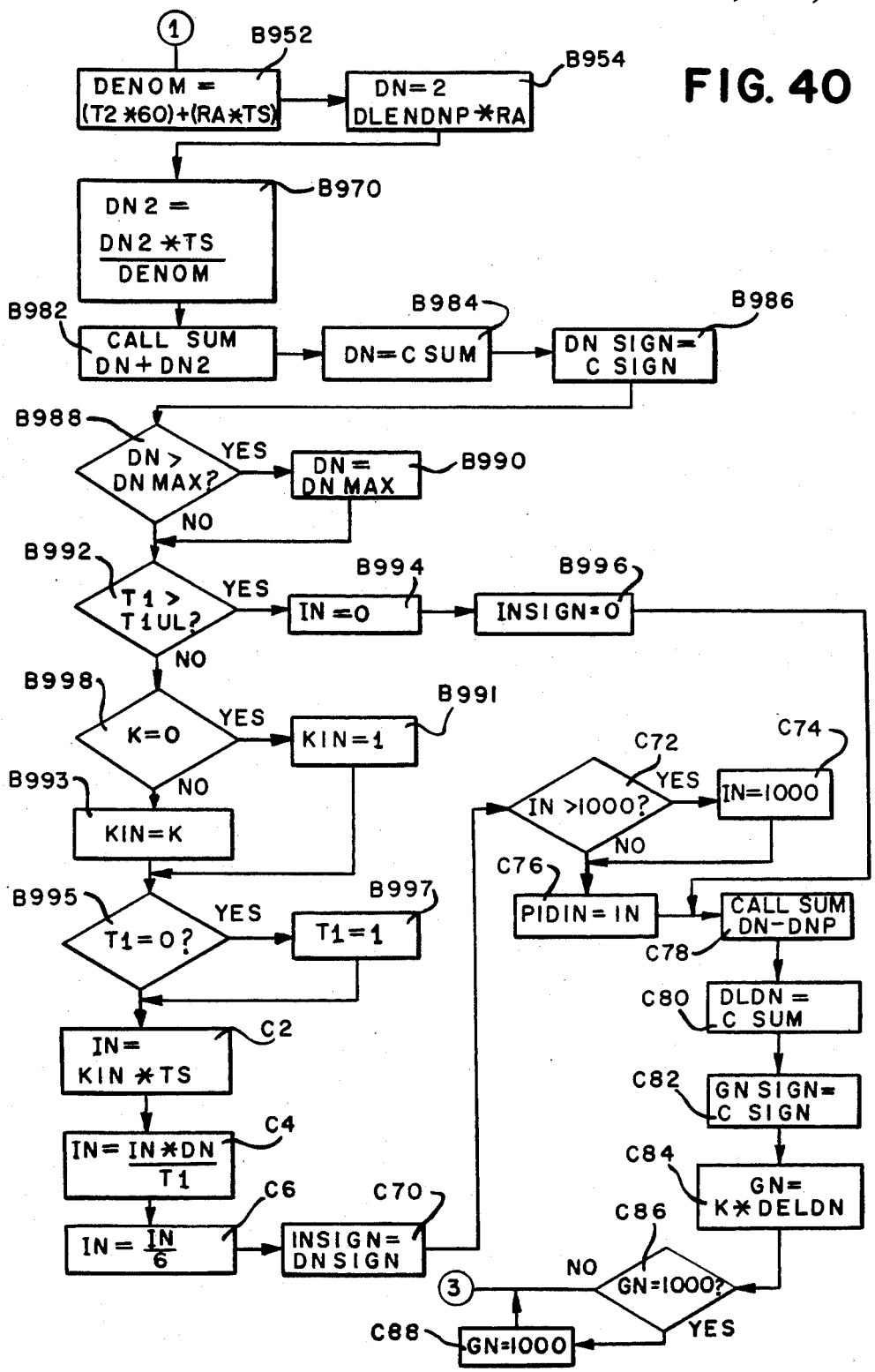

To begin the procedure, in FIG. 38, block B894 checks to determine whether the variable PDFRST is equal to zero. An affirmative answer to this test indicates that the program is making an initial pass through the routine and therefore the variables of the routine should be initialized in block B896. After the initialization is completed, block B898 sets the variable TS equal to 2,000. The variable TS is the time of the sample for the controller and is in milliseconds for dimensional reasons.

Next, in block B900, the totalizing second clock variable SECLK is tested to determine its status. If the clock value is even, then block B902 will set the variable PDEXEC equal to zero so that the program can return to the routine from which it was called. If the second clock value, however, is odd in block B900 indicating that two seconds have passed in real time since the execution through this path then the affirmative branch is followed. In block B904 the variable PDEXEC is tested to determine whether it is zero. If the variable is zero, then it is set equal to one in block B906. Thereafter, the rest of the routine is executed normally. On a subsequent pass through the program, the second clock test of Block B900 will transfer control through the affirmative branch to the test in block B904. Because the variabLe PDEXEC is no longer zero, the program will return immediately to the place from which it was called. When the second clock SECLK becomes even again the program will set the variable PDEXEC equal to zero in block B902. This action will clear the variable for the next time that the second clock is odd such that the program may be re-executed. In this manner the PID control is executed once every two seconds.

The time period for the calculation is scaled down to 1/10ths of a second by dividing the variable TS by 100 in block B908. Further, in blocks B910 and B912, the mode of the system is checked to determine whether the system is in a processing mode and whether the last mode was not a processing mode. This indicates a transfer of modes from the warm-up to the processing mode and thus, in block B914, the previous variables for the error number ENP and the derivative number DNP are set equal to zero. Thereafter, the variable indicating the previous mode MODPRV is set equal to the present mode in block B916. The error number EN is set equal to the error percent as was calculated by the error calculation subroutine and the error number sign ENSIGN set equal to the sign calculated by that routine.

Next, the error number is tested to determine whether it is greater than the maximum allowable error percent in block B920. If it is, the program will take an affirmative branch to block B922 where the variable EN is limited to the value ENMAX. Next, the variable T2 is tested to determine whether it is less than the lower limit T2LL allowed for that variable in block B924. If this is the condition present, then the affirmative branch to block B926 is taken where the derivative block output DN is set equal to EN immediately and the derivative number sign is set equal to the error number sign in block B928. The operation of this step of the program is to essentially bypass the derivative calculation. Otherwise, if the variable T2 is not below its lower limit, then the derivative calculation is performed.

Initially, the calculation begins in block B930 by setting the derivative number DN equivalent to its previous value DNP and setting the derivative number sign DNSIGN equal to the previous derivative number sign in block B932. Thereafter, the previous error number ENP is subtracted from thm present error number EN in block B934 by calling the subroutine SUM. This difference CSUM is multiplied in block B936 by the rate amplitude RA to become the intermediate variable DELEN. The intermediate variable sign is taken in block B938 to be that of the CSUM sign.

Thereafter the derivative number DN is added to the intermediate variable DELEN by calling the subroutine SUM and the result placed in the variable CSUM.

In block B942 the derivative number DN is replaced by that additive sum and the derivative number sign takes on the value of the variable CSIGN in block B944. The third term in determining the derivative number DN is taken by subtracting the previous derivative number DNP from the present error number EN in block B946. Thus sum is placed in the variable DLENDNP in block B948 and the variable sign DN2SGN replaced in block B950 by the sign of the result of the summation.

Next in block B952 the denominator of a third term of the derivative number equation is calculated by replacing the variable DENOM by T×60 plus RA×TS. Thereafter, the numerator of the third term in the summation for the derivative number is calculated by multiplying DLENDNP by RA in block B954. The result of this calculation becomes the variable DN2.

At this point, the derivative number DN is added to the third factor DN2 by calling the subroutine CSUM to form the total derivative number in block B892, B984. The derivative number sign DNSIGN is then set equal to the sign of the entire summation in block B986. A final limiting action in block B988 is used to determine whether the derivative number DN is greater than a maximum value. If the test is true, then the derivative number DN is set equal to the maximum value DNMAX in block B990.

Figure 41:
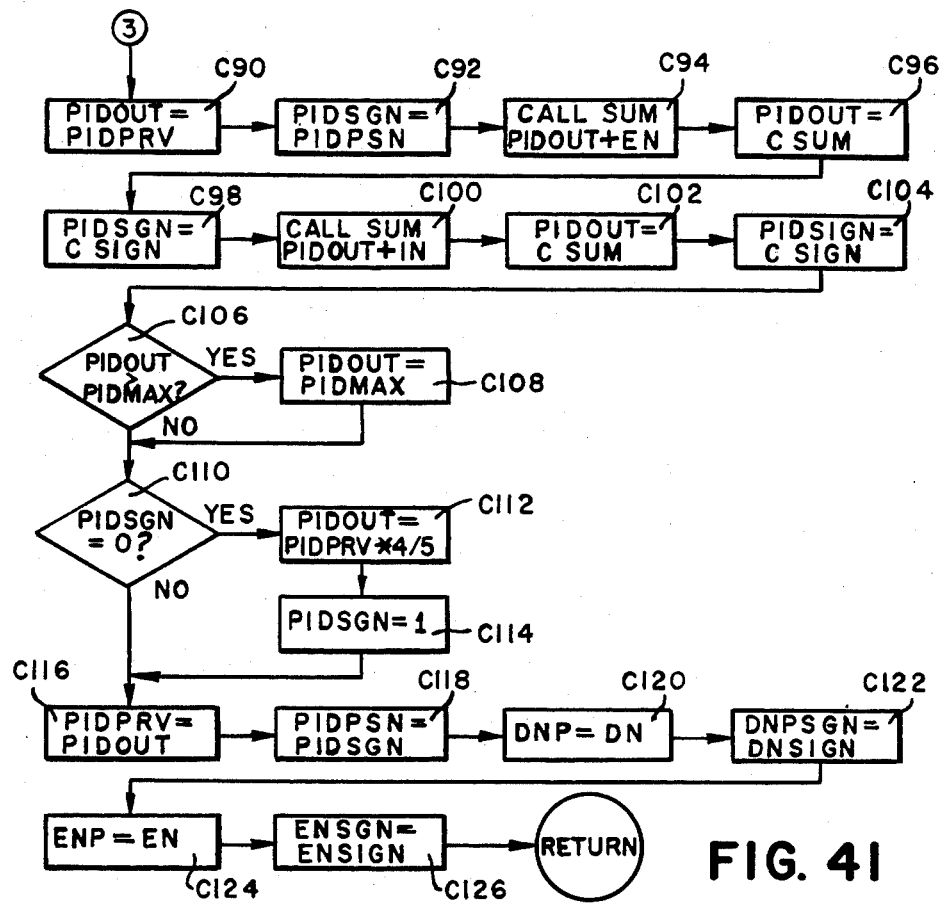

It is seen that this portion of the routine therefore calculates the equation:

$$DN=DNP+RA*(EN-ENP)+RA*[TS(T2+RA*TS)]*(EN-ENP)$$

where:
 RA=rate amplitude
 T2=rate time constant
 TS=sample time
 EN=normalized error updated
 ENP=normal error previous
 DN=output of derivative block updated
 DNP=output of derivative block previous Next, the integral equation is calculated by entering block B992 where the time constant T1 is tested to determine whether it is greater than its upper limit T1UL. If the value for T1, the integral time constant, is greater than its upper limit, then the integral action is ignored by setting the output of the integrator IN to zero in block B994 and setting its sign INSIGN to zero in block B996. Once the integral variable IN has been set equal to zero, the program transfers control to the entry point in the output routine label 4 (FIG. 41).

Otherwise, if the integral time constant T1 is not greater than the upper limit, then the integral calculation progresses further in block B998 where the variable K is tested to determine whether it is equal to zero. If the variable K is equal to zero, it indicates an initial pass through the program and the variable is KIN set equal to one in block B991. Otherwise, the variable KIN is set equal to K in block B993. Similarly, the integral time constant variable T1 is tested in block B995 to determine whether it is zero. If it is, then the time constmnt is set equal to a minimum value of one in block B997. Thereafter, the program control is transferred to the entry point labeled 2 (FIG. 40) where the integral output IN is calculated to be the gain KIN times the sample time TS.

Next the program in block C4 calculates IN as the product of IN and DN divided by T1. The result is then divided by six in block C6.

The integral term IN has a sign INSIGN that is assigned the value of the derivative number sign in block C70. A final limitation is placed on the integral term IN in block C72 where it is tested to determine whether it is greater than 1,000. If it is, the term is set equal to the limit 1,000 in block C74. Next the PID control integral term PIDIN is replaced by the integral term IN in block C76.

This ends the integral calculation and provides a method of calculating the equation:

$$IN = (K*TS*DN)/T1$$

where
 T1 = integral time constant
 K = gain constant
 DN = output of derivative block
 IN = output of integral block Next in the program control path is the calculation of the gain term GN prior to adding the integral, derivative, and gain terms together. In block C78 and C80 the intermediate variable DELDN is set equal to the difference of the derivative number DN and the previous derivative number DNP. The gain term sign is equated to the sign of the difference in block C82. The gain term GN is thereafter calculated by multiplying the difference variable DELDN by the gain constant K in block C84. The gain constant is limited in block C86 and C88 to be less than 1,000.

It is therefore seen that the gain control portion of the program executes the following equation:

$$GN = K(DN-DNP)$$

where
 K = gain constant
 DN = output of derivative block updated
 DNP = output of derivative block previous
 GN = output of gain block The next series of instructions at entry point 3 (FIG. 41) calculates the output of the controller PIDOUT. Initially the output variable PIDOUT is set equal to its previous value in block C90 and the output variable sign set equal to the previous output variable sign in block C92. Thereafter in blocks C94, C96 the output variable PIDOUT is set equal to its previous value plus the newly calculated gain term GN. The output variable maintains the sign of the summation in block C98. Next in blocks C100, C102 the output variable PIDOUT has the integral term IN added to it and maintains that sign of that sum in block C104. Next a limiting action is performed to determine whether the output variable PIDOUT is greater than a maximum output value PIDMAX in block C106. If it is, then it is set equal to the maximum value in block C108.

It is therefore seen that this part of the routine calculates the output variable PIDOUT according to the equation:

$$PIDOUT = PIDPRV + GN + IN$$

where
 PIDPRV = output of the previous pass of the PID procedure
 GN = output of gain block
 IN = output of integral block Thereafter in block C110 the sign for the output variable PIDSGN is tested to determine whether it is negative. If it is, the output variable PIDOUT is replaced by its previous value times 4/5 in block C112. The output variable sign PIDSGN is then set equal to one in block C114. In this manner, a negative value for the output variable PDOUT is treated as only a 20 percent drop from its previous value.

Now that the output variable PIDOUT has been calculated, the new values of the previous variables will be updated in block C116 through C126. In block C116 the previous value of the output variable is set equal to the present value. In block C118 the previous sign of the output variable is set equal to the present value. In block C120 the previous value of the derivative number is set equal to the present value. In block C122 the previous sign of the derivative number is set equal to the present value. In block C124 the previous value of the error number is set equal to the present value and in block C126 the previous sign of the error number is set equal to the present value. After the updating of the previous variables has been accomplished, the program returns to the location in the main routine from which it was called.

Figure 42:
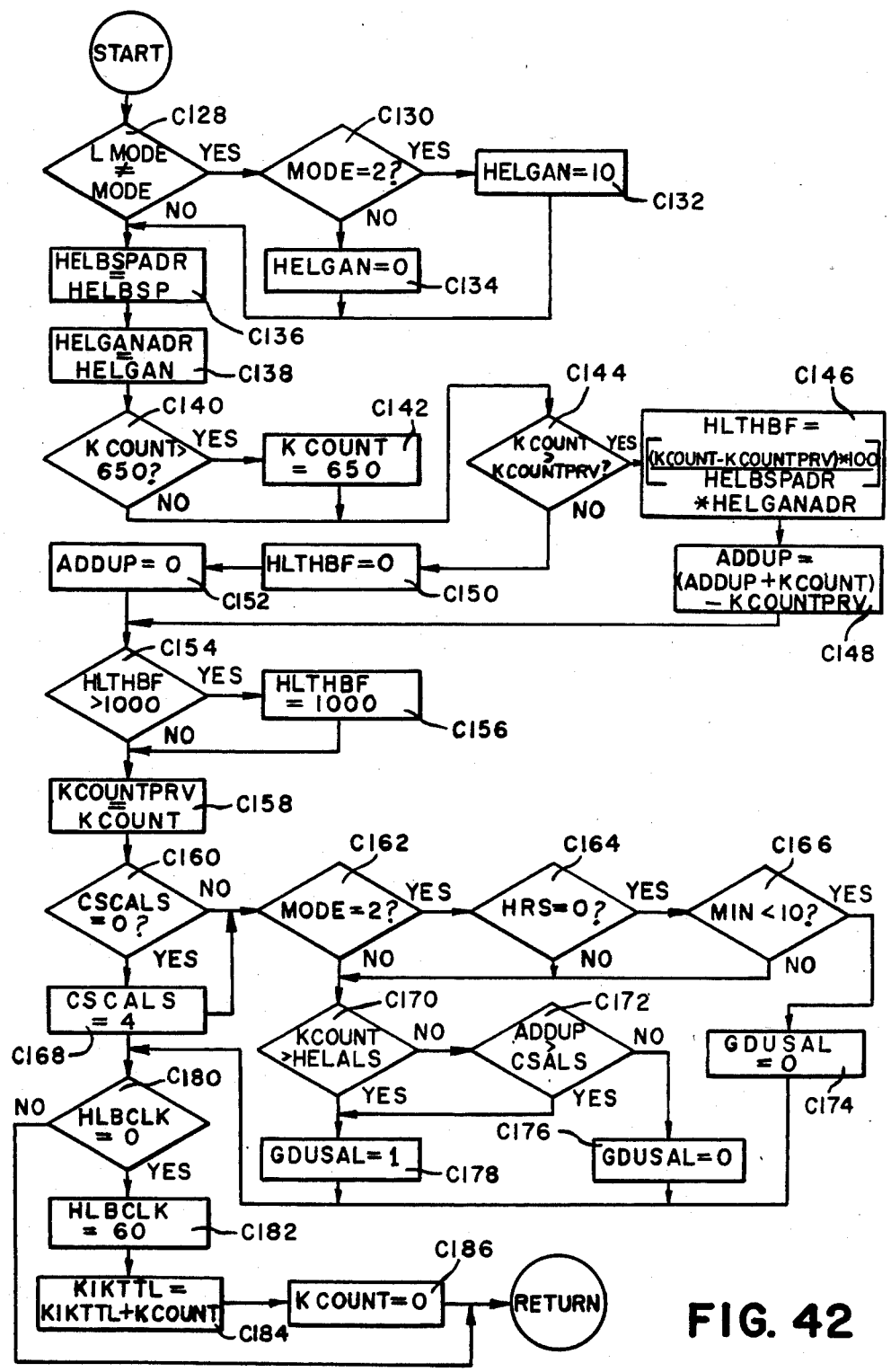
FIG. 42 is a detailed system flow chart of the subroutine HEALTHBIAS called in the subrountine DRIVECONT illustrated in FIGS. 33, 34, and 35.

The routine for calculating the health bias factor will now be more fully explained with reference to FIG. 42. The routine begins by determining whether the last mode is equal to the present mode in block C128. If they are not equal, then the system has made a transition between modes and the gain for the health bias factor must be reset. Therefore, an affirmative branch from block C128 to block C130 is made to provide a determination whether the mode is warm-up or processing. If the system is in a warm-up mode, the health gain HELGAN is set equal to ten in block C132. Otherwise, it is set to equal to zero in block C134. Next, the health bias point HELBSP and the health gain variable HELGAN are set equal to intermediate variables with the added suffix ADR in blocks C136 and C138 respectively.

Next, the kickdown count KCOUNT is tested to determine if it is greater than 650. If the result of this test is affirmative, the count is limited to a maximum value of 650 in block C142. Next, the kickdown count KCOUNT is tested to determine whether it is greater than a previous kickdown count KCOUNTPRV. If the kickdown count is not increasing or is decreasing as indicated by a negative result of the test, then the health bias factor HLTHBF is set equal to zero in block C150 and the variable ADDUP is set equal to zero in block C152.

However, if the kickdown count KCOUNT is increasing as indicated by an affirmative result from the test in block C144, then a health bias factor HLTHBF must be calculated. Block C146 calculates the health bias factor as a percentage by setting it equal to the difference between the present kickdown count and the previous kickdown count (KCOUNT-KCOUNTPRV) divided by the health bias set point and multiplied by 100 percent. This factor is then multiplied by the health gain variable to yield the health bias factor HLTBF. Thereafter, the variable ADDUP is calculated by adding the present kickdown count to the previous value of ADDUP and then substracting the previous kickdown count in block C148. The variable ADDUP is therefore an indication of the number of times KCOUNT increased and how much over previous counts.

The health bias factor is limited in blocR C154 and block C156 by comparing it to 100 percent. If the health bias factor HLTHBF is greater than 100 percent, then it is limited to that value in block C156. After the limiting of the health bias factor, the previous kickdown count is set equal to the present kickdown count in block C158.

Following the calculation of the health bias factor, a portion of the routine is used to set a flag that indicates whether the glow discharge is normal or abnormal (unhealthy). Beginning this portion of the routine is block C160 where the variable CSCALS is tested to determine whether it is equal to zero. If CSCALS is zero, then it is initialized to the constant 4. If CSCALS is not zero, then the program branches to block C162 where it is determined whether the system is in a warm-up or a processing mode. If the system is in a warm-up mode as indicated by an affirmative branch to blocks C164, C166, then in those blocks the program tests to determine whether the system is in the first ten minutes of the warm-up mode. If the result of this query is affirmative, as indicated by the yes branches from blocks C164 and C166, then the glow discharge variable GDUSAL is set equal to zero or a normal state in block C174.

For situations where the system is in a processing mode or after ten minutes into the warm-up mode, the branch instruction will be executed to block C170. At that point in the program, the kickdown count KCOUNT is compared to the health variable HELALS. If the kickdown count during a predetermined period of time exceeds this variable in the test, then the glow discharge flag GDUSAL is set equal to an abnormal value or one in block B178. Otherwise, in block B172 the system tests where the ADDUP variable is greater than the claim limit variable CSCALS. If it is not, then program will produce a normal value for the glow discharge flag GDUSAL. If, however, the ADDUP variable exceeds CSCALS, then in block C178 the glow discharge flag GDUSAL must be set equal to an abnormal value. Therefore, the GDUSAL flag can be set by either more than HELALS kickdowns in any minute or more than CSCALS consecutive kickdowns.

The next series of steps in the program provides a one minute clock for the kickdown count and a total number of counts. During this period, the kickdown count is incremented every time the system experiences an impedance change greater than the set value. The number of these kickdowns is the kickdown count. Each minute the kickdown count is zeroed to begin another calculation of the number of kickdowns occuring within that time period. The total kickdowns that the system has experienced over the entire processing time is kept in a kickdown total count KIKTTL. In block C180 the health health bias clock HLBCLK is tested to determine whether it is zero. If the clock is timed out, then the variable will be reset to 60 seconds in block C182. The kickdown total KIKTTL is set at this point in the program by adding the last total to the present kickdown count in block C184. Thereafter the kickdown count is set equal to zero in block C186.

In operation this routine generates the health bias factor HLTHBF based upon increasing arcing activity and the glow discharge health flag GDUSAL based upon the number of arcs in a predetermined period of time and the number of arcs that were consecutive. Additionally, the number of arcs in each predetermined period KCOUNT are accumulated as the total number for a process sequence KIKTTL.

Figure 43:
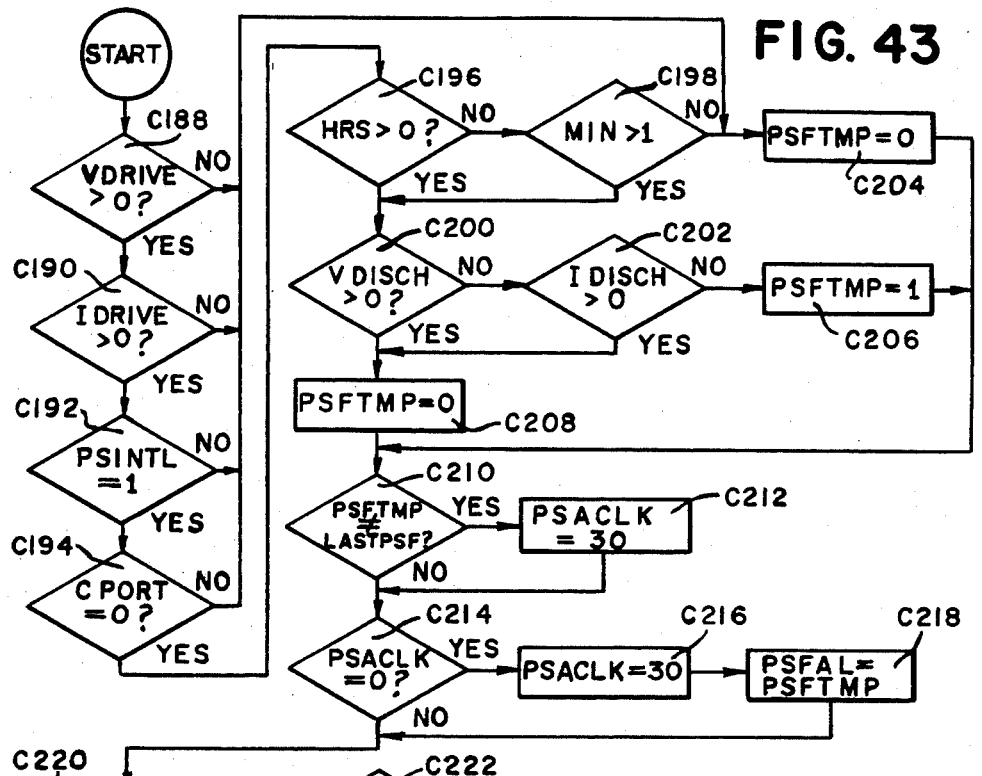
FIG. 43 is a detailed system flow chart of the subroutine PSALARM called by the routine PSCNTL illustrated in FIGS. 31 and 32.

The power supply alarm routine will now be more fully explained with reference to FIG. 43. The routine sets the power supply failed flag PSFAL upon the occurance of certain conditions which indicate that the power supply is encountering abnormal conditions. Initially, the system tests whether the voltage drive VDRIVE and the current drive IDRIVE is greater than zero. The system next tests whether the power supply interlock PSINTL is set to a active value and the kickdown control CPORT is not active. These tests are accomplished in blocks C1BB, C190, C192 and C194 respectively. If all conditions are present, then the program tests to determine whether the time in process is greater than one minute via block C196, C198. If it is, then the afirmative branch from block C196 or C198 transfers control to block C200 and C202. In these blocks, it is determined whether the voltage discharge VDISCH or the current discharge IDISCH are greater than zero. It is evident that if either of the drive signals is positive, the system is interlocked, and no kickdown is occuring, then the voltage discharge and current discharge should be positive. If either one of these signals is not greater than zero, then the power supply is abnormal and cannot be controlled. Therefore, a power supply failure alarm flag is set in box C206 by equating the variable PSFTMP with one. If the situation is during the first minute of warmup, the negative branch from block from C198 is taken to block C204 where the power supply failure flag PSFTMP is set equal to zero. Additionally, if the input variables are all correct, and the voltage discharge and current discharge both positive, then the power supply failure flag is set equal to a non-failed condition in block C208.

The temporary power supply failure flag PSFTMP in block C210 is compared with the last power supply failure flag to determine whether to reset the power supply failure clock PSACLK in block C212. In block C214, the power supply fail clock is tested to determine whether it has timed out. If it has, then the power supply clock variable PSCLK is set equal to 30 seconds in block C216 and the power supply failure flag PSFAL set equal to its temporary value in block C218. Thereafter, the previous power supply failure flag is set equal to the present value by equating it with the temporary variable in block C220. Subsequent to that step, the temporary power supply failure temporary Flag PSFTMP is tested to determine whether it is equal to zero in block C222. If it is, then the power supply failure flag PSFAL is set equal to zero in block C224.

Figure 44:
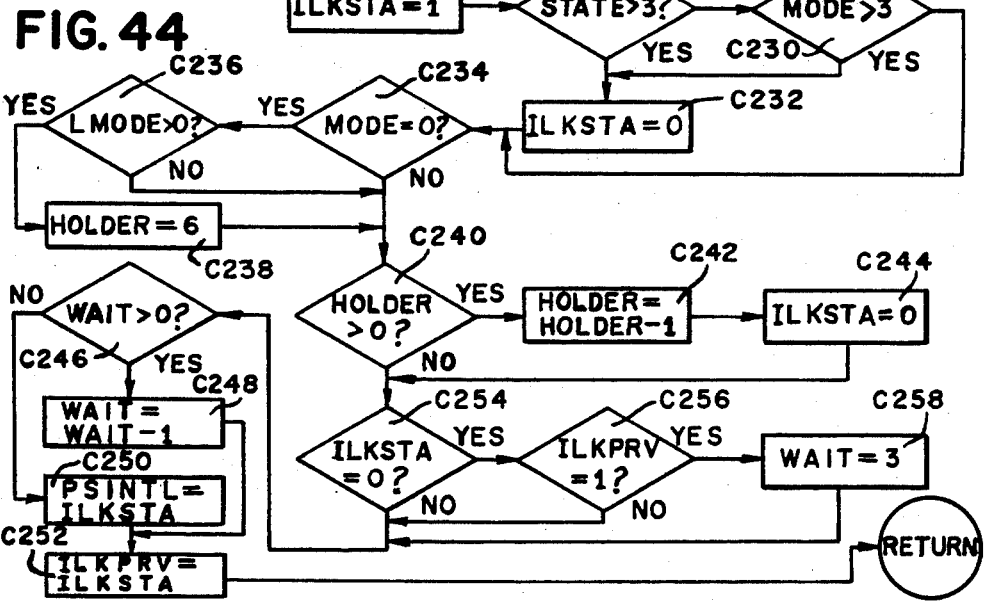
FIG. 44 is a detailed system flow chart of the subrountine PSSHUTDOWN called by the routine PSCNTL illustrated in FIGS. 31 and 32.

The power supply shutdown subroutine is more fully illustrated in FIG. 44. This routine sets the IDRIVE and VDRIVE variables equal to zero and for certain conditions sets the power supply interlock variable PSINTL to a disabled value. The program in block C225 initially clears IDRIVE and VDRIVE variables and therein block C226 sets the interlock variable ILKSTA equal to an active value of one. This is the default value and provides that in unless one or other routines sense conditions where the power supply should be turned off and takes positive action to control it, then the power supply will remain on. Next in block C228, and C230 the system tests whether the state and mode of the system are greater than three. If either of these conditions are present, then the power supply should be shut down and therefore, in block C232 the interlock variable ILKSTA is set equal to zero. A zero value for this variable is determined to be an inactive or a disabled state of the power supply.

If the system, however, passes the state and mode test, a test in block C234 determines whether the mode is zero or the initial idle mode. If the mode is zero and the last mode was not zero as indicated by an afirmative branch in block C236, then the variable HOLDER is set equal to 6 in block C238. These conditions indicate a mode change from another mode to the idle mode and cause reset of the variable HOLDER.

HOLDER is tested in block C240 and decreased by one if it is found to not have counted out. Next the interlock ILKSTA is set equal to zero or a disabled value in block C244. These steps in the routine provide a period of six passes where after the system switches from any mode to idle the power supply is disabled for a short period of time. Next the interlock variable ILKSTA is tested to determine whether its value is a disabled value in block C254. If such is the case, then in block C256 the previous value for the interlock variable is tested. If the value of the interlock variable is now zero and the previous value was one, then a waiting state will be entered by setting the variable WAIT equal to 3 in block C258.

The WAIT is then tested in block C246 to determine its value. If WAIT has not timed out yet, then it is decreased by one in block C248 and thereafter the previous interlock variable set equal to the present interlock value in block C252. If, however, WAIT has timed out, then the power supply interlock variable PSINTL is set equal to the present interlock variable ILKSTA in block C250. Thereafter, the power supply shutdown routine returns to the routine from which is was called.

Figure 47:
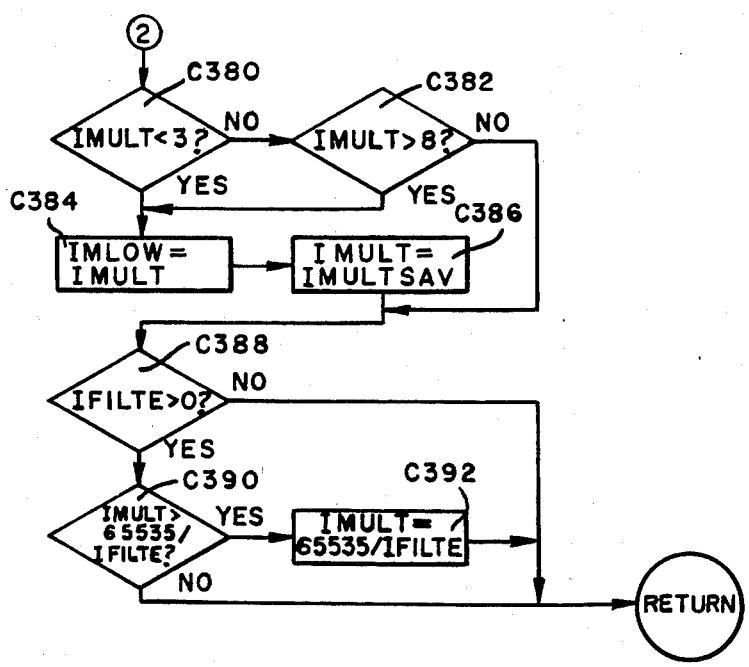
FIGS. 45, 46, and 47 are detailed system flow charts of the subroutine VIRCLC called by the routine PSCNTL illustrated in FIGS. 31 and 32.
Figure 45:
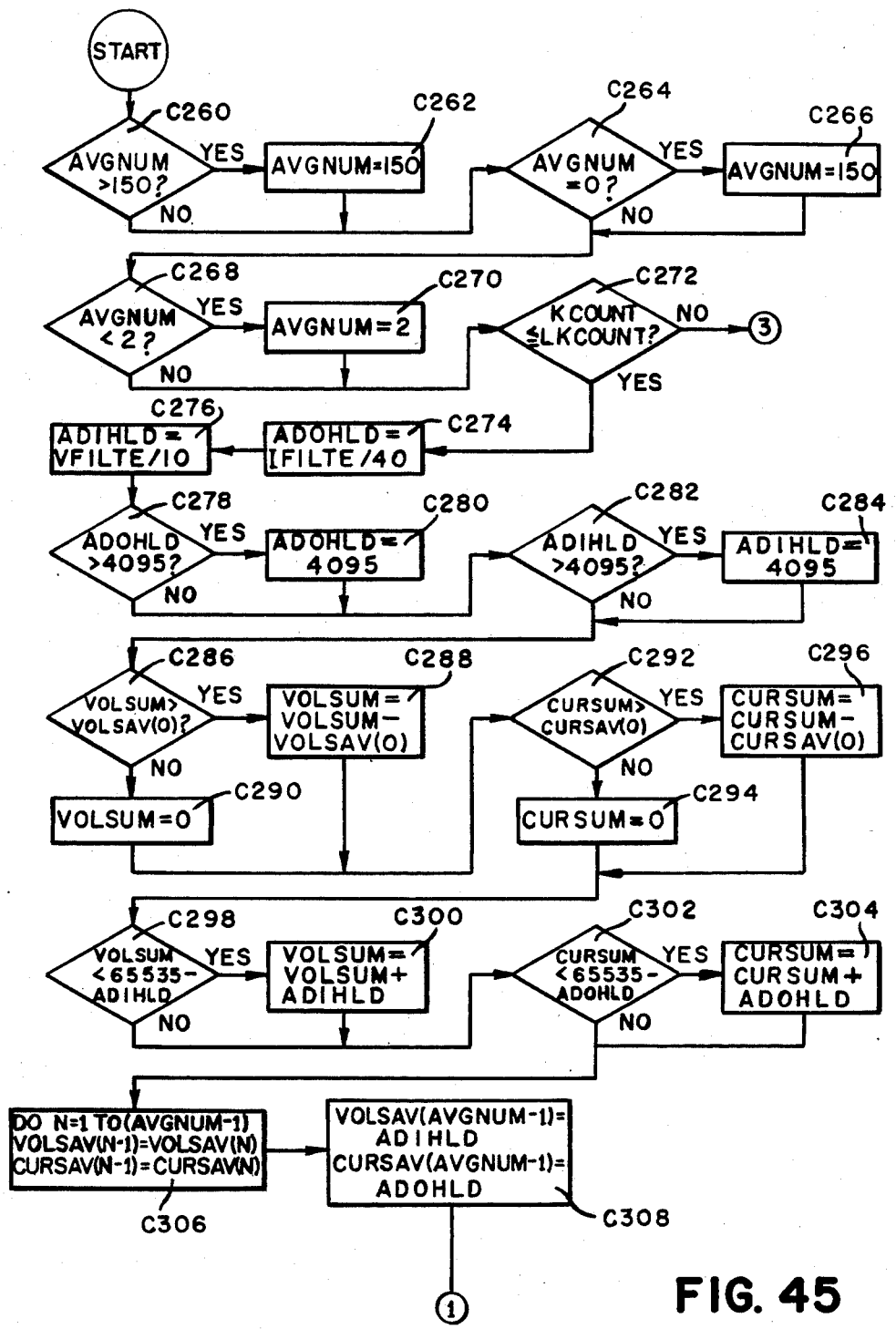
Figure 46:
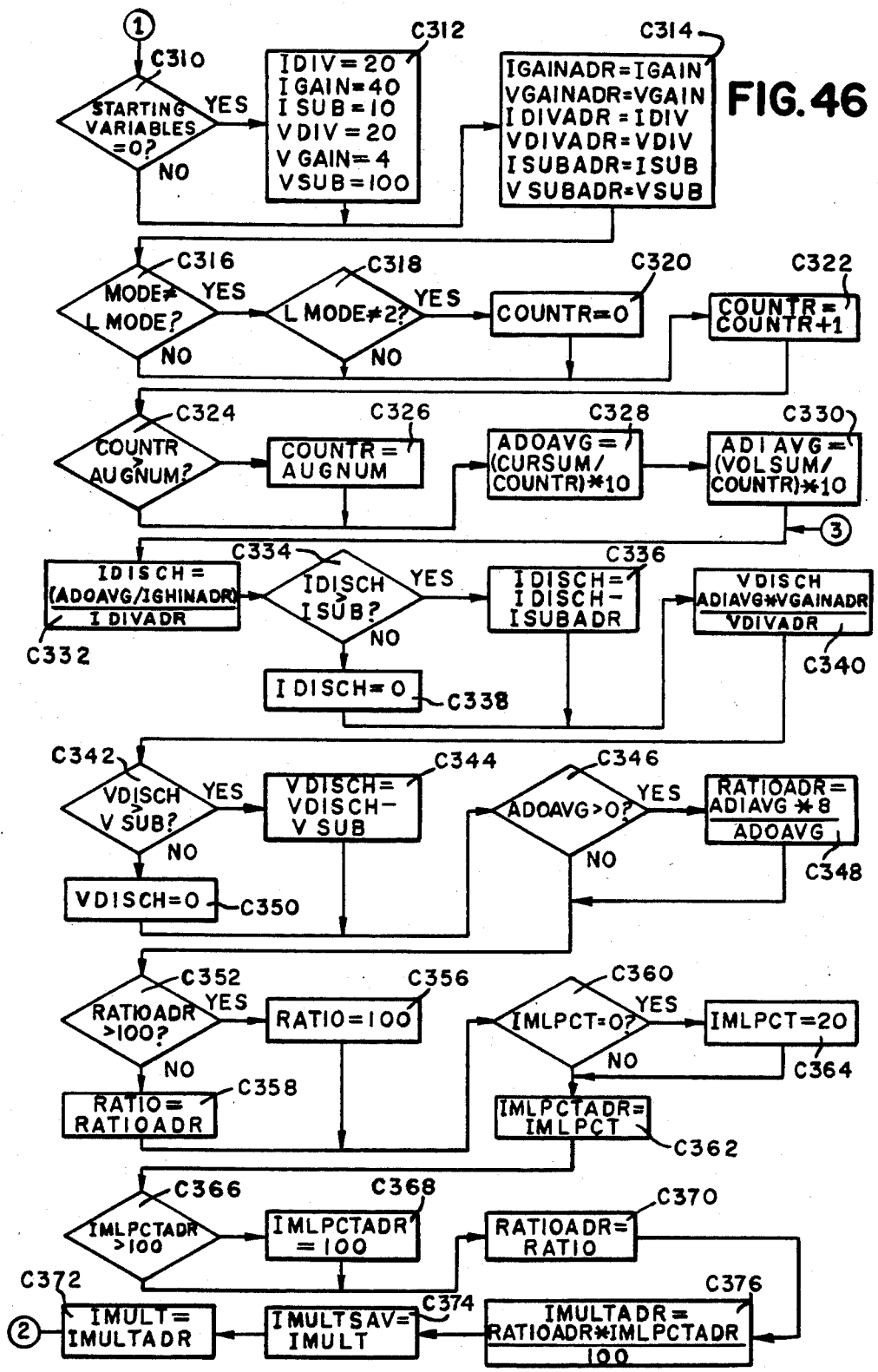

The routine label VIRCALC will now be more fully explained with reference to FIGS. 45, 46 and 47. The procedure averages the actual (immediate) voltage and current values from the power supply in order to determine nominal values of the voltage and current output variables IDISCH and VDISCH. The routine further calculates their ratio which is in the impedance across the workpiece or the load on the power supply.

The procedure additionally determines the arc detection sensitivity by defining the maximum change in the I ratio which will be tolerated before a kickdown action occurs. An acceptable ratio is calculated as a percentage of a nominal ratio equivalent to the variable IMULT. The kickdown routine compares the immediate I ratio with IMULT and if the immediate ratio is less than IMULT (indicating either high current or a low voltage) a kickdown is executed. The kickdown is executed by clamping the output port of the power supply by the control signal labeled CPORT and delaying its release for a short period of time (ten milliseconds).

The routine for calculating the immediate voltage and current values begins in block C260 where an average number variable AVGNUM is tested to determine whether it is greater than 150. If it is, then it is set equal to 150 in block C262 to limit that variable to the value. Thereafter, blocks C264 and C266 are executed to initialize the variable AVGNUM to the value of 150 if this is the first pass through the routine. Blocks C268 and C270 provide a means for providing a minimum limit of 2 on the variable AVGNUM. In block C268 the variable is tested to determine whether it is less than 2 and, if it is, in block C270 the variable is set equal to the minimum limit. The variable AVGNUM is indicative of the number of individual measured values that are averaged to attain the calculations for the current and voltage values.

Next, in block C272 the portion of the routine for averaging the voltage and current variables is initiated by first testing whether the kickdown count KCOUNT is less than or equal to the last kick count LKCOUNT in block C272. A negative result for this test will transfer control to block C380 (FIG. 46) where the last average value is used instead of calculating a new average value. This part of the sequence indicates that the present kickdown count is greater than the last kickdown count and the system is in the kickdown mode. Valid average values for the voltage and current variables will be unobtainable during these periods.

If the system, however, is in the normal mode, transfer of control is from block C272 is to block C274 where a value from the analog/digital conversion channel AD0HLD is set equal to the intermediate current value IFILTE divided by 40. This correctly scales the intermediate value found from the input routine which measures and converts the current output from the power supply. Similarly, in block C276 the analodigital channel variable AD1HLD is set equal to the intermediate voltage variable VFILTE divided by 10. This process step scales the voltage value for later computation. Next, in block C278, C280, C282 and C284 the values of variables AD0HLD, AD1HLD are tested to determine whether they are greater than the maximum allowable value for the analodigital conversion. If they are, then the values are limited to that maximum value.

In the next sequence, beginning in block C286, the summation of voltage values VOLSUM is tested to determine whether it is greater than the element 0 of a voltage array VOLSAV. If it is, then the voltage sum VOLSUM is replaced by the sum minus the value of the element 0 of the array in block C288. Otherwise, the voltage sum is set equal to zero in block C290. This sequence eliminates the value of the oldest array value VOLSAV(0) from the voltage sum VOLSUM but without producing a negative value for the total. Similarly, in blocks C292, C294 and C296, the current summation CURSUM which saves the total current values has substracted from it element 0 of a current array CURSAV.

In block C298 the voltage sum VOLSUM is tested to determine whether adding the present value of voltage AD1HLD would exceed the maximum calculation limit. If it would not, then the voltage sum VOLSUM is increased by the present voltage value AD1HLD in block C300. Similarly, in block C302 and C304 the current sum CURSUM is tested to determine whether it would exceed the maximum calculation limit if AD0HLD were added to it. If not, then the current sum CURSUM is increased by that amount in block C304.

Thereafter, in block C306 and C308 the voltage array VOLSAV and the current array CURSAV are updated by replacing the element (N-1) with the element (N) for N=1 to AVGNUM-1. Additionally, the new entries AD1HLD, AD0HLD are added to the arrays by placing them in the element (AVGNUM-1) of their respective arrays.

The starting variables are now tested in block C310 to determine if any are zero and if an affirmative result of the test is indicated, control of the program transfers to bLock C312. In that block the variables IDIV, IGAIN, ISUB, VDIV, VGAIN and VSUB are initialized to provide starting values for the remainder of the routine. In block C314 these variables are given intermediate variable names with the suffix ADR to allow processing more easily for the remainder of the routine.

In block C316 and block C318 a test is performed to determine whether this is the first pass through the routine. An affirmative result of this test is indicated by the system mode not being equal to the last mode and the last mode not being equal to a warm-up mode. If these conditions are both present, then the counter variable COUNTR is set equal to zero in block C320. Otherwise, the counter variable is increased by one in block C322. Following that step, the counter variable COUNTR is compared to the average number AVGNUM in block C324. If the counter variable COUNTR is larger than the average number AVGNUM, then the counter variable is set equal to the average number in block C326.

The current average is calculated in block C328 where the variable AD0AVG is set equal to the summation of currents CURSUM divided by the counter number COUNTR times ten. In a similar manner, the voltage average is calculated in block C330 by setting the variable AD1AVG equal to the voltage summation VOLSUM divided by the counter variable COUNTR times ten.

The discharge current variable IDISCH used at various points of the program is then calculated in block C322 by dividing this average value AD0AVG by a divider variable IDIV and multiplying it by a gain variable IGAIN. This action is performed to increase the accuracy of the calculation and could very well be done by other methods. The discharge current varialbe IDISCH is thereafter tested against an offset ISUB in block C334. If the discharge current is not greater than the offset, then the discharge current IDISCH is set equal to zero in block C338. However, if the discharge current is greater than the offset, then the offset is substracted from the value in block C336.

In block C340, C342, C344 and C350, similar functions are performed for the voltage discharge variable VDISCH. The average of the voltage discharge is calculated in block C340 by dividing the voltage average AD1AVG by a divisor and multiplying it by a gain variable. Thereafter, the offset is compared with the discharge value in block C342 and the voltage discharge VDISCH set equal to zero in block C350 or set equal to the discharge minus the offset in block C344, depending upon whether the value of the discharge is greater than the offset.

In the next series of steps, the impedance ratio of the system is calculated by the program to provide a means of detecting incipient arcing conditions. Further, a nominal ratio for comparison to the actual or immediate impedence is calculated. In block C346 the current average AD0AVG is tested to determine whether it is greater than zero. If it is, then in block C348 the impedence ratio is calculated by dividing the voltage average AD1AVG by the current average AD0AVG in block C348. The ratio is then multiplied by eight to provide a scaling factor such that the ratio is accommodable to the kickdown routine. Thereafter, the ratio is tested in block C352 to determine whether it is greater than 100, which is used as an upper limit to the impedence of the system. If the ratio is not mbove the limit, then it is unchanged in block C358 else it is set equal to 100 in block C356.

In blocks C360 and C364, the initialization of the current multiplier variable IMLPCT is effected. If the variable is zero, meaning that this is the first pass through the program, then the variable is set equal to 20% in block C364. This is an indication that the threshhold value for performing kickdown activity will be a 20 percent drop from the average impedance ratio over the last 250 scans. In block C362 the current multiplier percent variable IMLPCT is equated with an intermediate value used for calculation purposes. Thereafter, the intermediate value of the current multiplier percentage IMLPCT is tested to determine whether it is greater than 100 in block C366. If it is, then it is limited to that maximum value in block C368. The upper limit on the current multiplier percentage therefore is 100 percent of the current impedance value.

In block C370 an intermediate value for the impedence ratio value RATIO is set. Thereafter, in block C376, the parameter IMULT is calculated by multiplying the impedance ratio by the current multiplier percentage IMLPCT and dividing by 100. This value of IMULT is saved in a variable labeled IMULTSAVE in block C374 and set equal to the final variable in block C372.

The program thereafter exits to block C380 (FIG. 47) where in block C380 and C382 the program provides a range check to determine if the current multiplier factor IMULT is less than three or greater than eight. If the multiplier factor IMULT is either above or below that range, then the value is placed in the location labeled IMLOW for future reference in block C384 and an old value used to replace the present calculated value in block C386.

Thereafter, in blocks C388, C390 and C392, the multiplication factor IMULT is limited to avoid calculation overflow. Initially it is tested to determine whether the current value IFILTE is greater than zero in block C388. If it is, then the value of IMULT is tested against the ratio of the maximum calculation value divided by IFILTE. If that value is greater than the ratio then there wilL be an overflow and the variable IMULT must be limited to the maximum calculation value divided by IFILTE in block C392. Thereafter the routine returns to the place in the main program from which is was called.

While a preferred embodiment of the invention has been shown and described in detail, it will be obvious to those skilled in the art that various modifications and variations may be made thereto without departing from the spirit and scope of the invention as is defined in the appended claims.

What is claimed is:

1. A control system for an apparatus including a housing forming a chamber to receive a workpiece and a low pressure ionizable gas atmosphere and means for establishing a glow discharge between an anode and a cathode with the workpiece connected as the cathode; said control system including:
- means for regulating the temperature of the workpiece responsive to a predetermined time temperature rate of increase reference relation as the workpiece is heated to a predetermined operating temperature;
- temperature measurement means for measuring the temperature of the workpiece;
- means for regulating the pressure of the ionized gas in the chamber responsive to said temperature measurement means including means for regulating the pressure in the chamber to a first predefined level until the measured temperature exceeds a first predefined threshold, and means for increasing the pressure in the chamber to a predefined process pressure level in accordance with a predefined pressure-temperature profile responsive to the measured temperature when the measured temperature exceeds said first predefined threshold; and
- wherein said pressure-temperature profile is a curve-fit relationship with the pressure increasing from the first predefined level to the process pressure as the temperature increases from the first predefined threshold to a predefined process temperature in accordance with the predefined pressure-temperature profile curve.

2. A control system for an apparatus including a housing forming a chamber to receive a workpiece and a low pressure ionizable gas atmosphere and means for establishing a glow discharge between an anode and a cathode with the workpiece connected as the cathode; said control system including:
- means for regulating the temperature of the workpiece responsive to a predetermined time temperature rate of increase reference relation as the workpiece is heated to a predetermined operating temperature;
- temperature measurement means for measuring the temperature of the workpiece;
- means for regulating the pressure of the ionized gas in the chamber responsive to said temperature measurement means including means for regulating the pressure in the chamber to a first predefined level until the measured temperature exceeds a first predefined threshold, and means for increasing the pressure in the chamber to a predefined process pressure level in accordance with a predefined pressure-temperature profile responsive to the measured temperature when the measured temperature exceeds said first predefined threshold; and
- wherein said pressure-temperature profile is a hyperbolic function derived to pass through the end points of the first predefined pressure level, the first predefined threshold, the process pressure level and a predefined process temperature threshold, and further derived to curve under a linear profile for the same levels.

* * * * *